US012787865B2

(12) United States Patent
Tan

(10) Patent No.: US 12,787,865 B2
(45) Date of Patent: Nov. 3, 2026

(54) SEMICONDUCTOR PACKAGE

(71) Applicants: NEPES LAWEH CORPORATION, Cheongju-si (KR); NEPES HAYYIM, Blnan (PH)

(72) Inventor: Jerry Lutiva Tan, Batangas (PH)

(73) Assignees: NEPES LAWEH CORPORATION, Cheongju-si (KR); NEPES HAYYIM, Binan (PH)

( * ) Notice: Subject to any disclaimer, the term of this patent is extended or adjusted under 35 U.S.C. 154(b) by 739 days.

(21) Appl. No.: 17/865,544

(22) Filed: Jul. 15, 2022

(65) Prior Publication Data

US 2023/0016380 A1 Jan. 19, 2023

(30) Foreign Application Priority Data

Jul. 15, 2021 (KR) ........................ 10-2021-0093129
Jul. 19, 2021 (KR) ........................ 10-2021-0094130
Jul. 23, 2021 (KR) ........................ 10-2021-0097184

(51) Int. Cl.
*H10W 90/00* (2026.01)
*H10W 70/65* (2026.01)
(Continued)

(52) U.S. Cl.
CPC ............ *H10W 90/00* (2026.01); *H10W 70/65* (2026.01); *H10W 72/248* (2026.01);
(Continued)

(58) Field of Classification Search
CPC . H01L 2224/02371; H01L 2224/06182; H01L 2224/14181; H01L 2224/0401;
(Continued)

(56) References Cited

U.S. PATENT DOCUMENTS 6,329,708 B1 * 12/2001 Komiyama ......... H10W 70/453 257/692
6,590,257 B2 * 7/2003 Ohuchi .................. H10D 86/01 257/E23.021
(Continued)

FOREIGN PATENT DOCUMENTS

JP 2011-228631 A 11/2011
KR 10-2009-0080879 A 7/2009
(Continued)

OTHER PUBLICATIONS

Office Action dated Nov. 29, 2022 of the Korea Patent Application No. 10-2021-0093129, which corresponds to the above-identified application.

*Primary Examiner* — Jessica S Manno
*Assistant Examiner* — Nathan Pridemore
(74) *Attorney, Agent, or Firm* — Harvest IP LAW LLP

(57) ABSTRACT

According to one or more embodiments, a semiconductor package includes: a first semiconductor chip including an upper surface, a lower surface, and a side surface and including a chip pad provided on the upper surface; a first cover insulating layer covering the upper surface and the side surface of the first semiconductor chip; a first upper conductive layer extending along an upper surface of the first cover insulating layer and connected to the chip pad of the first semiconductor chip; a first side conductive layer extending along a side surface of the first cover insulating layer and connected to the first upper conductive layer; a second cover insulating layer covering the first upper conductive layer, the first side conductive layer, and the first cover insulating layer; and a first lower conductive layer extending along the lower surface of the first semiconductor chip and connected to the first side conductive layer.

5 Claims, 84 Drawing Sheets

(51) Int. Cl.

*H10W 72/20* (2026.01)
*H10W 72/29* (2026.01)
*H10W 72/90* (2026.01)

(52) U.S. Cl.

CPC .......... *H10W 72/29* (2026.01); *H10W 72/944* (2026.01); *H10W 90/722* (2026.01)

(58) Field of Classification Search

CPC . H01L 2224/16145; H01L 2224/05026; H01L 2224/05569; H01L 25/0657; H01L 25/0652; H01L 25/0655; H01L 25/50; H01L 25/105; H01L 24/06; H01L 24/05; H01L 24/14; H01L 24/16; H01L 21/76898; H01L 21/561; H01L 23/3114; H01L 23/3128; H01L 23/481; H01L 23/645; H01L 23/3135; H01L 23/3171; H01L 23/3185; H01L 23/3192; H01L 2225/1058; H01L 2225/06513; H10W 90/732; H10W 90/724; H10W 90/734; H10W 74/141; H10W 70/65; H10W 90/00; H10W 20/481; H10W 74/137; H10W 90/722; H10W 70/465; H10W 72/248; H10W 72/29; H10W 72/944; H10W 72/923; H10W 72/9415; H10W 72/942; H10W 72/801; H10W 72/812; H10W 72/834; H10W 20/0245; H10W 20/216; H10W 20/023; H10W 20/20; H10W 20/077; H10W 44/501; H10W 74/014; H10W 74/117; H10W 74/121; H10W 74/129; H10W 74/147

See application file for complete search history.

(56) References Cited

U.S. PATENT DOCUMENTS

| | | | | |
|---|---|---|---|---|
| 11,018,067 | B2 * | 5/2021 | Kim | H10P 72/74 |
| 2009/0184414 | A1 | 7/2009 | Park et al. | |
| 2010/0246152 | A1 * | 9/2010 | Lin | H01L 23/481 361/783 |
| 2011/0266666 | A1 | 11/2011 | Maeda et al. | |
| 2012/0208319 | A1 * | 8/2012 | Meyer | H01L 25/105 257/E21.598 |
| 2018/0145060 | A1 * | 5/2018 | Appelt | H01L 25/0652 |
| 2020/0058620 | A1 * | 2/2020 | Chen | H01L 24/20 |

FOREIGN PATENT DOCUMENTS

| | | | | |
|---|---|---|---|---|
| KR | 20190091095 | A | * | 1/2018 |
| KR | 10-2019-0091095 | A | | 8/2019 |

* cited by examiner

SEMICONDUCTOR PACKAGE

CROSS-REFERENCE TO RELATED APPLICATIONS

This application claims the benefit under 35 U.S.C. § 119(a) of Korean Patent Application No. 10-2021-0093129 filed on Jul. 15, 2021, Korean Patent Application No. 10-2021-0094130 filed on Jul. 19, 2021, and Korean Patent Application No. 10-2021-0097184 filed on Jul. 23, 2021, the disclosures of which are herein incorporated by reference in their entirety.

BACKGROUND

1. Field

One or more embodiments relate to a semiconductor package, and more particularly, to a wafer level package.

2. Description of the Related Art

In general, a semiconductor package is fabricated by performing a semiconductor packaging process on semiconductor chips fabricated by performing several semiconductor processes on a wafer. Recently, to save production costs of a semiconductor package, wafer level package technology of performing a semiconductor packaging process in a wafer level and individualizing, in individual units, wafer-level semiconductor packages having undergone the semiconductor packaging process has been proposed.

SUMMARY

One or more embodiments provide a semiconductor package.

Additional aspects will be set forth in part in the description which follows and, in part, will be apparent from the description, or may be learned by practice of the presented embodiments of the disclosure.

According to one or more embodiments, a semiconductor package includes: a first semiconductor chip including an upper surface, a lower surface, and a side surface and including a chip pad provided on the upper surface; a first cover insulating layer covering the upper surface and the side surface of the first semiconductor chip; a first upper conductive layer extending along an upper surface of the first cover insulating layer and electrically connected to the chip pad of the first semiconductor chip; a first side conductive layer extending along a side surface of the first cover insulating layer and connected to the first upper conductive layer; a second cover insulating layer covering the first upper conductive layer, the first side conductive layer, and the first cover insulating layer; and a first lower conductive layer extending along the lower surface of the first semiconductor chip and connected to the first side conductive layer.

A vertical height of the first side conductive layer may be greater than a vertical height of the first semiconductor chip, a horizontal width of the first side conductive layer may be greater than a horizontal width of the first upper conductive layer and a horizontal width of the first lower conductive layer, and the first lower conductive layer may be in contact with the lower surface of the first semiconductor chip.

The first side conductive layer may include a first side surface facing the side surface of the first semiconductor chip, a second side surface that is opposite to the first side surface, and an upper surface and a lower surface that are opposite to each other, wherein the first upper conductive layer may be in contact with the first side surface of the first side conductive layer, and the first lower conductive layer may be in contact with the lower surface of the first side conductive layer.

The semiconductor package may further include: a first lower insulating layer covering the first lower conductive layer and the lower surface of the first semiconductor chip; a first lower bump pad connected to the first lower conductive layer through an opening of the first lower insulating layer; a lower connection bump on the first lower bump pad; an upper bump pad connected to the first upper conductive layer through an opening of the second cover insulating layer; and an upper connection bump on the upper bump pad.

The semiconductor package may further include: an upper conductive structure provided on the upper surface of the first semiconductor chip and having a single-layer structure or a multi-layer structure separated in a direction orthogonal to the upper surface of the first semiconductor chip; a side conductive structure provided on the side surface of the first semiconductor chip, having a single-layer structure or a multi-layer structure separated in a direction orthogonal to the side surface of the first semiconductor chip, and electrically connected to the upper conductive structure; a lower conductive structure provided on the lower surface of the first semiconductor chip, having a single-layer structure or a multi-layer structure separated in a direction orthogonal to the lower surface of the first semiconductor chip, and electrically connected to the side conductive structure; a cover insulating structure covering the upper conductive structure and the side conductive structure; and a lower insulating structure covering the lower conductive structure.

The semiconductor package may further include: an upper bump pad on the first upper conductive layer; an inter-package connection terminal on the upper bump pad; and a package structure on the inter-package connection terminal, wherein the package structure includes: a second semiconductor chip; a third cover insulating layer covering an upper surface and a side surface of the second semiconductor chip; a second upper conductive layer extending along an upper surface of the third cover insulating layer and connected to a chip pad of the second semiconductor chip; a second side conductive layer extending along a side surface of the third cover insulating layer and connected to the second upper conductive layer; a fourth cover insulating layer covering the second upper conductive layer, the second side conductive layer, and the third cover insulating layer; a second lower conductive layer extending along a lower surface of the second semiconductor chip and connected to the second side conductive layer; and a second lower bump pad connected to the second lower conductive layer and the inter-package connection terminal.

According to one or more embodiments, a semiconductor package includes: a first semiconductor chip including an upper surface, a lower surface, a side surface, and a chip pad provided on the upper surface; a first conductive pillar on the chip pad of the first semiconductor chip; a first cover insulating layer covering the upper surface and the side surface of the first semiconductor chip and surrounding a side wall of the first conductive pillar; a first upper conductive layer extending along an upper surface of the first cover insulating layer and electrically connected to the chip pad of the first semiconductor chip through the first conductive pillar; a first side conductive layer extending along a side surface of the first cover insulating layer and connected to the first upper conductive layer; a second cover insulating layer covering the first upper conductive layer, the first side conductive layer, and the first cover insulating layer; and a first lower conductive layer extending along the lower surface of the first semiconductor chip and connected to the first side conductive layer, wherein surface roughness of the upper surface of the first cover insulating layer is greater than surface roughness of a surface of the first cover insulating layer in contact with the upper surface of the first semiconductor chip.

A vertical height of the first side conductive layer may be greater than a vertical height of the first semiconductor chip, a horizontal width of the first side conductive layer may be greater than a horizontal width of the first upper conductive layer and a horizontal width of the first lower conductive layer, and the first lower conductive layer may be in contact with the lower surface of the first semiconductor chip.

The first side conductive layer may include a first side surface facing the side surface of the first semiconductor chip, a second side surface that is opposite to the first side surface, and an upper surface and a lower surface that are opposite to each other, wherein the first upper conductive layer may be in contact with the first side surface of the first side conductive layer, and the first lower conductive layer may be in contact with the lower surface of the first side conductive layer.

The semiconductor package may further include: a first lower insulating layer covering the first lower conductive layer and the lower surface of the first semiconductor chip; a first lower bump pad connected to the first lower conductive layer through an opening of the first lower insulating layer; a lower connection bump on the first lower bump pad; an upper bump pad on an upper surface of the second cover insulating layer; a second conductive pillar extending between the upper bump pad and the first upper conductive layer; and an upper connection bump on the upper bump pad.

The semiconductor package may further include: an upper conductive structure provided on the upper surface of the first semiconductor chip and having a single-layer structure or a multi-layer structure separated in a direction orthogonal to the upper surface of the first semiconductor chip; a side conductive structure provided on the side surface of the first semiconductor chip, having a single-layer structure or a multi-layer structure separated in a direction orthogonal to the side surface of the first semiconductor chip, and electrically connected to the upper conductive structure; a lower conductive structure provided on the lower surface of the first semiconductor chip, having a single-layer structure or a multi-layer structure separated in a direction orthogonal to the lower surface of the first semiconductor chip, and electrically connected to the side conductive structure; a cover insulating structure covering the upper conductive structure and the side conductive structure; and a lower insulating structure covering the lower conductive structure.

The semiconductor package may further include: an upper bump pad on the first upper conductive layer; an inter-package connection terminal on the upper bump pad; and a package structure on the inter-package connection terminal, wherein the package structure includes: a second semiconductor chip; a third cover insulating layer covering an upper surface and a side surface of the second semiconductor chip; a second upper conductive layer extending along an upper surface of the third cover insulating layer and connected to a chip pad of the second semiconductor chip; a second side conductive layer extending along a side surface of the third cover insulating layer and connected to the second upper conductive layer; a fourth cover insulating layer covering the second upper conductive layer, the second side conductive layer, and the third cover insulating layer; a second lower conductive layer extending along a lower surface of the second semiconductor chip and connected to the second side conductive layer; and a second lower bump pad connected to the second lower conductive layer and the inter-package connection terminal.

According to one or more embodiments, a semiconductor package includes: a first semiconductor chip including an upper surface, a lower surface, a side surface, and a chip pad provided on the upper surface; a first cover insulating layer covering the upper surface and the side surface of the first semiconductor chip; a first upper conductive layer extending along an upper surface of the first cover insulating layer and electrically connected to the chip pad of the first semiconductor chip; a first side conductive layer extending along a side surface of the first cover insulating layer and connected to the first upper conductive layer; a first lower conductive layer extending along the lower surface of the first semiconductor chip and connected to the first side conductive layer; a first through-chip conductive layer provided in a through hole of the first semiconductor chip and electrically connecting the first upper conductive layer to the first lower conductive layer; and a second cover insulating layer covering the first upper conductive layer, the first side conductive layer, the first through-chip conductive layer, and the first cover insulating layer.

The first cover insulating layer may further include a side wall cover part covering an inner wall of the first semiconductor chip, which defines the through hole of the first semiconductor chip, wherein the side wall cover part is provided between the inner wall of the first semiconductor chip and the first through-chip conductive layer.

The second cover insulating layer may further include a buried insulating pattern provided to the inside of the through hole of the first semiconductor chip, wherein the first through-chip conductive layer may surround a side wall of the buried insulating pattern.

The semiconductor package may further include a first conductive pillar extending through the first cover insulating layer and electrically connecting the chip pad of the first semiconductor chip to the first upper conductive layer, wherein surface roughness of the upper surface of the first cover insulating layer is greater than surface roughness of a surface of the first cover insulating layer in contact with the upper surface of the first semiconductor chip.

A vertical height of the first side conductive layer may be greater than a vertical height of the first semiconductor chip, a horizontal width of the first side conductive layer may be greater than a horizontal width of the first upper conductive layer and a horizontal width of the first lower conductive layer, and the first lower conductive layer may be in contact with the lower surface of the first semiconductor chip.

The first side conductive layer may include a first side surface facing the side surface of the first semiconductor chip, a second side surface that is opposite to the first side surface, and an upper surface and a lower surface that are opposite to each other, wherein the first upper conductive layer may be in contact with the first side surface of the first side conductive layer, and the first lower conductive layer may be in contact with the lower surface of the first side conductive layer.

The semiconductor package may further include: a first lower insulating layer covering the first lower conductive layer and the lower surface of the first semiconductor chip; a first lower bump pad connected to the first lower conductive layer through an opening of the first lower insulating layer; a lower connection bump on the first lower bump pad; an upper bump pad arranged on the second cover insulating layer and connected to the first upper conductive layer; and an upper connection bump on the upper bump pad.

The semiconductor package may further include: an upper conductive structure provided on the upper surface of the first semiconductor chip and having a single-layer structure or a multi-layer structure separated in a direction orthogonal to the upper surface of the first semiconductor chip; a side conductive structure provided on the side surface of the first semiconductor chip, having a single-layer structure or a multi-layer structure separated in a direction orthogonal to the side surface of the first semiconductor chip, and electrically connected to the upper conductive structure; a lower conductive structure provided on the lower surface of the first semiconductor chip, having a single-layer structure or a multi-layer structure separated in a direction orthogonal to the lower surface of the first semiconductor chip, and electrically connected to the side conductive structure; a cover insulating structure covering the upper conductive structure and the side conductive structure; and a lower insulating structure covering the lower conductive structure.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1A:
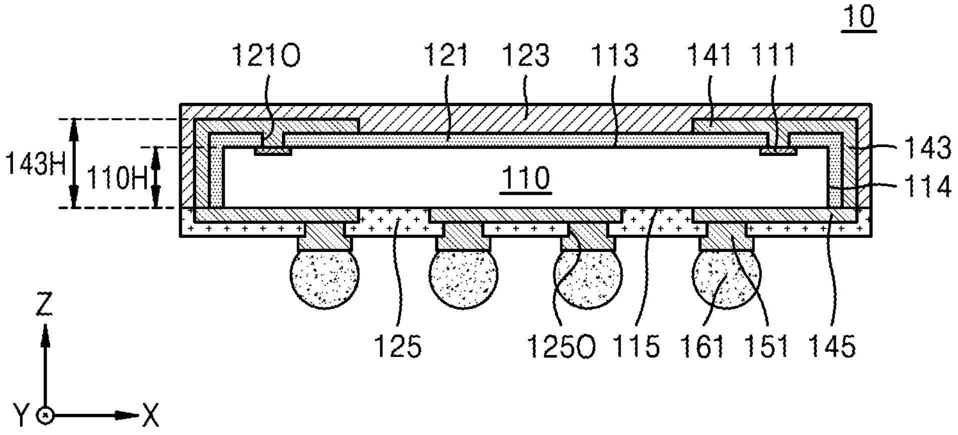
FIG. 1A is a cross-sectional view of a semiconductor package according to example embodiments of the inventive concept.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

Example embodiments of the present disclosure will be described in detail with reference to the accompanying drawings. However, the example embodiments of the present disclosure may be embodied in many different forms, and the scope of the present disclosure should not be construed as being limited to the embodiments set forth herein. It will be analyzed that the example embodiments of the present disclosure are provided to fully convey the concept of the present disclosure to those of ordinary skill in the art. Like reference numerals denote like elements throughout. Furthermore, various elements and regions in the drawings are schematically drawn. Therefore, the concept of the present disclosure is not limited to the relative sizes or intervals shown in the accompanying drawings.

Although terms such as 'first' and 'second' can be used to describe various elements, the elements are not limited to these terms. The terms are used only to differentiate an element from another element. For example, a first element can be named a second element without leaving from the right scope of the present disclosure, and likely the second element can be named the first element.

The terminology used in the present disclosure is used only to describe particular embodiments and does not have any intention to limit the present disclosure. An expression in the singular includes an expression in the plural unless they are clearly different from each other in context. In the application, it should be understood that terms, such as 'include' and 'have', are used to indicate the existence of an implemented feature, number, step, operation, element, part, or a combination thereof without excluding in advance the possibility of the existence or addition of one or more other features, numbers, steps, operations, elements, parts, or combinations thereof.

All terms used herein including technical or scientific terms have the same meaning as those generally understood by those of ordinary skill in the art unless they are defined differently. In addition, it should be understood that terms generally used, which are defined in a dictionary, have the same meaning as in context of related technology, and the terms are not to be understood as having an excessively formal meaning unless they are clearly defined herein.

Figure 1B:
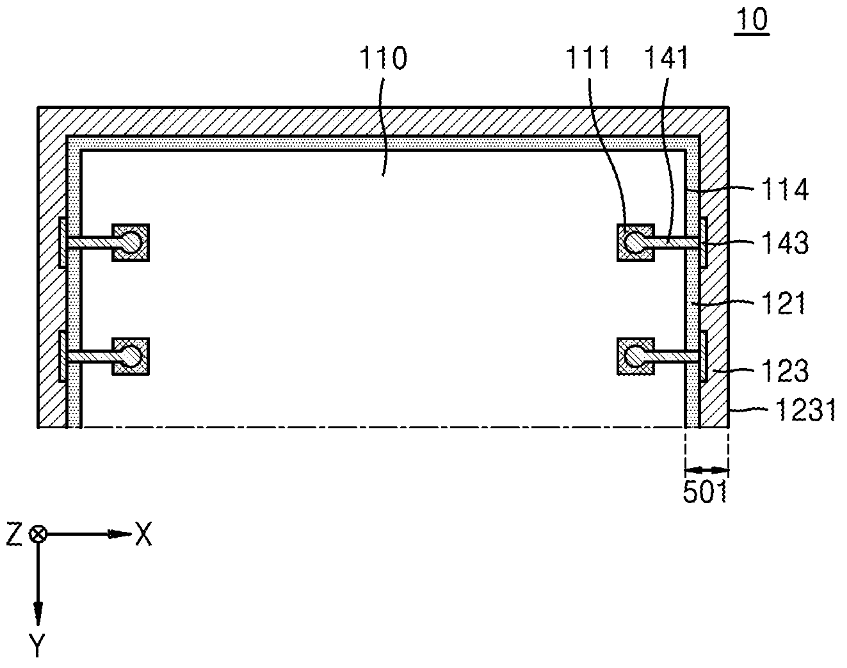
FIG. 1B is a layout diagram of some components of the semiconductor package shown in FIG. 1A.
Figure 1C:
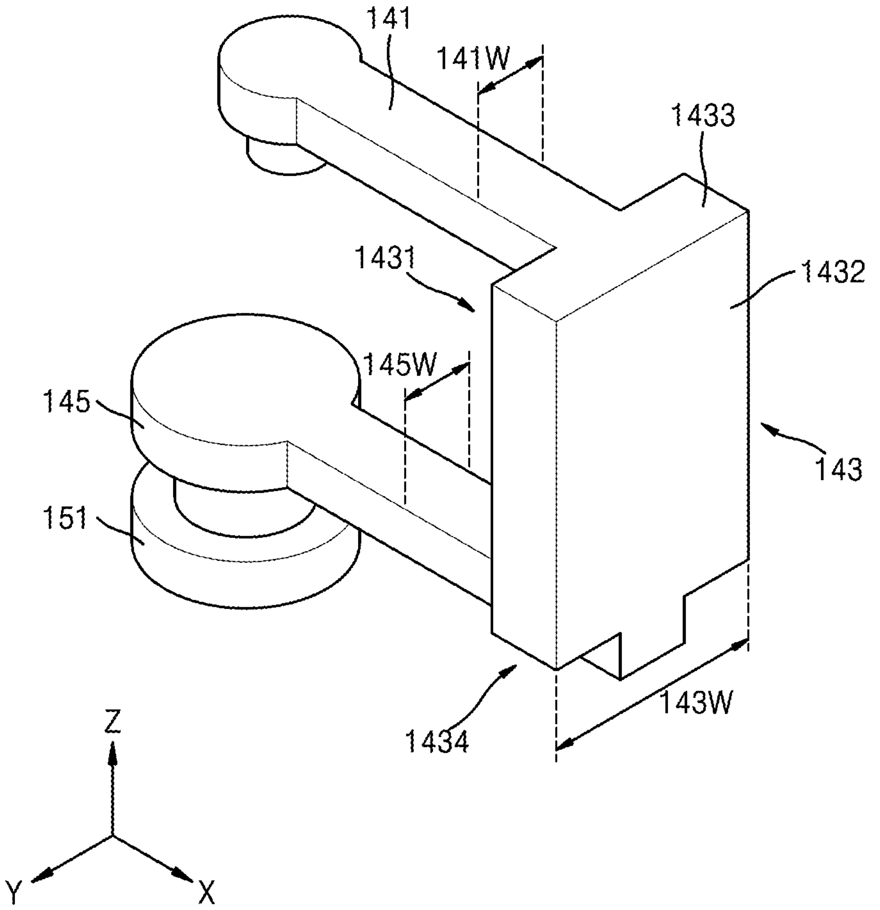
FIG. 1C is a perspective view of a first upper conductive layer, a first side conductive layer, a first lower conductive layer, and a first lower bump pad in the semiconductor package shown in FIG. 1A.

FIG. 1A is a cross-sectional view of a semiconductor package 10 according to example embodiments of the inventive concept. FIG. 1B is a layout diagram of some components of the semiconductor package 10 shown in FIG. 1A. FIG. 1C is a perspective view of a first upper conductive layer 141, a first side conductive layer 143, a first lower conductive layer 145, and a first lower bump pad 151 in the semiconductor package 10 shown in FIG. 1A.

Referring to FIGS. 1A to 1C, the semiconductor package 10 may include a first semiconductor chip 110, a first cover insulating layer 121, the first upper conductive layer 141, the first side conductive layer 143, a second cover insulating layer 123, the first lower conductive layer 145, a first lower insulating layer 125, the first lower bump pad 151, and a lower connection bump 161.

The first semiconductor chip 110 may include an upper surface 113 and a lower surface 115 that are opposite to each other, and a side surface 114 extending between the upper surface 113 and the lower surface 115. The upper surface 113 of the first semiconductor chip 110 may be a pad surface on which a chip pad 111 is provided. Hereinafter, a horizontal direction is defined as a direction (e.g., an X-axis direction and/or a Y-axis direction) parallel to the upper surface 113 of the first semiconductor chip 110, and a vertical direction is defined as a direction (e.g., a Z-axis direction) orthogonal to the upper surface 113 of the first semiconductor chip 110. In addition, a horizontal width of a random member is defined as a length in the horizontal direction (e.g., the X-axis direction and/or the Y-axis direction), and a vertical height of the random member is defined as a length in the vertical direction (e.g., the Z-axis direction).

The first semiconductor chip 110 may include a semiconductor substrate including a semiconductor material such as silicon (Si), and a device layer formed on an active surface of the semiconductor substrate. Various types of a plurality of individual devices may be formed on the device layer of the first semiconductor chip 110. The chip pad 111 of the first semiconductor chip 110 may be electrically connected to an individual device formed on the device layer of the first semiconductor chip 110. For example, the plurality of individual devices may include microelectronic devices, e.g., metal-oxide-semiconductor field effect transistors (MOSFETs) such as complementary metal-oxide-semiconductor (CMOS) transistors, system large scale integration (LSI) chips, image sensors such as CMOS imaging sensors (CISs), active devices, passive devices, and the like. In example embodiments, the first semiconductor chip 110 may be a memory chip. In example embodiments, the first semiconductor chip 110 may be a logic chip.

The first cover insulating layer 121 may cover the upper surface 113 and the side surface 114 of the first semiconductor chip 110. A portion of the first cover insulating layer 121 may extend along the upper surface 113 of the first semiconductor chip 110. In addition, the other portion of the first cover insulating layer 121 may extend along the side surface 114 of the first semiconductor chip 110 to fully cover the side surface 114 of the first semiconductor chip 110. In a plan view, the first cover insulating layer 121 may fully surround the side surface 114 of the first semiconductor chip 110. For example, when the first semiconductor chip 110 has a quadrangular plane shape, the first cover insulating layer 121 may have a quadrangular ring shape surrounding four side surfaces of the first semiconductor chip 110. In example embodiments, a footprint of the first cover insulating layer 121 may be the same as or similar to a footprint of the first semiconductor chip 110. That is, a plane area of the first cover insulating layer 121 may be the same as or similar to a plane area of the first semiconductor chip 110.

For example, the first cover insulating layer 121 may be formed of an insulating polymer, epoxy, or a combination thereof. In example embodiments, the first cover insulating layer 121 may be formed of a photo imageable dielectric (PID) or polyimide.

The first upper conductive layer 141 may be provided on an upper surface of the first cover insulating layer 121. The first upper conductive layer 141 may be in contact with and extend along the upper surface of the first cover insulating layer 121. The first upper conductive layer 141 may extend in parallel to the upper surface 113 of the first semiconductor chip 110. The first upper conductive layer 141 may be connected to the chip pad 111 of the first semiconductor chip 110 through an opening 121O of the first cover insulating layer 121. In example embodiments, the first upper conductive layer 141 may include a line pattern extending in a line shape on the upper surface of the first cover insulating layer 121.

In example embodiments, the first upper conductive layer 141 may be made of tungsten (W), copper (Cu), zirconium (Zr), titanium (Ti), tantalum (Ta), aluminum (Al), ruthenium (Ru), palladium (Pd), platinum (Pt), cobalt (Co), nickel (Ni), or a combination thereof. A material of each of the first side conductive layer 143, the first lower conductive layer 145, and the first lower bump pad 151 to be described below may also be substantially the same as or similar to the material of the first upper conductive layer 141.

In example embodiments, the first upper conductive layer 141 may include a seed metal layer and a plating layer stacked on the seed metal layer. That is, the seed metal layer may be formed on the surface of the first cover insulating layer 121, and the plating layer may be formed on the seed metal layer. The plating layer may be formed by an electroplating process using the seed metal layer as a seed. For example, the seed metal layer may include Ti, Cu, chromium (Cr), W, Ni, Al, Pd, gold (Au), or a combination thereof. For example, the plating layer may include Cu or an alloy of Cu. The first side conductive layer 143, the first lower conductive layer 145, and the first lower bump pad 151 may also be formed by an electroplating process similarly to a method of forming the first upper conductive layer 141 and have a stacked structure in which the plating layer is stacked on the seed metal layer.

The first side conductive layer 143 may be provided on a side surface of the first cover insulating layer 121. The first side conductive layer 143 may be connected to the first upper conductive layer 141 and extend along the side surface of the first cover insulating layer 121. The first side conductive layer 143 may extend in parallel to the side surface 114 of the first semiconductor chip 110. The first side conductive layer 143 may extend downward from an upper end thereof connected to the first upper conductive layer 141. The first side conductive layer 143 may extend from an upper end to a lower end of the side surface of the first cover insulating layer 121. In example embodiments, a lower end of the first side conductive layer 143 and the lower end of the first cover insulating layer 121 may be on the same plane as the lower surface 115 of the first semiconductor chip 110. In example embodiments, a vertical height 143H of the first side conductive layer 143 may be greater than a vertical height 110H of the first semiconductor chip 110.

The second cover insulating layer 123 may cover the first upper conductive layer 141, the first side conductive layer 143, and the first cover insulating layer 121. A portion of the second cover insulating layer 123 may extend along the upper surface of the first cover insulating layer 121 and cover the first upper conductive layer 141. The other portion of the second cover insulating layer 123 may extend along the side surface of the first cover insulating layer 121 and cover the first side conductive layer 143. The second cover insulating layer 123 may include an upper surface extending in generally parallel to the upper surface 113 of the first semiconductor chip 110, and a side surface extending in generally parallel to the side surface 114 of the first semiconductor chip 110. In example embodiments, the upper surface and the side surface of the second cover insulating layer 123 may be exposed to the outside.

In example embodiments, a lower end of the second cover insulating layer 123 may be on the same plane as the lower end of the first side conductive layer 143, the lower end of the first cover insulating layer 121, and the lower surface 115 of the first semiconductor chip 110.

For example, the second cover insulating layer 123 may be formed of an insulating polymer, epoxy, or a combination thereof. In example embodiments, the second cover insulating layer 123 may be formed of a PID or polyimide. In example embodiments, the second cover insulating layer 123 may be formed of a molding material such as an epoxy molding compound (EMC).

In example embodiments, a material and/or a material composition of the second cover insulating layer 123 may be the same as a material and/or a material composition of the first cover insulating layer 121. For example, each of the first cover insulating layer 121 and the second cover insulating layer 123 may include polyimide.

In other example embodiments, the material and/or the material composition of the second cover insulating layer 123 may be different from the material and/or the material composition of the first cover insulating layer 121. For example, the first cover insulating layer 121 may include polyimide, whereas the second cover insulating layer 123 may include an EMC.

The first lower conductive layer 145 may be provided on the lower surface 115 of the first semiconductor chip 110. The first lower conductive layer 145 may be in contact with and extend along the lower surface 115 of the first semiconductor chip 110. The first lower conductive layer 145 may extend in parallel to the lower surface 115 of the first semiconductor chip 110. The first lower conductive layer 145 may further extend outward from an edge of the lower surface 115 of the first semiconductor chip 110 to be connected to the lower end of the first side conductive layer 143. In example embodiments, the first lower conductive layer 145 may include a line pattern extending in a line shape on the lower surface 115 of the first semiconductor chip 110.

The first lower insulating layer 125 may cover the lower surface 115 of the first semiconductor chip 110 and the first lower conductive layer 145. The first lower insulating layer 125 may cover the lower surface 115 of the first semiconductor chip 110 and cover the lower end of the first cover insulating layer 121 and the lower end of the second cover insulating layer 123, which are on the same plane as the lower surface 115 of the first semiconductor chip 110. In example embodiments, a footprint of the first lower insulating layer 125 may be the same as or similar to a footprint of the second cover insulating layer 123. That is, a plane area of the first lower insulating layer 125 may be the same as the plane area of the second cover insulating layer 123.

The first lower bump pad 151 may be connected to the first lower conductive layer 145 through an opening 125O of the first lower insulating layer 125. A portion of the first lower bump pad 151 may protrude from the first lower insulating layer 125. For example, the first lower bump pad 151 may be an under bump metal (UBM) layer.

The lower connection bump 161 may be provided on the first lower bump pad 151. The lower connection bump 161 may include, for example, solder, tin (Sn), silver (Ag), indium (In) bismuth (Bi), antimony (Sb), Cu, zinc (Zn), lead (Pb) and/or an alloy thereof. In example embodiments, the lower connection bump 161 may generally have a ball shape attached to the first lower bump pad 151. For example, the lower connection bump 161 may be formed by placing a solder ball on the first lower bump pad 151 and then performing a reflow process on the solder ball. In other example embodiments, the lower connection bump 161 has a plate shape and may be formed to have a generally uniform thickness on the surface of the first lower bump pad 151.

In example embodiments, the first side conductive layer 143 may have a plate shape extending in generally parallel to the side surface 114 of the first semiconductor chip 110. For example, the first side conductive layer 143 may include a first side surface 1431 facing the side surface 114 of the first semiconductor chip 110, a second side surface 1432 that is opposite to the first side surface 1431, and an upper surface 1433 and a lower surface 1434 that are opposite to each other. Each of the first side surface 1431 and the second side surface 1432 of the first side conductive layer 143 may extend in parallel to the side surface 114 of the first semiconductor chip 110, which faces the first side conductive layer 143.

The first side conductive layer 143 may have a first horizontal width 143W in a second horizontal direction (e.g., the Y-axis direction) that is parallel to the side surface 114 of the first semiconductor chip 110, which faces the first side conductive layer 143. In example embodiments, the first side conductive layer 143 may extend in the vertical direction (e.g., the Z-axis direction) with a generally uniform width, i.e., the first horizontal width 143W. That is, a horizontal width at a lower part of the first side conductive layer 143 may be the same as a horizontal width at an upper part of the first side conductive layer 143.

In example embodiments, the first upper conductive layer 141 may be connected to the first side surface 1431 of the first side conductive layer 143 and have a line shape extending from the first side surface 1431 of the first side conductive layer 143. The first upper conductive layer 141 may be a line-shaped pattern extending with a second horizontal width 141W from the first side surface 1431 of the first side conductive layer 143. In this case, the first horizontal width 143W of the first side conductive layer 143 may be greater than the second horizontal width 141W of the first upper conductive layer 141. In example embodiments, when a contact region between the first upper conductive layer 141 and the first side conductive layer 143 is defined as a first contact region, a horizontal width of the first contact region in the second horizontal direction (e.g., the Y-axis direction) may be less than the first horizontal width 143W of the first side conductive layer 143. In example embodiments, the first horizontal width 143W of the first side conductive layer 143 may be about 150% to about 500%, about 200% to about 400%, or about 250% to about 300% of the horizontal width of the first contact region between the first upper conductive layer 141 and the first side conductive layer 143.

In example embodiments, the first lower conductive layer 145 may be connected to the lower surface 1434 of the first side conductive layer 143 and have a line shape extending from a part connected to the lower surface 1434 of the first side conductive layer 143. The first lower conductive layer 145 may be a line-shaped pattern extending with a third horizontal width 145W from the lower surface 1434 of the first side conductive layer 143. In this case, the first horizontal width 143W of the first side conductive layer 143 may be greater than the third horizontal width 145W of the first lower conductive layer 145. In example embodiments, when a contact region between the first lower conductive layer 145 and the first side conductive layer 143 is defined as a second contact region, a horizontal width of the second contact region in the second horizontal direction (e.g., the Y-axis direction) may be less than the first horizontal width 143W of the first side conductive layer 143. In example embodiments, the first horizontal width 143W of the first side conductive layer 143 may be about 150% to about 500%, about 200% to about 400%, or around 250% to about 300% of the horizontal width of the second contact region between the first lower conductive layer 145 and the first side conductive layer 143.

A footprint (or a plane area) of the semiconductor package 10 may be determined based on a distance 501 between the side surface 114 of the first semiconductor chip 110 and a side surface of the semiconductor package 10. The distance 501 between the side surface 114 of the first semiconductor chip 110 and the side surface of the semiconductor package 10 may indicate a distance between the side surface 114 of the first semiconductor chip 110 and an outer side surface 1231 of the second cover insulating layer 123 in a direction orthogonal to the side surface 114 of the first semiconductor chip 110, the outer side surface 1231 forming the side surface of the semiconductor package 10. In some example embodiments, the distance 501 between the side surface 114 of the first semiconductor chip 110 and the side surface of the semiconductor package 10 may be about 10 μm to about 80 μm.

In general, a connection between an upper wiring at an upper side of a semiconductor chip and a lower wiring at a lower side of the semiconductor chip is implemented by a conductive post extending in the vertical direction. The conductive post is formed by a separate process from a process of forming the upper wiring and a process of forming the lower wiring. In addition, the process of forming the conductive post generally includes a process of forming a via hole in an insulating material layer and a plating process of filling the via hole with a conductive material. With respect to the conductive post, to prevent insufficient filling of the via hole with the conductive material in the plating process, the via hole and the conductive post are generally formed with a large width of around tens to around hundreds micrometers, and a size of a semiconductor package also increases by an arrangement space of the conductive post.

According to example embodiments of the inventive concept, the first side conductive layer 143 that is an electrical connection structure between the first upper conductive layer 141 and the first lower conductive layer 145 may be formed together by the same redistribution process as that of the first upper conductive layer 141. Accordingly, a process of manufacturing the semiconductor package 10 may be simplified, and manufacturing costs may be reduced. Furthermore, the first side conductive layer 143 for an electrical connection between the first upper conductive layer 141 and the first lower conductive layer 145 is formed with a small thickness of around several micrometers, and the first cover insulating layer 121 and the second cover insulating layer 123 covering the first side conductive layer 143 are also formed with a small thickness of around several micrometers, and thus, a footprint of the semiconductor package 10 may be reduced, and the semiconductor package 10 having a small form factor may be implemented.

Figure 2A:
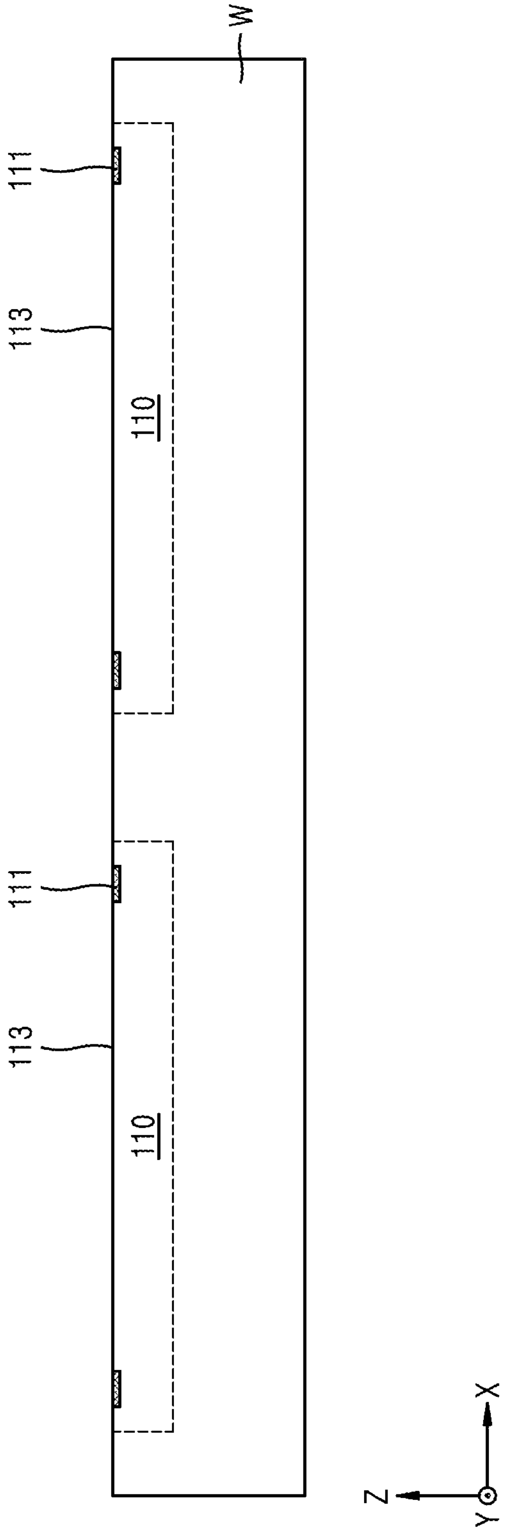
FIGS. 2A to 2L are cross-sectional views of the semiconductor package shown in FIGS. 1A to 1C.
Figure 2B:
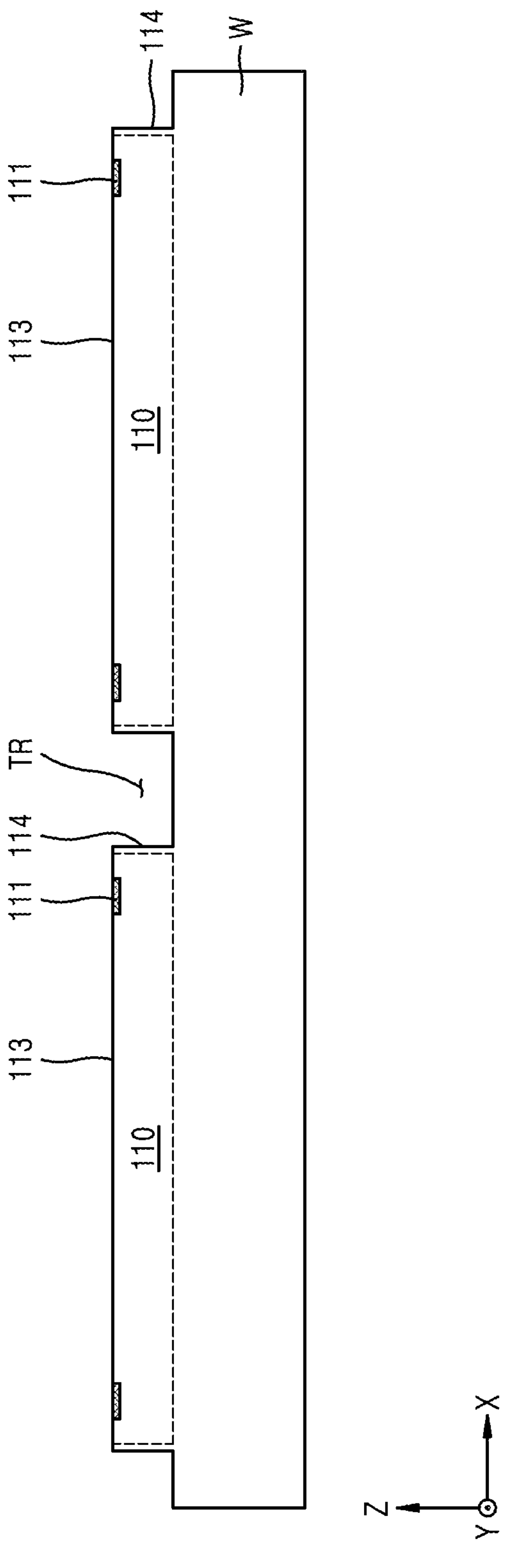
Figure 2C:
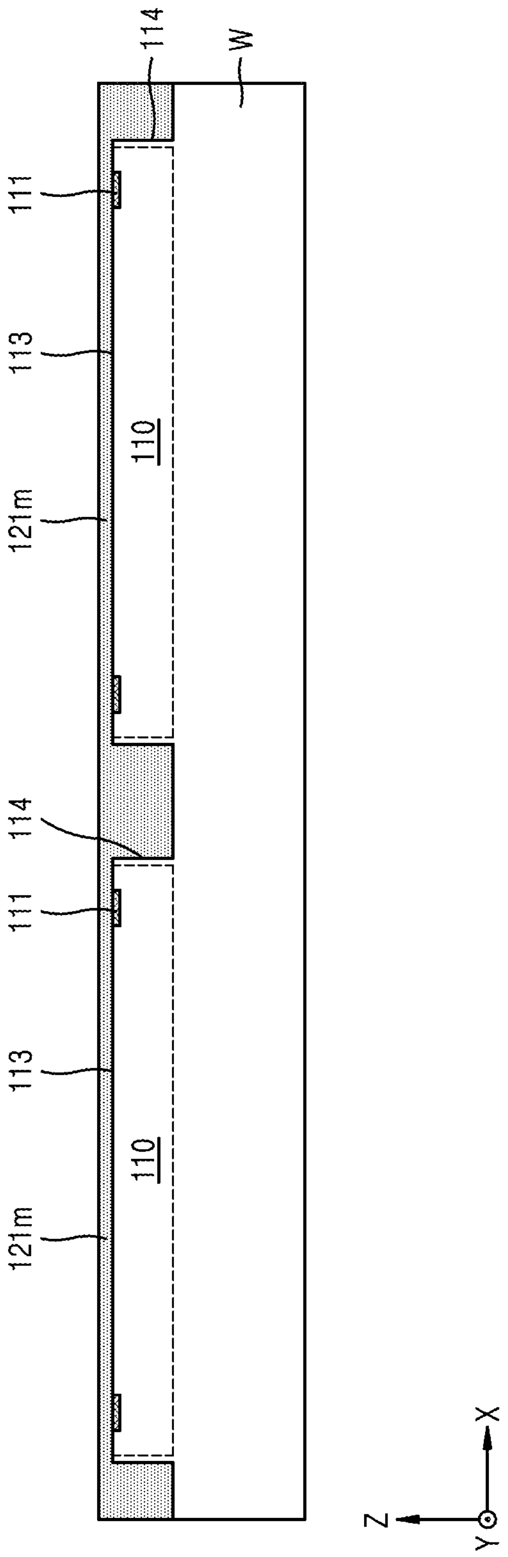
Figure 2D:
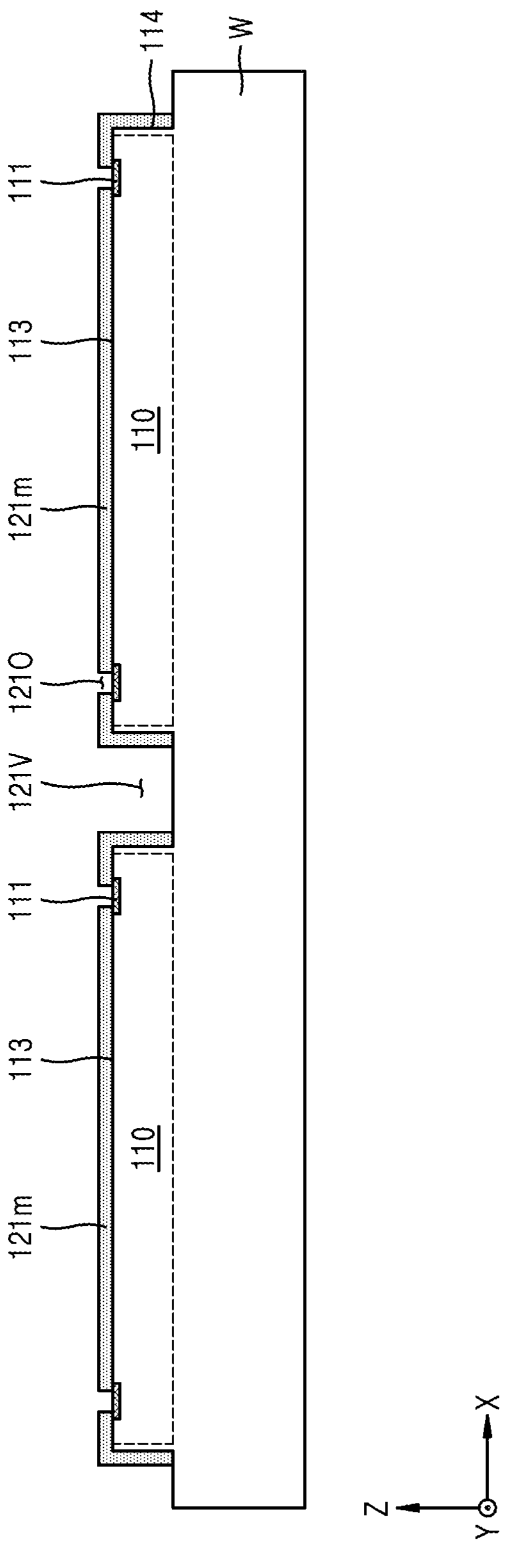
Figure 2E:
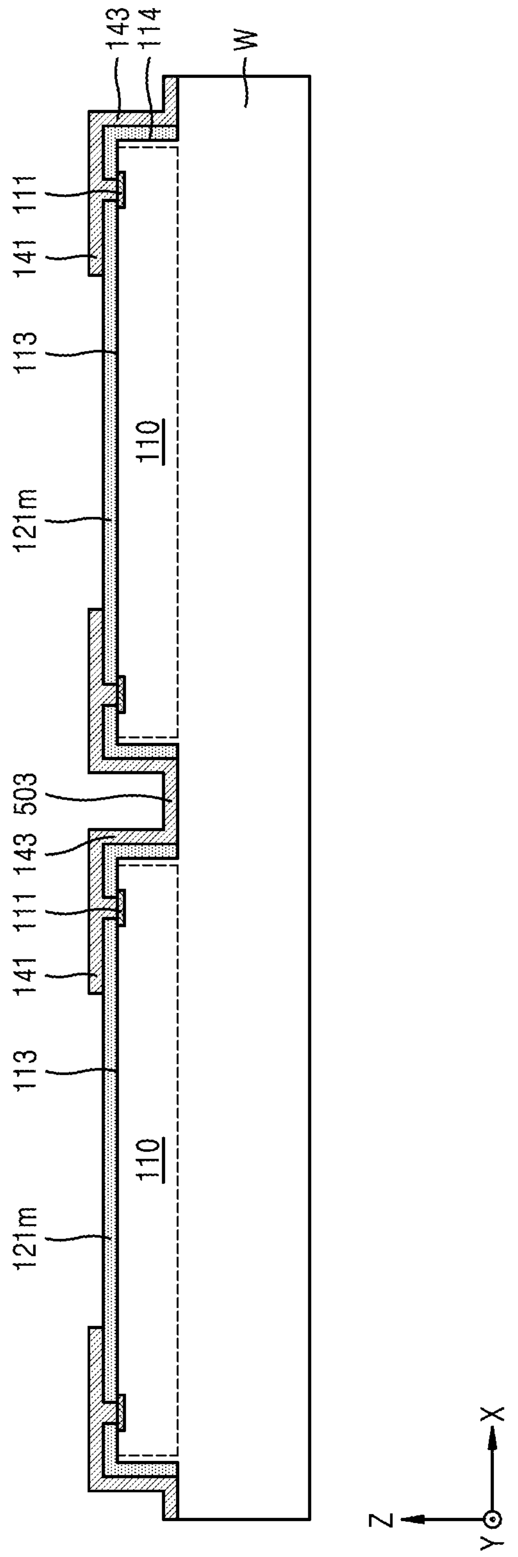

FIGS. 2A to 2L are cross-sectional views of the semiconductor package 10 shown in FIGS. 1A to 1C. FIG. 3A is a top view of a portion of a structure shown in FIG. 2D, FIG. 3B is a top view of a portion of a structure shown in FIG. 2E, and FIG. 3C is a top view of a portion of a structure shown in FIG. 2F. Hereinafter, a method of manufacturing the semiconductor package 10 shown in FIGS. 1A to 1C will be described with reference to FIGS. 2A to 2L and 3A to 3C.

Referring to FIG. 2A, a wafer W on which a plurality of integrated circuit forming a plurality of first semiconductor chips 110 are formed is prepared.

Referring to FIG. 2B, a trench TR is formed between the plurality of first semiconductor chips 110 by removing a portion of the wafer W. The trench TR is a space recessed from an upper side of the wafer W and may be formed by removing a portion of the wafer W. By forming the trench TR between the plurality of first semiconductor chips 110, a side surface of each of the plurality of first semiconductor chips 110 may be exposed. In a plan view, the plurality of first semiconductor chips 110 may be separated from each other by the trench TR.

Referring to FIGS. 2B and 2C, a first insulating material layer 121*m* covering the wafer W is formed. The first insulating material layer 121*m* may cover upper surfaces of the plurality of first semiconductor chips 110 and fill in the trench TR formed between the plurality of first semiconductor chips 110.

Referring to FIGS. 2D and 3A, a first hole 121V may be formed in the first insulating material layer 121*m* by removing a portion of the first insulating material layer 121*m* filled in the trench TR. The first hole 121V may pass through the first insulating material layer 121*m* filled in the trench TR so that a portion of the wafer W is exposed through the first hole 121V. In addition, at the same time when the first hole 121V is formed in the first insulating material layer 121*m*, the opening 121O through which the chip pad 111 of the first semiconductor chip 110 is exposed is formed by removing a portion of the first insulating material layer 121*m*. The first hole 121V and the opening 121O may be formed by an etching process or a laser drilling process on the first insulating material layer 121*m*.

Referring to FIGS. 2E and 3B, the first upper conductive layer 141, the first side conductive layer 143, and a conductive layer 503 that covers the surface of the wafer W exposed through the first hole 121V may be formed. the first upper conductive layer 141, the first side conductive layer 143, and the conductive layer 503 may be formed together by the same metal interconnect process.

Figure 2F:
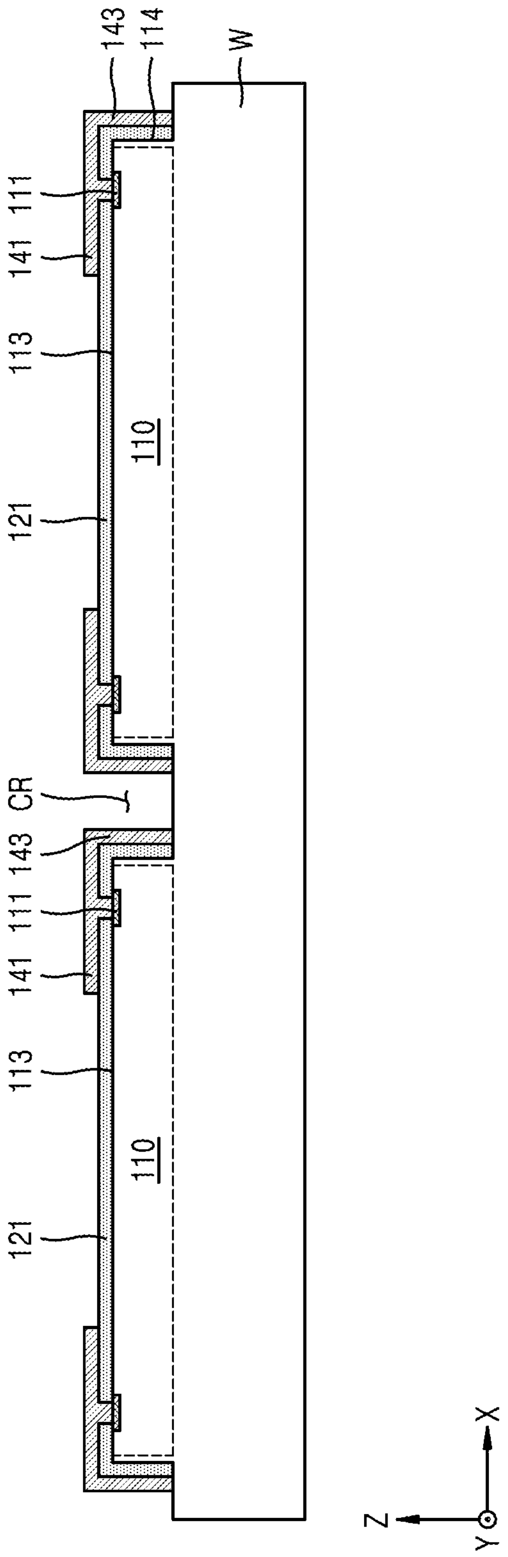
Figure 3A:
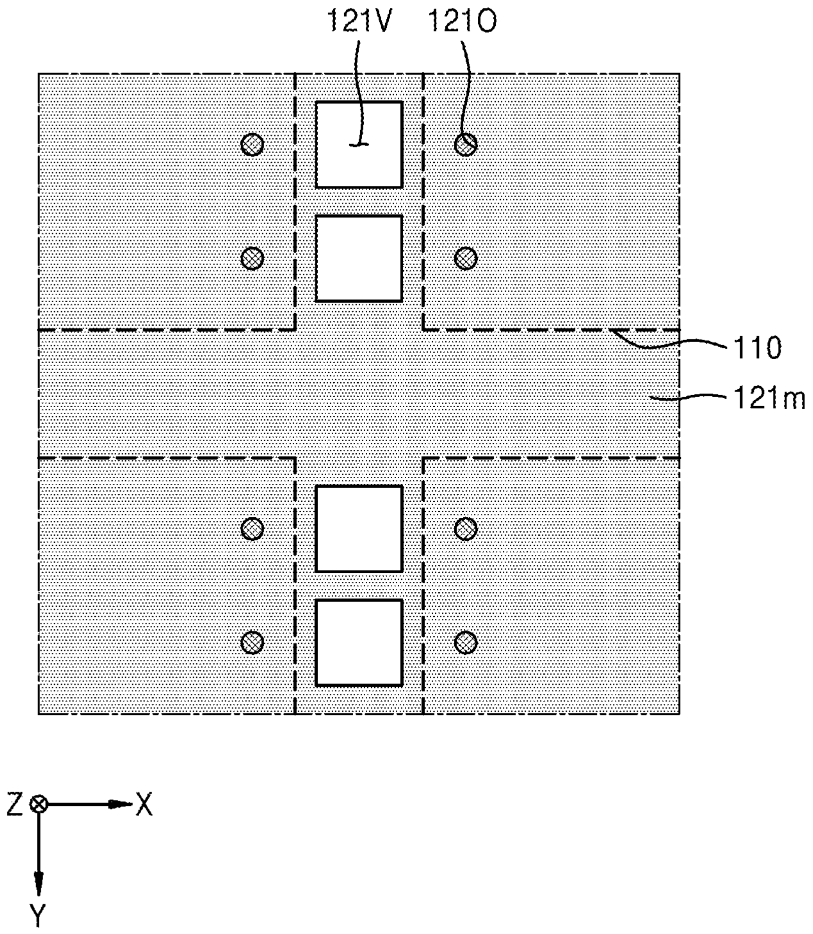
FIG. 3A is a top view of a portion of a structure shown in FIG. 2D.
Figure 3B:
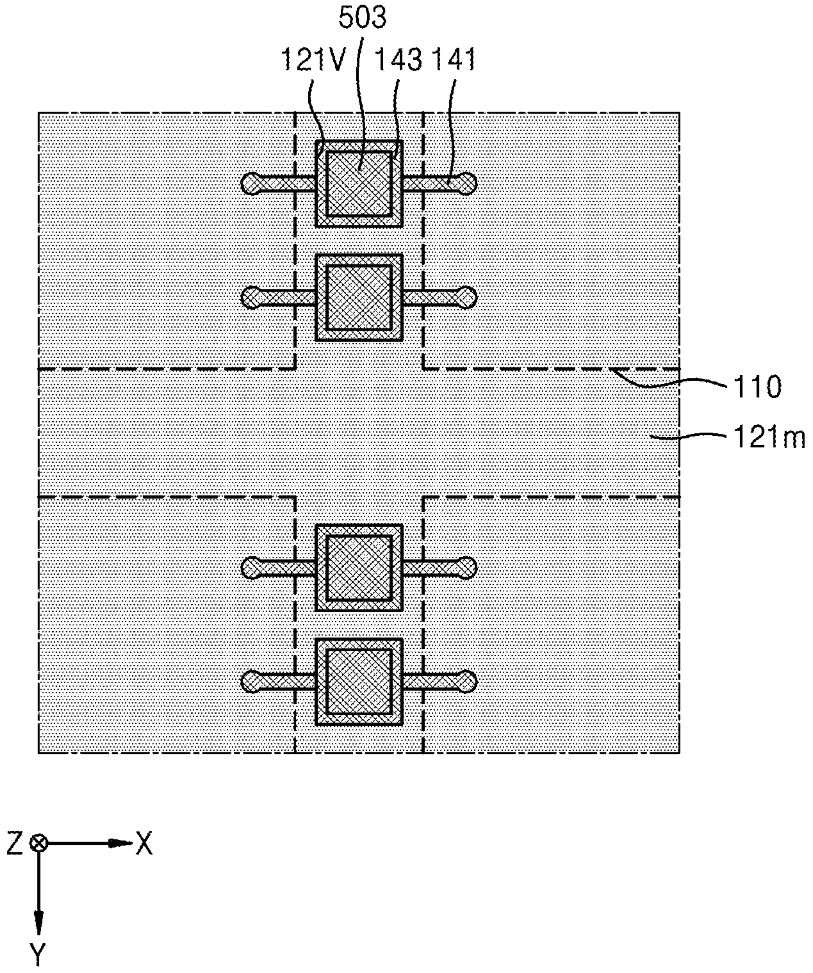
FIG. 3B is a top view of a portion of a structure shown in FIG. 2E.
Figure 3C:
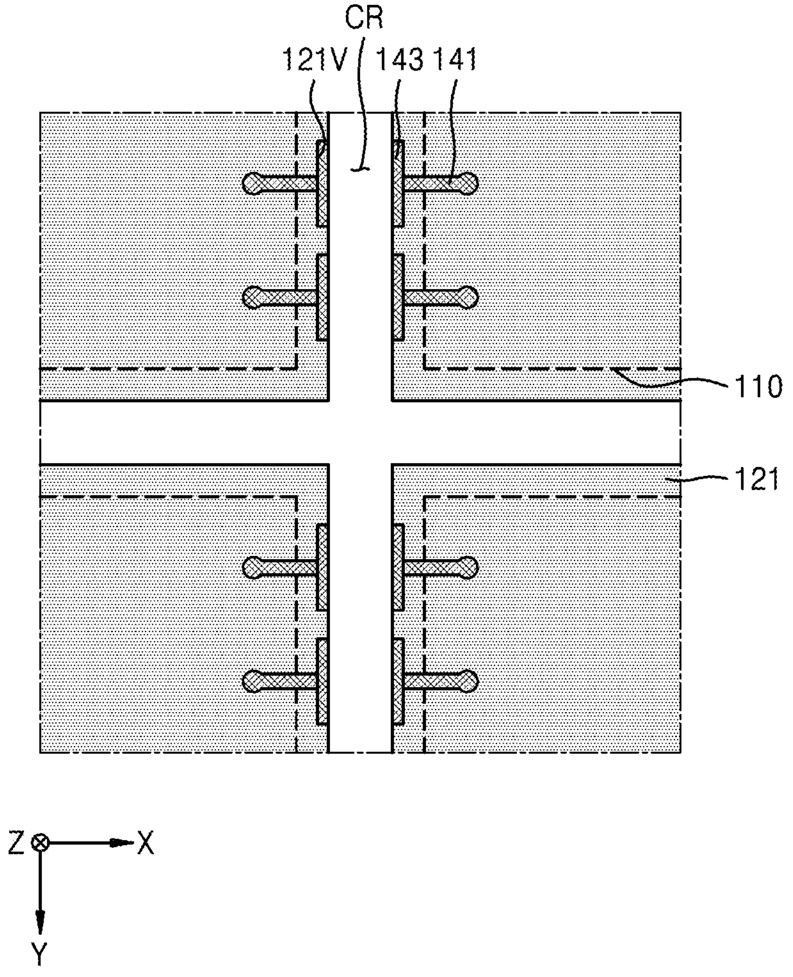
FIG. 3C is a top view of a portion of a structure shown in FIG. 2F.

Referring to FIGS. 2E, 2F, and 3C, a cutting process of forming a cutting region CR between the plurality of first semiconductor chips 110 is performed. The cutting region CR may be formed by removing a portion of each of material layers filled in the trench (TR of FIG. 2B) of the wafer W. The cutting process may include cutting using a cutting blade, cutting using a laser, or the like. The cutting region CR may be formed by removing a portion of the first insulating material layer 121*m* between the plurality of first semiconductor chips 110 and removing the conductive layer 503 covering the surface of the wafer W. The surface of the wafer W may be exposed through the cutting region CR. The cutting process may be performed to remove the conductive layer 503 covering the surface of the wafer W but not to remove the first side conductive layer 143 on a side wall of the first hole 121V. After the cutting process, a portion of the remaining first insulating material layer 121*m* may form the first cover insulating layer 121.

Figure 2G:
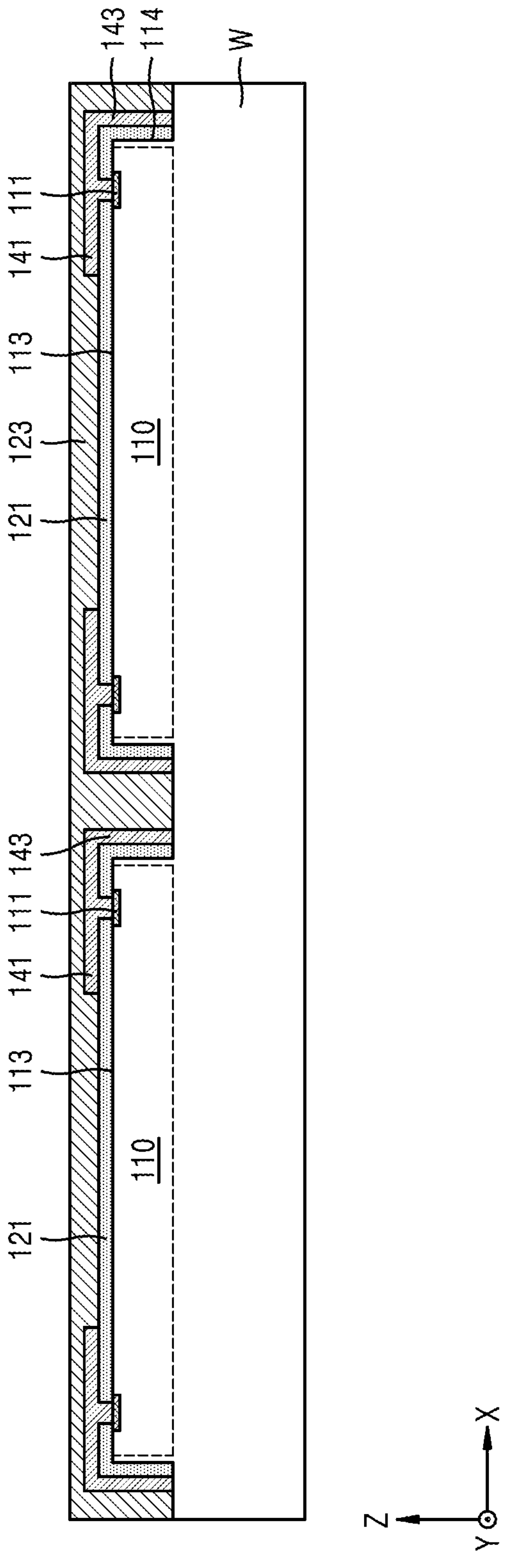

Referring to FIG. 2G, the second cover insulating layer 123 covering the result of FIG. 2F is formed. The second cover insulating layer 123 may cover the first cover insulating layer 121, the first upper conductive layer 141, and the first side conductive layer 143 and fill in the cutting region CR to cover the surface of the wafer W exposed through the cutting region CR.

Figure 2H:
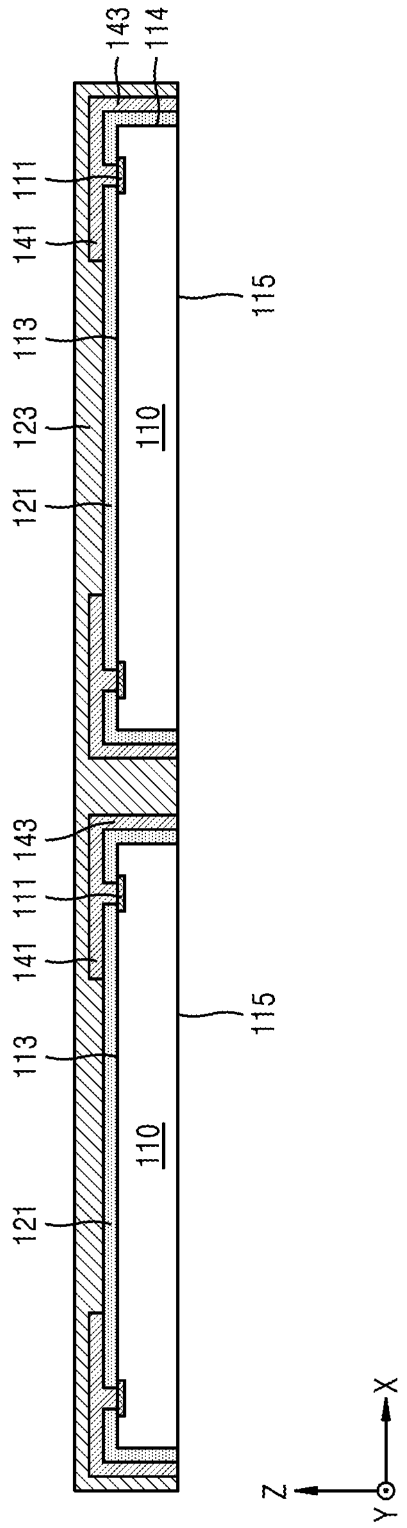

Referring to FIGS. 2G and 2H, a portion of the wafer W may be removed by performing a polishing process from a lower surface of the wafer W. The polishing process may be performed until the first side conductive layer 143 is exposed. The polishing process may include chemical mechanical polishing, a grinding process, and the like. Through the polishing process, the lower surface 115 of the first semiconductor chip 110 may be planarized. The surface of the second cover insulating layer 123 and the surface of the first cover insulating layer 121, which are exposed through the polishing process, may be on the same plane as the lower surface 115 of the first semiconductor chip 110.

Figure 2I:
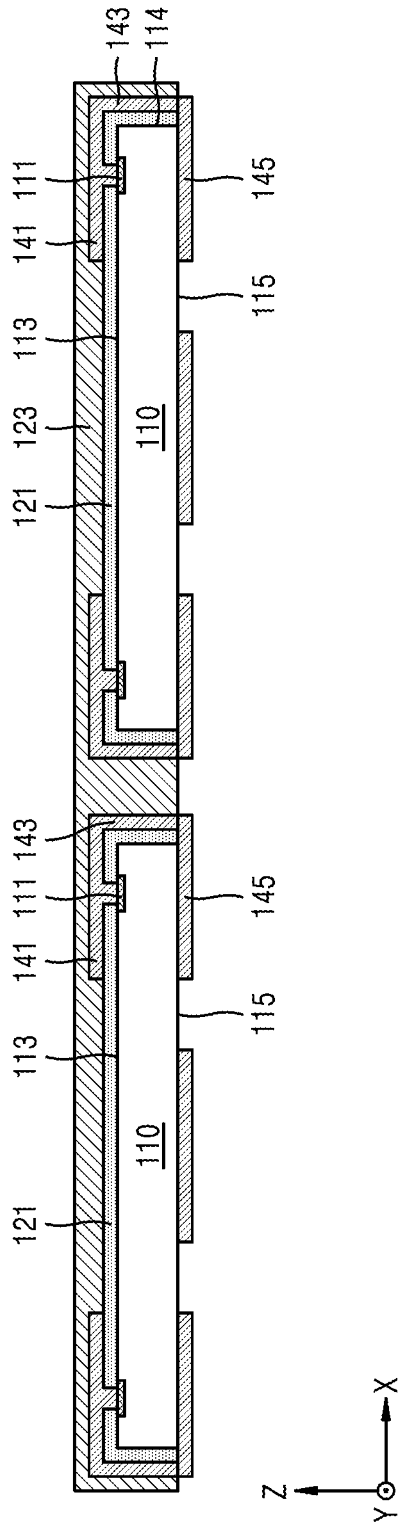

Referring to FIG. 2I, the first lower conductive layer 145 is formed on a lower surface of the result of FIG. 2H. The first lower conductive layer 145 may be connected to the first side conductive layer 143 and extend along the lower surface 115 of the first semiconductor chip 110.

Figure 2J:
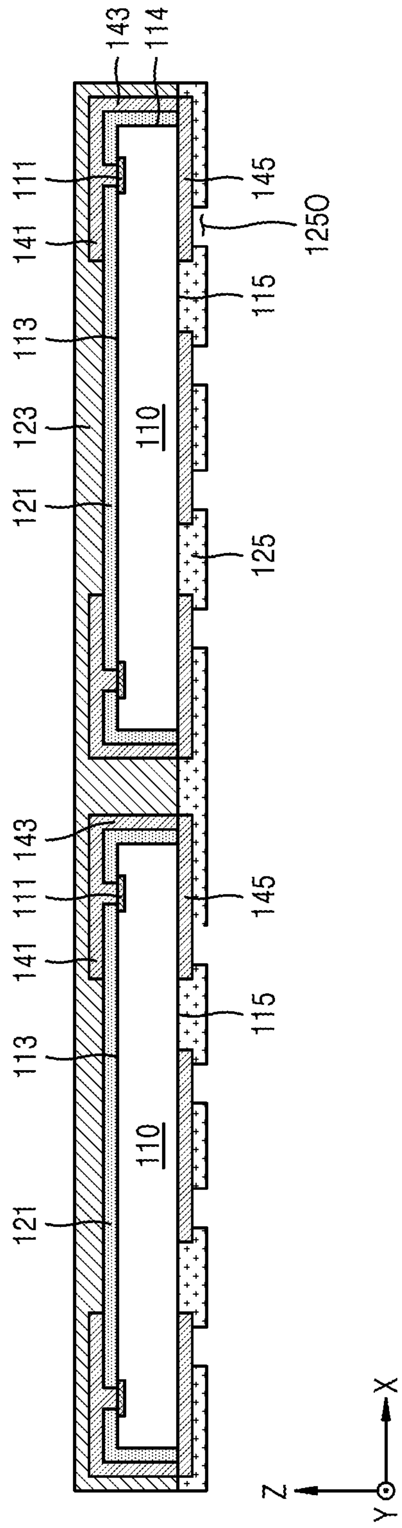

Referring to FIG. 2J, the first lower insulating layer 125 covering a lower surface of the result of FIG. 2I is formed. An insulating material layer covering the lower surface of the result of FIG. 2I may be formed to form the first lower insulating layer 125, and the opening 125O through which a portion of the first lower conductive layer 145 is exposed may be formed by removing a portion of the insulating material layer.

Figure 2K:
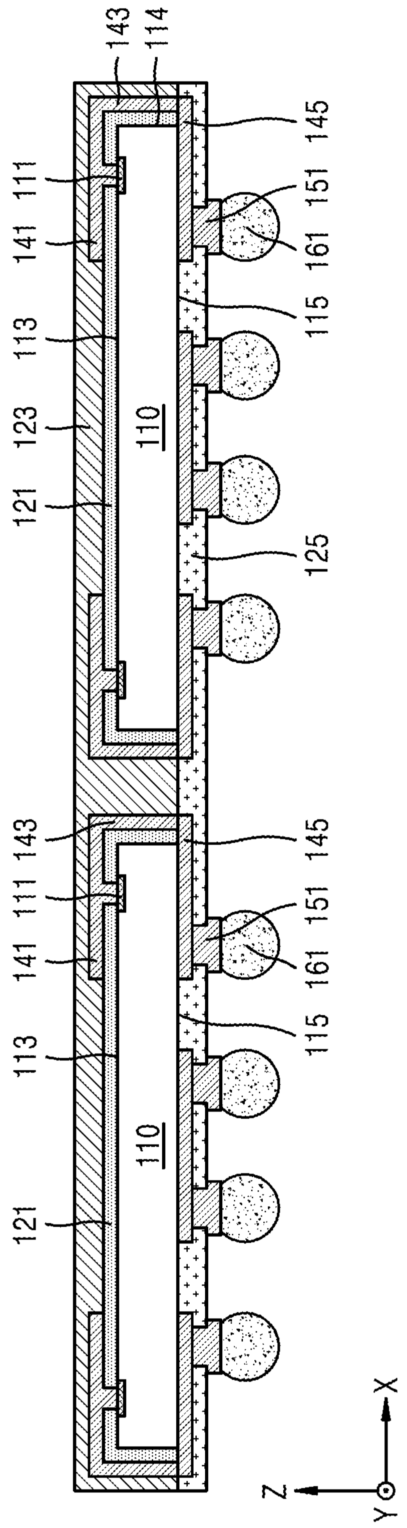

Referring to FIGS. 2J and 2K, the first lower bump pad 151 connected to the portion of the first lower conductive layer 145 exposed through the opening 125O of the first lower insulating layer 125 is formed, and the lower connection bump 161 is formed on the first lower bump pad 151.

Figure 2L:
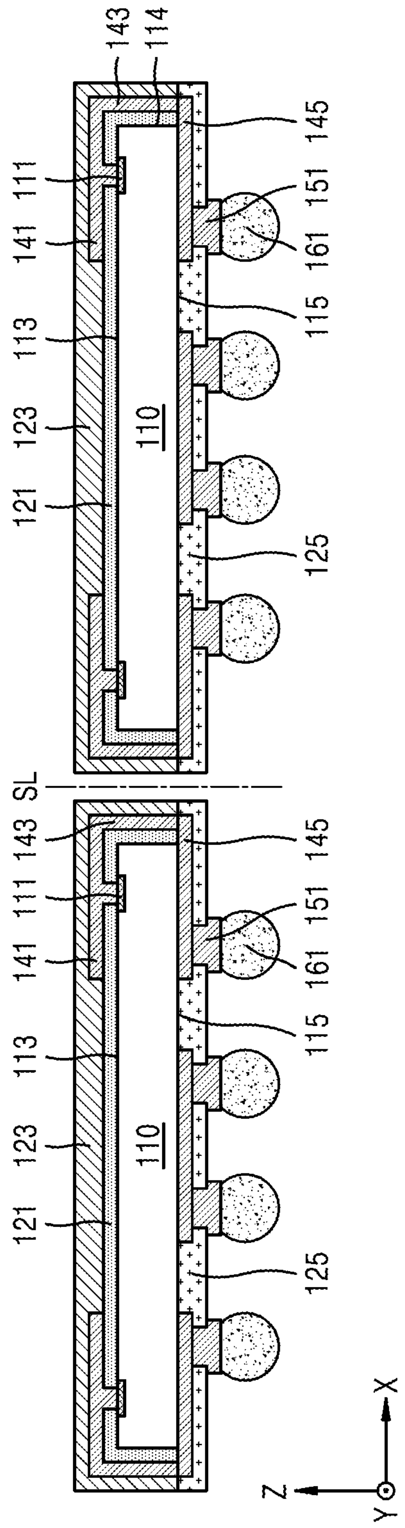

Referring to FIG. 2L, a sawing process on the result of FIG. 2K is performed. That is, a structure manufactured in a wafer level may be cut along a scribe lane SL to divide the structure manufactured in the wafer level into individual units of semiconductor packages 10.

Figure 4:
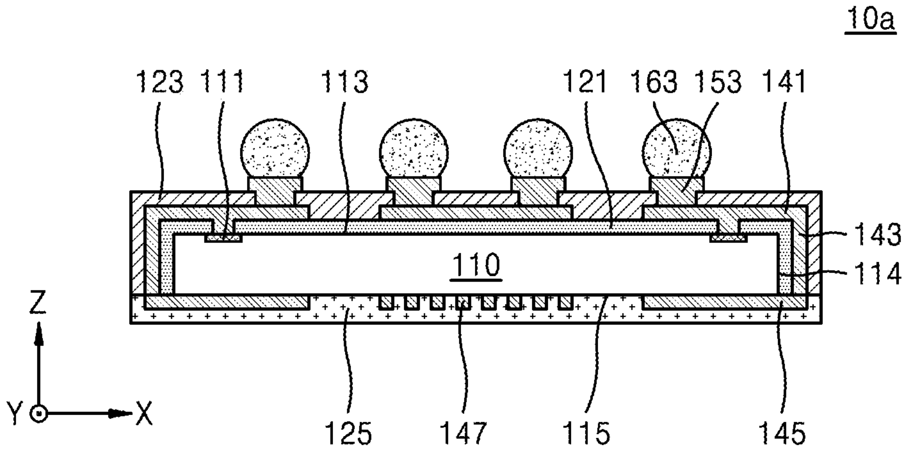
FIG. 4 is a cross-sectional view of a semiconductor package according to example embodiments of the inventive concept.

FIG. 4 is a cross-sectional view of a semiconductor package 10*a* according to example embodiments of the inventive concept. Hereinafter, a difference from the semiconductor package 10 described with reference to FIGS. 1A to 1C will be mainly described to describe the semiconductor package 10*a* shown in FIG. 4.

Referring to FIG. 4, the semiconductor package 10*a* may further include an inductor pattern 147 arranged on the lower surface 115 of the first semiconductor chip 110. The inductor pattern 147 may be in contact with the lower surface 115 of the first semiconductor chip 110 and be covered by the first lower insulating layer 125. The inductor pattern 147 may be formed together with the first lower conductive layer 145 during a metal interconnect process for forming the first lower conductive layer 145. The inductor pattern 147 may include the same material and/or material combination as the first lower conductive layer 145.

The semiconductor package 10*a* may include an upper bump pad 153 and an upper connection bump 163.

The upper bump pad 153 may be connected to the first upper conductive layer 141 through an opening of the second cover insulating layer 123. A portion of the upper bump pad 153 may protrude from the second cover insulating layer 123. For example, the first lower bump pad 151 may be an under bump metal layer.

The upper connection bump 163 may be provided on the upper bump pad 153. The upper connection bump 163 may include, for example, solder, Sn, Ag, In, Bi, Sb, Cu, Zn, Pb, and/or an alloy thereof. In example embodiments, the upper connection bump 163 may generally have a ball shape attached to the upper bump pad 153. For example, the upper connection bump 163 may be formed by placing a solder ball on the upper bump pad 153 and then performing a reflow process on the solder ball. In other example embodiments, the upper connection bump 163 has a plate shape and may be formed to have a generally uniform thickness on the surface of the upper bump pad 153.

Figure 5:
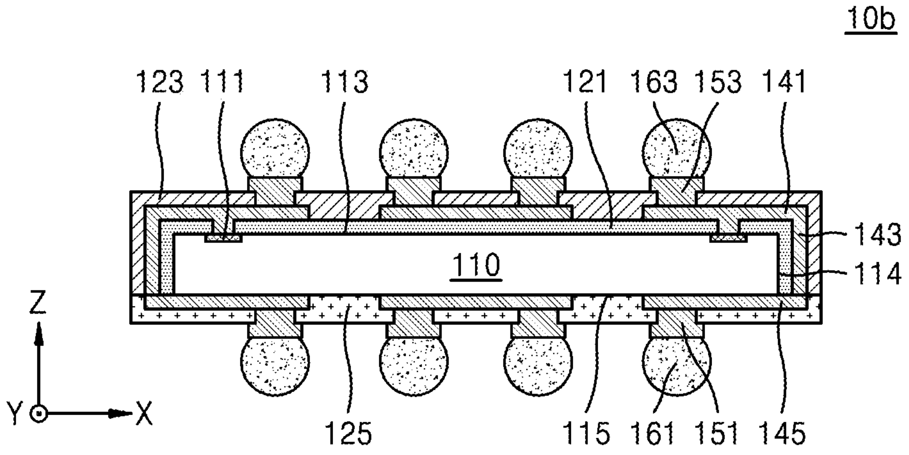
FIG. 5 is a cross-sectional view of a semiconductor package according to example embodiments of the inventive concept.

FIG. 5 is a cross-sectional view of a semiconductor package 10*b* according to example embodiments of the inventive concept. Hereinafter, a description made above will be omitted or simply repeated.

Referring to FIG. 5, the semiconductor package 10*b* may include the first lower bump pad 151 connected to the first lower conductive layer 145, the lower connection bump 161 attached to the first lower bump pad 151, the upper bump pad 153 connected to the first upper conductive layer 141, and the upper connection bump 163 attached to the upper bump pad 153. The semiconductor package 10*b* may be connected through the lower connection bump 161 to another semiconductor package or an electronic device arranged under the semiconductor package 10*b* and also connected through the upper connection bump 163 to another semiconductor package or an electronic device arranged above the semiconductor package 10*b*.

Figure 6:
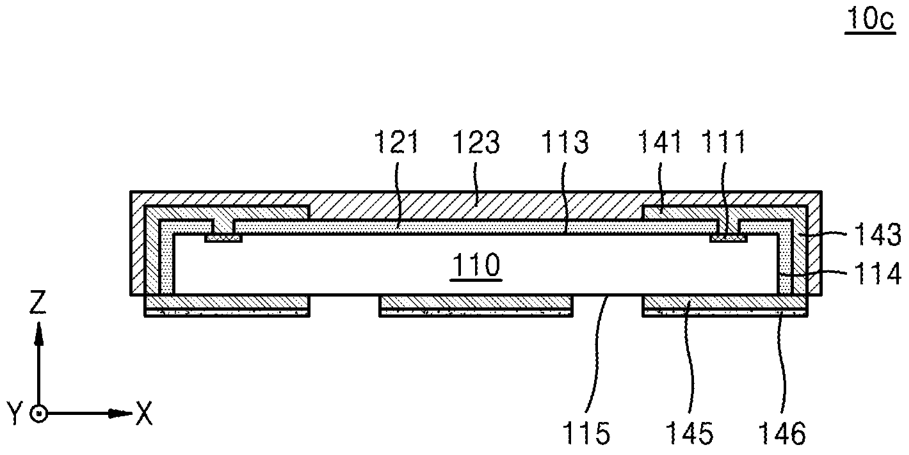
FIG. 6 is a cross-sectional view of a semiconductor package according to example embodiments of the inventive concept.

FIG. 6 is a cross-sectional view of a semiconductor package 10*c* according to example embodiments of the inventive concept. Hereinafter, a difference from the semiconductor package 10 described with reference to FIGS. 1A to 1C will be mainly described to describe the semiconductor package 10*c* shown in FIG. 6.

Referring to FIG. 6, the first lower conductive layer 145 of the semiconductor package 10*c* may include a lead pattern functioning as an external pad. The lead pattern may have, for example, a polygonal shape such as a circular or quadrangular shape in a plan view. In example embodiments, the first lower insulating layer (125 of FIG. 1A) may be omitted, and the first lower conductive layer 145 may be exposed to the outside. In example embodiments, a conductive adhesive layer 146 may be further arranged on the surface of the first lower conductive layer 145. The conductive adhesive layer 146 may be formed to cover a lower surface of the first lower conductive layer 145. The conductive adhesive layer 146 may be formed by, for example, a plating method. The conductive adhesive layer 146 may include, for example, solder, Sn, Ag, In, Bi, Sb, Cu, Zn, Pb, and/or an alloy thereof.

Figure 7:
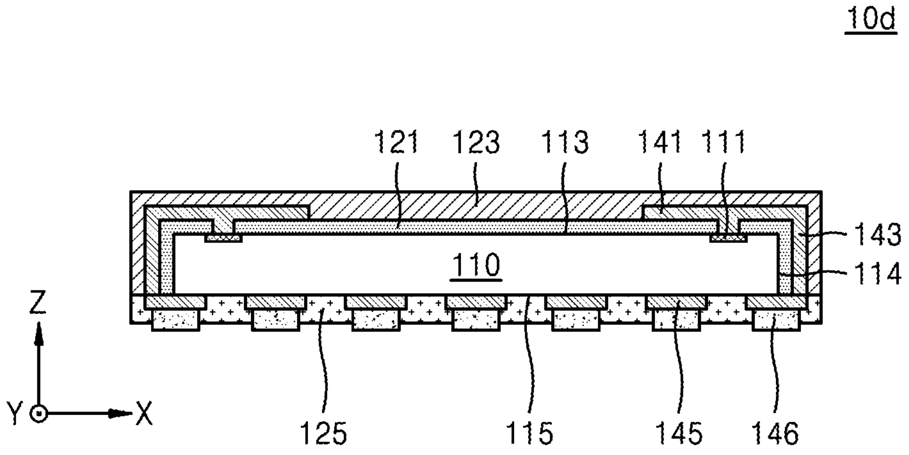
FIG. 7 is a cross-sectional view of a semiconductor package according to example embodiments of the inventive concept.

FIG. 7 is a cross-sectional view of a semiconductor package 10*d* according to example embodiments of the inventive concept. Hereinafter, a difference from the semiconductor package 10*c* described with reference to FIG. 6 will be mainly described to describe the semiconductor package 10*d* shown in FIG. 7.

Referring to FIG. 7, the semiconductor package 10*d* may include the first lower insulating layer 125 provided on the lower surface 115 of the first semiconductor chip 110. The first lower insulating layer 125 may cover the first lower conductive layer 145 including the lead pattern and cover at least a portion of a side surface of the conductive adhesive layer 146. The first lower insulating layer 125 may not cover a lower surface of the conductive adhesive layer 146 so that the lower surface of the conductive adhesive layer 146 is exposed to the outside.

Figure 8:
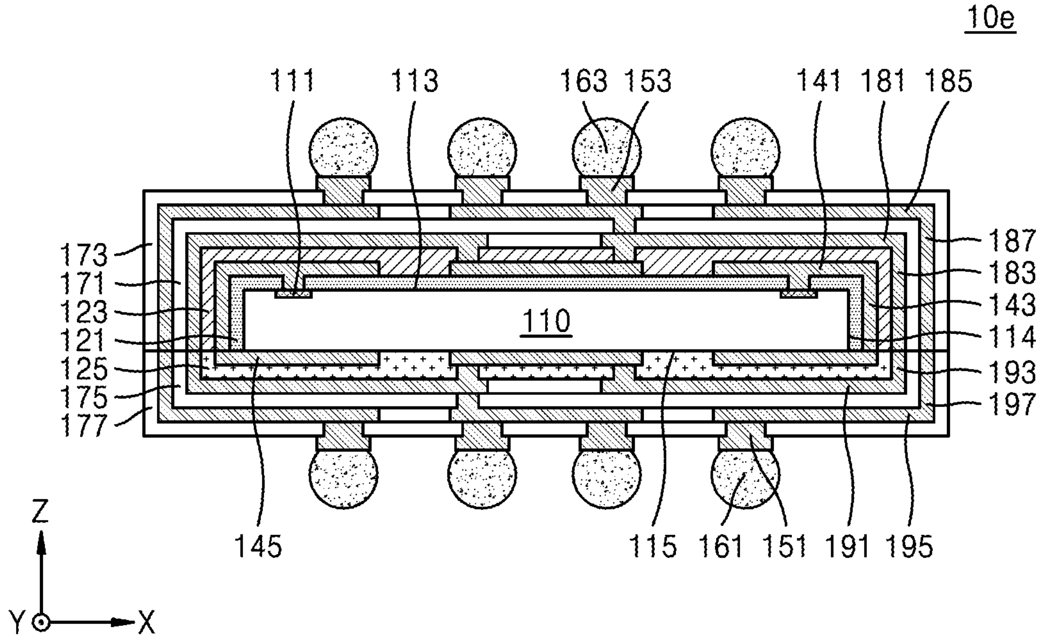
FIG. 8 is a cross-sectional view of a semiconductor package according to example embodiments of the inventive concept.

FIG. 8 is a cross-sectional view of a semiconductor package 10*e* according to example embodiments of the inventive concept. Hereinafter, a difference from the semiconductor package 10 described with reference to FIGS. 1A to 1C will be mainly described to describe the semiconductor package 10*e* shown in FIG. 8.

Referring to FIG. 8, the semiconductor package 10*e* may include the first semiconductor chip 110, the first cover insulating layer 121, the first upper conductive layer 141, the first side conductive layer 143, the second cover insulating layer 123, a second upper conductive layer 181, a second upper side conductive layer 183, a third cover insulating layer 171, a third upper conductive layer 185, a third upper side conductive layer 187, a fourth cover insulating layer 173, the first lower conductive layer 145, the first lower insulating layer 125, a second lower conductive layer 191, a second lower side conductive layer 193, a second lower insulating layer 175, a third lower conductive layer 195, a third lower side conductive layer 197, a third lower insulating layer 177, the first lower bump pad 151, and the lower connection bump 161.

The second upper conductive layer 181 may be provided on an upper surface of the second cover insulating layer 123. The second upper conductive layer 181 may be in contact with and extend along the upper surface of the second cover insulating layer 123. The second upper conductive layer 181 may be connected to the first upper conductive layer 141 through the opening of the second cover insulating layer 123. In example embodiments, the second upper conductive layer 181 may include a line pattern extending in a line shape on the upper surface of the second cover insulating layer 123.

The second upper side conductive layer 183 may be provided on a side surface of the second cover insulating layer 123. The second upper side conductive layer 183 may be connected to the second upper conductive layer 181 and extend along the side surface of the second cover insulating layer 123. The second upper side conductive layer 183 may extend downward from an upper end thereof connected to the second upper conductive layer 181. The second upper side conductive layer 183 may extend from an upper end to a lower end of the side surface of the second cover insulating layer 123. In example embodiments, a lower end of the second upper side conductive layer 183 and the lower end of the second cover insulating layer 123 may be on the same plane as the lower surface 115 of the first semiconductor chip 110. In example embodiments, the second upper side conductive layer 183 may have a plate shape extending in parallel to the side surface 114 of the first semiconductor chip 110, which faces the second upper side conductive layer 183.

The third cover insulating layer 171 may cover the second upper conductive layer 181, the second upper side conductive layer 183, and the second cover insulating layer 123. A portion of the third cover insulating layer 171 may extend along the upper surface of the second cover insulating layer 123 to cover the second upper conductive layer 181. The other portion of the third cover insulating layer 171 may extend along the side surface of the second cover insulating layer 123 to cover the second upper side conductive layer 183.

The third upper conductive layer 185 may be provided on an upper surface of the third cover insulating layer 171. The third upper conductive layer 185 may be in contact with and extend along the upper surface of the third cover insulating layer 171. The third upper conductive layer 185 may be connected to the second upper conductive layer 181 through an opening of the third cover insulating layer 171. In example embodiments, the third upper conductive layer 185 may include a line pattern extending in a line shape on the upper surface of the third cover insulating layer 171.

The third upper side conductive layer 187 may be provided on a side surface of the third cover insulating layer 171. The third upper side conductive layer 187 may be connected to the third upper conductive layer 185 and extend along the side surface of the third cover insulating layer 171. The third upper side conductive layer 187 may extend downward from an upper end thereof connected to the third upper conductive layer 185. The third upper side conductive layer 187 may extend from an upper end to a lower end of the side surface of the third cover insulating layer 171. In example embodiments, a lower end of the third upper side conductive layer 187 and the lower end of the third cover insulating layer 171 may be on the same plane as the lower surface 115 of the first semiconductor chip 110. In example embodiments, the third upper side conductive layer 187 may have a plate shape extending in parallel to the side surface 114 of the first semiconductor chip 110, which faces the third upper side conductive layer 187.

The fourth cover insulating layer 173 may cover the third upper conductive layer 185, the third upper side conductive layer 187, and the third cover insulating layer 171. A portion of the fourth cover insulating layer 173 may extend along the upper surface of the third cover insulating layer 171 and cover the third upper conductive layer 185. The other portion of the fourth cover insulating layer 173 may extend along the side surface of the third cover insulating layer 171 and cover the third upper side conductive layer 187. In example embodiments, the fourth cover insulating layer 173 located at the outermost position among the first to fourth cover insulating layers 121, 123, 171, and 173 may include a molding material such as an EMC, and the remaining first to third cover insulating layers 121, 123, and 171 may include polyimide.

The second lower conductive layer 191 may be provided on a lower surface of the first lower insulating layer 125. The second lower conductive layer 191 may be in contact with and extend along the lower surface of the first lower insulating layer 125. The second lower conductive layer 191 may be connected to the first lower conductive layer 145 through an opening of the first lower insulating layer 125. In example embodiments, the second lower conductive layer 191 may include a line pattern extending in a line shape on the lower surface of the first lower insulating layer 125.

The second lower side conductive layer 193 may be provided on a side surface of the first lower insulating layer 125. The second lower side conductive layer 193 may electrically connect the second lower conductive layer 191 to the second upper side conductive layer 183. The second lower side conductive layer 193 may extend along the side surface of the first lower insulating layer 125. The second lower side conductive layer 193 may extend in the vertical direction (e.g., the Z-axis direction) from an upper end thereof connected to the second upper side conductive layer 183 to a lower end thereof connected to the second lower conductive layer 191. The second lower side conductive layer 193 may extend from an upper end to a lower end of the side surface of the first lower insulating layer 125. In example embodiments, the second lower side conductive layer 193 may have a plate shape extending in the vertical direction (e.g., the Z-axis direction) and have a horizontal width similar to that of the second upper side conductive layer 183.

The second lower insulating layer 175 may cover the second lower conductive layer 191, the second lower side conductive layer 193, and the first lower insulating layer 125. A portion of the second lower insulating layer 175 may extend along the lower surface of the first lower insulating layer 125 to cover the second lower conductive layer 191. The other portion of the second lower insulating layer 175 may extend along the side surface of the first lower insulating layer 125 to cover the second lower side conductive layer 193.

The third lower conductive layer 195 may be provided on a lower surface of the second lower insulating layer 175. The third lower conductive layer 195 may be in contact with and extend along the lower surface of the second lower insulating layer 175. The third lower conductive layer 195 may be connected to the second lower conductive layer 191 through an opening of the second lower insulating layer 175. In example embodiments, the third lower conductive layer 195 may include a line pattern extending in a line shape on the lower surface of the second lower insulating layer 175.

The third lower side conductive layer 197 may be provided on a side surface of the second lower insulating layer 175. The third lower side conductive layer 197 may electrically connect the third lower conductive layer 195 to the third upper side conductive layer 187. The third lower side conductive layer 197 may extend along the side surface of the second lower insulating layer 175. The third lower side conductive layer 197 may extend in the vertical direction (e.g., the Z-axis direction) from an upper end thereof connected to the third upper side conductive layer 187 to a lower end thereof connected to the third lower conductive layer 195. The third lower side conductive layer 197 may extend from an upper end to a lower end of the side surface of the second lower insulating layer 175. In example embodiments, the third lower side conductive layer 197 may have a plate shape extending in the vertical direction (e.g., the Z-axis direction) and have a horizontal width similar to that of the third upper side conductive layer 187.

The third lower insulating layer 177 may cover the third lower conductive layer 195, the third lower side conductive layer 197, and the second lower insulating layer 175. A portion of the third lower insulating layer 177 may extend along the lower surface of the second lower insulating layer 175 to cover the third lower conductive layer 195. The other portion of the third lower insulating layer 177 may extend along the side surface of the second lower insulating layer

175 to cover the third lower side conductive layer 197. In example embodiments, the third lower insulating layer 177 located at the outermost position among the first to third lower insulating layers 125, 175, and 177 may include a molding material such as an EMC, and the remaining first and second lower insulating layers 125 and 175 may include polyimide.

Although FIG. 8 shows that the semiconductor package 10*e* includes the first to third upper conductive layers 141, 181, and 185 forming three layers on the upper surface 113 of the first semiconductor chip 110, two or more conductive layers may be provided on the upper surface 113 of the first semiconductor chip 110. In other words, the semiconductor package 10*e* may further include an upper conductive structure having a single-layer or multi-layer structure in addition to the first upper conductive layer 141. When the upper conductive structure has the multi-layer structure, a plurality of conductive layers separated from each other in a direction orthogonal to the upper surface 113 of the first semiconductor chip 110 and extending in generally parallel to the upper surface 113 of the first semiconductor chip 110 may be included. In the embodiment of FIG. 8, the second and third upper conductive layers 181 and 185 may form the upper conductive structure.

In addition, the semiconductor package 10*e* may include conductive layers provided on the side surface 114 of the first semiconductor chip 110 and forming two or more layers. In other words, the semiconductor package 10*e* may further include a side conductive structure having a single-layer or multi-layer structure in addition to the first side conductive layer 143. When the side conductive structure has the multi-layer structure, a plurality of conductive layers separated from each other in a direction orthogonal to the side surface 114 of the first semiconductor chip 110 and extending in generally parallel to the side surface 114 of the first semiconductor chip 110 may be included. In the embodiment of FIG. 8, the second and third upper side conductive layers 183 and 187 may form the side conductive structure.

In addition, the semiconductor package 10*e* may further include a cover insulating structure provided on the second cover insulating layer 123 and covering the upper conductive structure and the side conductive structure. The cover insulating structure may include a single insulating layer or multiple insulating layers provided on the second cover insulating layer 123. When the cover insulating structure has a multi-layer structure, each of insulating layers included in the cover insulating structure may extend along the upper surface 113 and the side surface 114 of the first semiconductor chip 110. In the embodiment of FIG. 8, the third and fourth cover insulating layers 171 and 173 may form the cover insulating structure.

In addition, the semiconductor package 10*e* may include conductive layers provided on the lower surface 115 of the first semiconductor chip 110 and forming two or more layers. In other words, the semiconductor package 10*e* may further include a lower conductive structure having a single-layer or multi-layer structure in addition to the first lower conductive layer 145. When the lower conductive structure has the multi-layer structure, a plurality of conductive layers separated from each other in a direction orthogonal to the lower surface 115 of the first semiconductor chip 110 and extending in generally parallel to the lower surface 115 of the first semiconductor chip 110 may be included. In the embodiment of FIG. 8, the second and third lower conductive layers 191 and 195 may form the lower conductive structure. The lower conductive structure may be electrically connected to the side conductive structure through a lower side conductive structure, such as the second and third lower side conductive layers 193 and 197, extending in the vertical direction.

In addition, the semiconductor package 10*e* may further include a lower insulating structure provided on the first lower insulating layer 125 and covering the lower conductive structure. The lower insulating structure may include a single insulating layer or multiple insulating layers provided on the first lower insulating layer 125. When the lower insulating structure has a multi-layer structure, each of insulating layers included in the lower insulating structure may extend along the lower surface and the side surface of the first lower insulating layer 125. In the embodiment of FIG. 8, the second and third lower insulating layers 175 and 177 may form the lower insulating structure.

Figure 9:
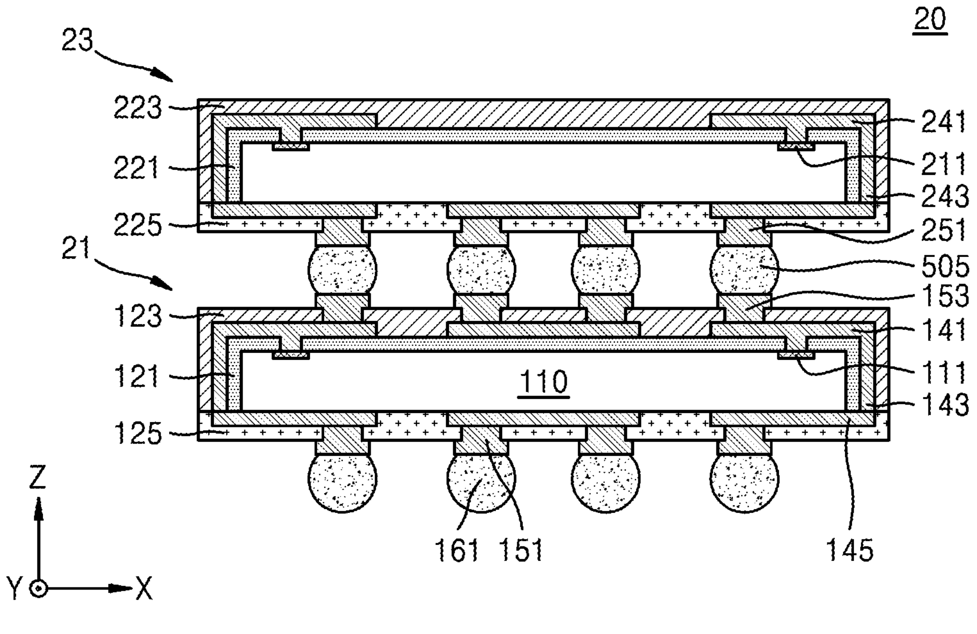
FIG. 9 is a cross-sectional view of a semiconductor package according to example embodiments of the inventive concept.

FIG. 9 is a cross-sectional view of a semiconductor package 20 according to example embodiments of the inventive concept. Hereinafter, a description made above will be omitted or simply repeated.

Referring to FIG. 9, the semiconductor package 20 may have a package-on-package structure in which a first upper package 23 is attached onto a lower package 21.

The lower package 21 may be a semiconductor package of a fan-out structure. The lower package 21 may be substantially the same as or similar to the semiconductor package 10*b* described with reference to FIG. 5.

The first upper package 23 may be stacked on the lower package 21 through an inter-package connection terminal 505. In the present disclosure, the first upper package 23 may be referred to as a package structure. The first upper package 23 may be a semiconductor package of the fan-out structure. The first upper package 23 may be substantially the same as or similar to the semiconductor package 10 described with reference to FIGS. 1A to 1C. The first upper package 23 may include a second semiconductor chip 210 including a chip pad 211, a fifth cover insulating layer 221 covering an upper surface and a side surface of the second semiconductor chip 210, a fourth upper conductive layer 241 extending along an upper surface of the fifth cover insulating layer 221, a fourth side conductive layer 243 extending along a side surface of the fifth cover insulating layer 221, a sixth cover insulating layer 223 covering the fourth upper conductive layer 241 and the fourth side conductive layer 243, a fourth lower conductive layer 245 extending along a lower surface of the second semiconductor chip 210, a fourth lower insulating layer 225 covering the fourth lower conductive layer 245, and a second lower bump pad 251 connected to the fourth lower conductive layer 245 through an opening of the fourth lower insulating layer 225. The second semiconductor chip 210, the fifth cover insulating layer 221, the fourth upper conductive layer 241, the fourth side conductive layer 243, the sixth cover insulating layer 223, the fourth lower conductive layer 245, the fourth lower insulating layer 225, and the second lower bump pad 251 in the first upper package 23 may correspond to the first semiconductor chip 110, the first cover insulating layer 121, the first upper conductive layer 141, the first side conductive layer 143, the second cover insulating layer 123, the first lower conductive layer 145, the first lower insulating layer 125, and the first lower bump pad 151 in the semiconductor package 10 described with reference to FIGS. 1A to 1C, respectively. The inter-package connection terminal 505 may be between the upper bump pad 153 of the lower package 21 and the second lower bump pad 251 of the first upper package 23.

Figure 10:
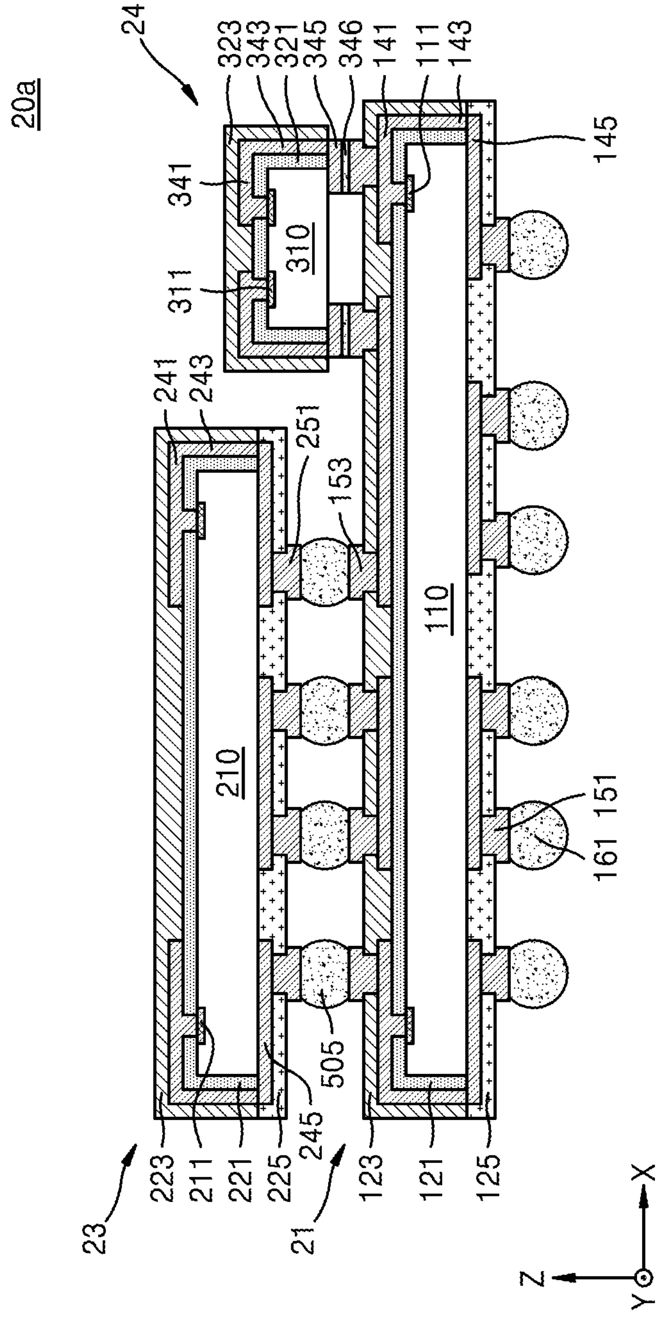
FIG. 10 is a cross-sectional view of a semiconductor package according to example embodiments of the inventive concept.

FIG. 10 is a cross-sectional view of a semiconductor package 20*a* according to example embodiments of the inventive concept. Hereinafter, a difference from the semiconductor package 20 described with reference to FIG. 9 will be mainly described to describe the semiconductor package 20*a* shown in FIG. 10.

Referring to FIG. 10, the semiconductor package 20*a* may have a package-on-package structure in which the first upper package 23 and a second upper package 24 are attached onto the lower package 21. The first upper package 23 and the second upper package 24 may be arranged side by side above the lower package 21.

The second upper package 24 may be a semiconductor package of the fan-out structure. In the present disclosure, the second upper package 24 may be referred to as a package structure. The second upper package 24 may be substantially the same as or similar to the semiconductor package 10*c* described with reference to FIG. 6. The second upper package 24 may include a third semiconductor chip 310 including a chip pad 311, a seventh cover insulating layer 321 covering an upper surface and a side surface of the third semiconductor chip 310, a fifth upper conductive layer 341 extending along an upper surface of the seventh cover insulating layer 321, a fifth side conductive layer 343 extending along a side surface of the seventh cover insulating layer 321, an eighth cover insulating layer 323 covering the fifth upper conductive layer 341 and the fifth side conductive layer 343, a fifth lower conductive layer 345 extending along a lower surface of the third semiconductor chip 310, and a conductive adhesive layer 346. The third semiconductor chip 310, the seventh cover insulating layer 321, the fifth upper conductive layer 341, the fifth side conductive layer 343, the eighth cover insulating layer 323, the fifth lower conductive layer 345, and the conductive adhesive layer 346 in the second upper package 24 may correspond to the first semiconductor chip 110, the first cover insulating layer 121, the first upper conductive layer 141, the first side conductive layer 143, the second cover insulating layer 123, the first lower conductive layer 145, and the conductive adhesive layer 146 in the semiconductor package 10*c* described with reference to FIG. 6, respectively. The upper bump pad 153 of the lower package 21 and the fifth lower conductive layer 345 of the second upper package 24 may be coupled to each other through the conductive adhesive layer 346.

Figure 11:
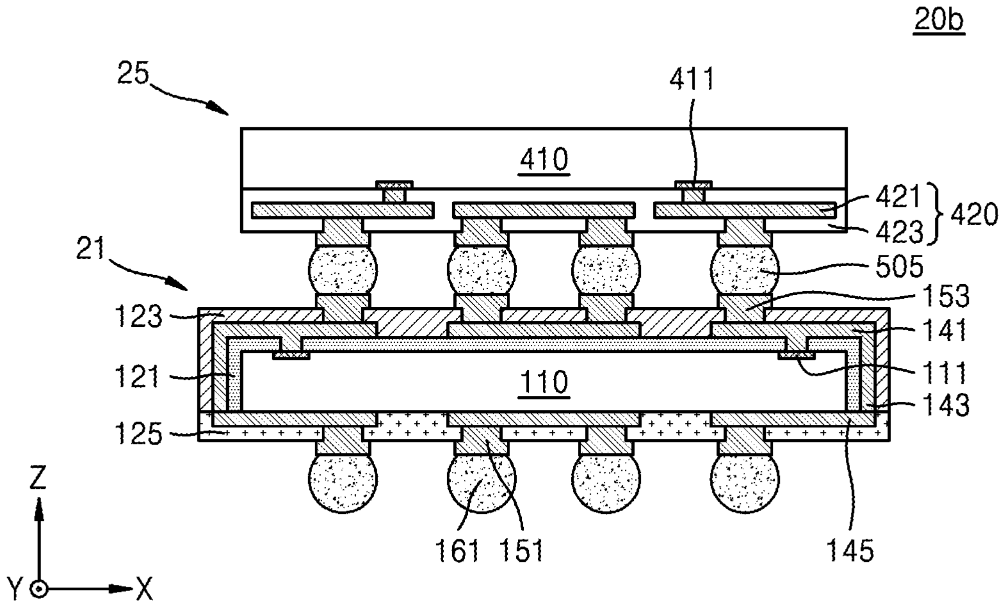
FIG. 11 is a cross-sectional view of a semiconductor package according to example embodiments of the inventive concept.

FIG. 11 is a cross-sectional view of a semiconductor package 20*b* according to example embodiments of the inventive concept. Hereinafter, a difference from the semiconductor package 20 described with reference to FIG. 9 will be mainly described to describe the semiconductor package 20*b* shown in FIG. 11.

Referring to FIG. 11, the semiconductor package 20*b* may have a package-on-package structure in which a third upper package 25 is attached onto the lower package 21.

The third upper package 25 may be stacked on the lower package 21 through the inter-package connection terminal 505. The third upper package 25 may be a semiconductor package of a fan-in structure. The third upper package 25 may include a fourth semiconductor chip 410 in which a surface having a chip pad 411 faces the lower package 21, and a redistribution structure 420 on the fourth semiconductor chip 410. The redistribution structure 420 may include a conductive redistribution pattern 421 and a redistribution insulating layer 423 covering the conductive redistribution pattern 421. The inter-package connection terminal 505 may be between a portion of the conductive redistribution pattern 421 protruding from the redistribution insulating layer 423 and the upper bump pad 153 of the lower package 21. The conductive redistribution pattern 421 may electrically connect the chip pad 411 of the fourth semiconductor chip 410 to the inter-package connection terminal 505.

Figure 12A:
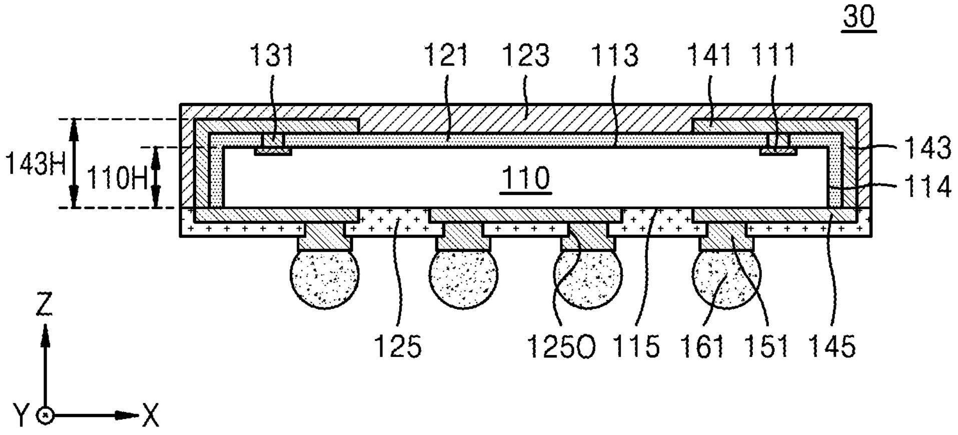
FIG. 12A is a cross-sectional view of a semiconductor package according to example embodiments of the inventive concept.
Figure 12B:
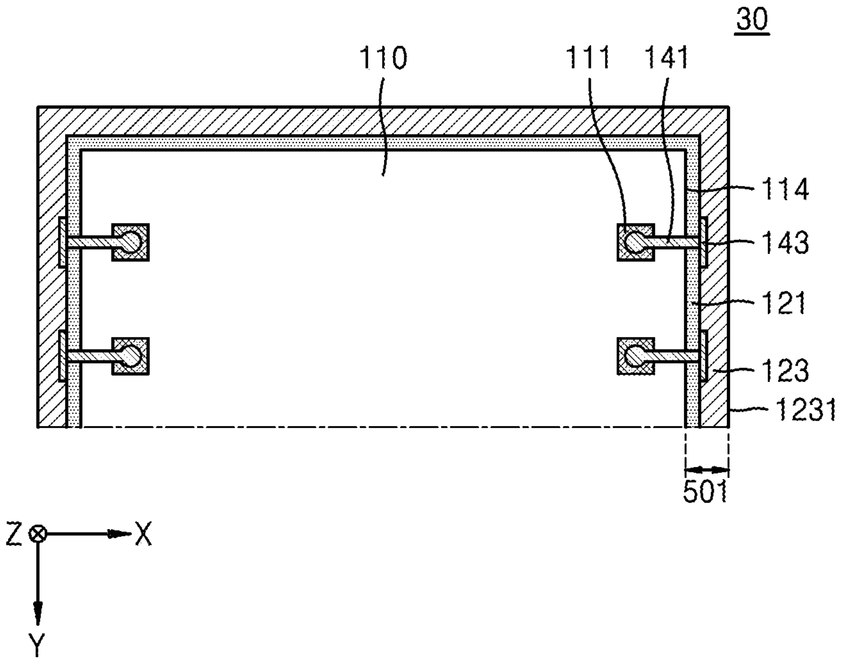
FIG. 12B is a layout diagram of some components of the semiconductor package shown in FIG. 12A.
Figure 12C:
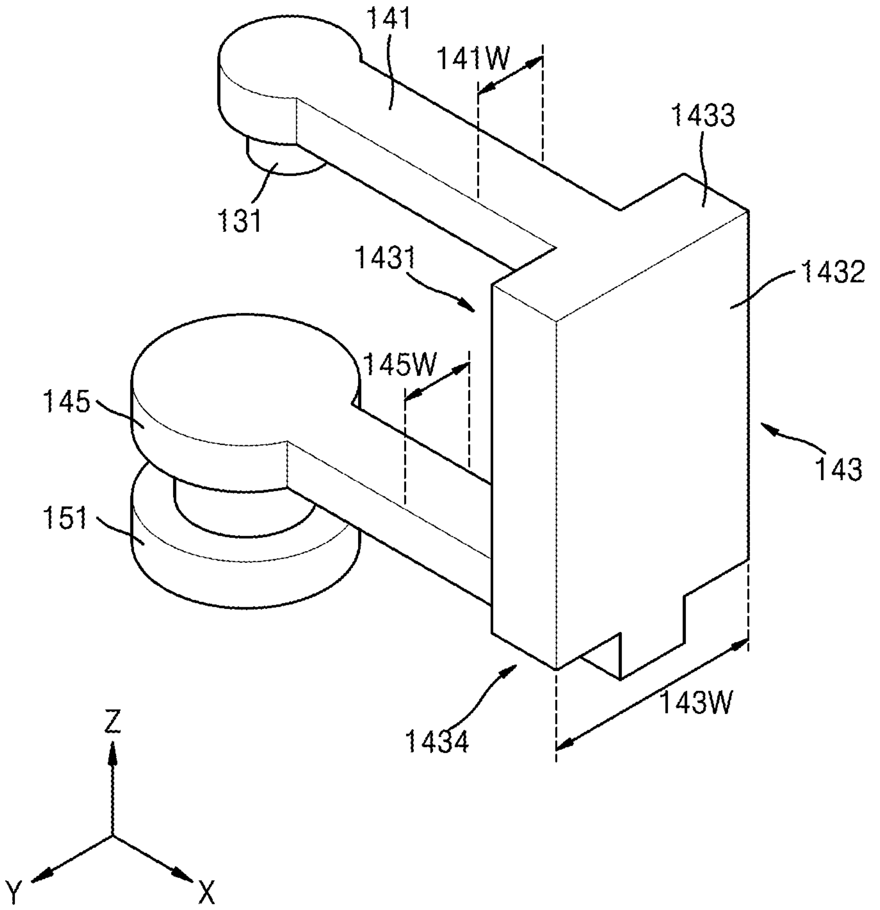
FIG. 12C is a perspective view of a first conductive pillar, a first upper conductive layer, a first side conductive layer, a first lower conductive layer, and a first lower bump pad in the semiconductor package shown in FIG. 12A.

FIG. 12A is a cross-sectional view of a semiconductor package 30 according to example embodiments of the inventive concept. FIG. 12B is a layout diagram of some components of the semiconductor package 30 shown in FIG. 12A. FIG. 12C is a perspective view of a first conductive pillar 131, a first upper conductive layer 141, a first side conductive layer 143, a first lower conductive layer 145, and a first lower bump pad 151 in the semiconductor package 30 shown in FIG. 12A.

Referring to FIGS. 12A to 12C, the semiconductor package 30 may include a first semiconductor chip 110, the first conductive pillar 131, a first cover insulating layer 121, the first upper conductive layer 141, the first side conductive layer 143, a second cover insulating layer 123, the first lower conductive layer 145, a first lower insulating layer 125, the first lower bump pad 151, and a lower connection bump 161.

The first cover insulating layer 121 may cover the upper surface 113 and the side surface 114 of the first semiconductor chip 110. A portion of the first cover insulating layer 121 may extend along the upper surface 113 of the first semiconductor chip 110. In addition, the other portion of the first cover insulating layer 121 may extend along the side surface 114 of the first semiconductor chip 110 to fully cover the side surface 114 of the first semiconductor chip 110. In a plan view, the first cover insulating layer 121 may fully surround the side surface 114 of the first semiconductor chip 110. For example, when the first semiconductor chip 110 has a quadrangular plane shape, the first cover insulating layer 121 may have a quadrangular ring shape surrounding four side surfaces of the first semiconductor chip 110. In example embodiments, a footprint of the first cover insulating layer 121 may be the same as or similar to a footprint of the first semiconductor chip 110. That is, a plane area of the first cover insulating layer 121 may be the same as or similar to a plane area of the first semiconductor chip 110.

The first conductive pillar 131 may be on the chip pad 111 of the first semiconductor chip 110. The first conductive pillar 131 may extend through the first cover insulating layer 121, and a side wall of the first conductive pillar 131 may be surrounded by the first cover insulating layer 121. The side wall of the first conductive pillar 131 may electrically connect the chip pad 111 of the first semiconductor chip 110 to the first upper conductive layer 141 provided on an upper surface of the first cover insulating layer 121. The side wall of the first conductive pillar 131 may have a pillar shape. A lower surface of the first conductive pillar 131 may be in contact with the chip pad 111 of the first semiconductor chip 110, and an upper surface of the first conductive pillar 131 may be in contact with the first upper conductive layer 141.

In example embodiments, the first conductive pillar 131 may include the same material and/or material combination as the first upper conductive layer 141. In other example embodiments, the first conductive pillar 131 may include a different material and/or material combination from that of the first upper conductive layer 141.

In example embodiments, the upper surface of the first conductive pillar 131 and the upper surface of the first cover insulating layer 121 may be on the same plane. For example, the upper surface of the first conductive pillar 131 and the upper surface of the first cover insulating layer 121 may be on the same plane by being polished together by a planarization process such as a chemical mechanical polishing process.

In example embodiments, surface roughness of the upper surface of the first cover insulating layer 121 may be different from surface roughness of a side surface of the first cover insulating layer 121 and surface roughness of the surface of the second cover insulating layer 123 in contact with the upper surface of the first cover insulating layer 121.

In example embodiments, the surface roughness of the upper surface of the first cover insulating layer 121 may be greater than the surface roughness of the side surface of the first cover insulating layer 121. In example embodiments, the surface roughness of the upper surface of the first cover insulating layer 121 may be greater than surface roughness of the surface of the first cover insulating layer 121 in contact with the upper surface 113 of the first semiconductor chip 110. In example embodiments, the surface roughness of the upper surface of the first cover insulating layer 121 may be greater than surface roughness of the surface of the second cover insulating layer 123 in contact with the upper surface of the first cover insulating layer 121.

The first upper conductive layer 141 may be provided on the upper surface of the first cover insulating layer 121. The first upper conductive layer 141 may be in contact with and extend along the upper surface of the first cover insulating layer 121. The first upper conductive layer 141 may extend in parallel to the upper surface 113 of the first semiconductor chip 110. The first upper conductive layer 141 may be electrically connected to the chip pad 111 of the first semiconductor chip 110 through the first conductive pillar 131. In example embodiments, the first upper conductive layer 141 may include a line pattern extending in a line shape on the upper surface of the first cover insulating layer 121.

The first side conductive layer 143 may be provided on the side surface of the first cover insulating layer 121. The first side conductive layer 143 may be connected to the first upper conductive layer 141 and extend along the side surface of the first cover insulating layer 121. The first side conductive layer 143 may extend in parallel to the side surface 114 of the first semiconductor chip 110. The first side conductive layer 143 may extend downward from an upper end thereof connected to the first upper conductive layer 141. The first side conductive layer 143 may extend from an upper end to a lower end of the side surface of the first cover insulating layer 121. In example embodiments, a lower end of the first side conductive layer 143 and the lower end of the first cover insulating layer 121 may be on the same plane as the lower surface 115 of the first semiconductor chip 110. In example embodiments, a vertical height 143H of the first side conductive layer 143 may be greater than a vertical height 110H of the first semiconductor chip 110.

The second cover insulating layer 123 may cover the first upper conductive layer 141, the first side conductive layer 143, and the first cover insulating layer 121. A portion of the second cover insulating layer 123 may extend along the upper surface of the first cover insulating layer 121 to cover the first upper conductive layer 141. The other portion of the second cover insulating layer 123 may extend along the side surface of the first cover insulating layer 121 to cover the first side conductive layer 143. The second cover insulating layer 123 may include an upper surface extending in generally parallel to the upper surface 113 of the first semiconductor chip 110, and a side surface extending in generally parallel to the side surface 114 of the first semiconductor chip 110. In example embodiments, the upper surface and the side surface of the second cover insulating layer 123 may be exposed to the outside.

In example embodiments, a lower end of the second cover insulating layer 123 may be on the same plane as the lower end of the first side conductive layer 143, the lower end of the first cover insulating layer 121, and the lower surface 115 of the first semiconductor chip 110.

The first lower conductive layer 145 may be provided on the lower surface 115 of the first semiconductor chip 110. The first lower conductive layer 145 may be in contact with and extend along the lower surface 115 of the first semiconductor chip 110. The first lower conductive layer 145 may extend in parallel to the lower surface 115 of the first semiconductor chip 110. The first lower conductive layer 145 may further extend outward from an edge of the lower surface 115 of the first semiconductor chip 110 to be connected to the lower end of the first side conductive layer 143. In example embodiments, the first lower conductive layer 145 may include a line pattern extending in a line shape on the lower surface 115 of the first semiconductor chip 110.

The first lower insulating layer 125 may cover the lower surface 115 of the first semiconductor chip 110 and the first lower conductive layer 145. The first lower insulating layer 125 may cover the lower surface 115 of the first semiconductor chip 110 and cover the lower end of the first cover insulating layer 121 and the lower end of the second cover insulating layer 123, which are on the same plane as the lower surface 115 of the first semiconductor chip 110. In example embodiments, a footprint of the first lower insulating layer 125 may be the same as or similar to a footprint of the second cover insulating layer 123. That is, a plane area of the first lower insulating layer 125 may be the same as a plane area of the second cover insulating layer 123.

The first lower bump pad 151 may be connected to the first lower conductive layer 145 through an opening 125O of the first lower insulating layer 125. A portion of the first lower bump pad 151 may protrude from the first lower insulating layer 125. For example, the first lower bump pad 151 may be an under bump metal (UBM) layer.

The lower connection bump 161 may be provided on the first lower bump pad 151. In example embodiments, the lower connection bump 161 may generally have a ball shape attached to the first lower bump pad 151. For example, the lower connection bump 161 may be formed by placing a solder ball on the first lower bump pad 151 and then performing a reflow process on the solder ball. In other example embodiments, the lower connection bump 161 has a plate shape and may be formed to have a generally uniform thickness on the surface of the first lower bump pad 151.

In example embodiments, the first side conductive layer 143 may have a plate shape extending in generally parallel to the side surface 114 of the first semiconductor chip 110. For example, the first side conductive layer 143 may include a first side surface 1431 facing the side surface 114 of the first semiconductor chip 110, a second side surface 1432 that is opposite to the first side surface 1431, and an upper surface 1433 and a lower surface 1434 that are opposite to each other. Each of the first side surface 1431 and the second side surface 1432 of the first side conductive layer 143 may extend in parallel to the side surface 114 of the first semiconductor chip 110, which faces the first side conductive layer 143.

The first side conductive layer 143 may have a first horizontal width 143W in a second horizontal direction (e.g., the Y-axis direction) that is parallel to the side surface 114 of the first semiconductor chip 110, which faces the first side conductive layer 143. In example embodiments, the first side conductive layer 143 may extend in the vertical direction (e.g., the Z-axis direction) with a generally uniform width, i.e., the first horizontal width 143W. That is, a horizontal width at a lower part of the first side conductive layer 143 may be the same as a horizontal width at an upper part of the first side conductive layer 143.

In example embodiments, the first upper conductive layer 141 may be connected to the first side surface 1431 of the first side conductive layer 143 and have a line shape extending from the first side surface 1431 of the first side conductive layer 143. The first upper conductive layer 141 may be a line-shaped pattern extending with a second horizontal width 141W from the first side surface 1431 of the first side conductive layer 143. In this case, the first horizontal width 143W of the first side conductive layer 143 may be greater than the second horizontal width 141W of the first upper conductive layer 141. In example embodiments, when a contact region between the first upper conductive layer 141 and the first side conductive layer 143 is defined as a first contact region, a horizontal width of the first contact region in the second horizontal direction (e.g., the Y-axis direction) may be less than the first horizontal width 143W of the first side conductive layer 143. In example embodiments, the first horizontal width 143W of the first side conductive layer 143 may be about 150% to about 500%, about 200% to about 400%, or about 250% to about 300% of the horizontal width of the first contact region between the first upper conductive layer 141 and the first side conductive layer 143.

In example embodiments, the first lower conductive layer 145 may be connected to the lower surface 1434 of the first side conductive layer 143 and have a line shape extending from a part connected to the lower surface 1434 of the first side conductive layer 143. The first lower conductive layer 145 may be a line-shaped pattern extending with a third horizontal width 145W from the lower surface 1434 of the first side conductive layer 143. In this case, the first horizontal width 143W of the first side conductive layer 143 may be greater than the third horizontal width 145W of the first lower conductive layer 145. In example embodiments, when a contact region between the first lower conductive layer 145 and the first side conductive layer 143 is defined as a second contact region, a horizontal width of the second contact region in the second horizontal direction (e.g., the Y-axis direction) may be less than the first horizontal width 143W of the first side conductive layer 143. In example embodiments, the first horizontal width 143W of the first side conductive layer 143 may be about 150% to about 500%, about 200% to about 400%, or about 250% to about 300% of the horizontal width of the second contact region between the first lower conductive layer 145 and the first side conductive layer 143.

A footprint (or a plane area) of the semiconductor package 30 may be determined based on a distance 501 between the side surface 114 of the first semiconductor chip 110 and a side surface of the semiconductor package 30. The distance 501 between the side surface 114 of the first semiconductor chip 110 and the side surface of the semiconductor package 30 may indicate a distance between the side surface 114 of the first semiconductor chip 110 and an outer side surface 1231 of the second cover insulating layer 123 in a direction orthogonal to the side surface 114 of the first semiconductor chip 110, the outer side surface 1231 forming the side surface of the semiconductor package 30. In some example embodiments, the distance 501 between the side surface 114 of the first semiconductor chip 110 and the side surface of the semiconductor package 30 may be about 10 μm to about 80 μm.

In general, a connection between an upper wiring at an upper side of a semiconductor chip and a lower wiring at a lower side of the semiconductor chip is implemented by a conductive post extending in the vertical direction. The conductive post is formed by a separate process from a process of forming the upper wiring and a process of forming the lower wiring. In addition, the process of forming the conductive post generally includes a process of forming a via hole in an insulating material layer and a plating process of filling the via hole with a conductive material. With respect to the conductive post, to prevent insufficient filling of the via hole with the conductive material in the plating process, the via hole and the conductive post are generally formed with a large width of about tens to about hundreds micrometers, and a size of a semiconductor package also increases by an arrangement space of the conductive post.

According to example embodiments of the inventive concept, the first side conductive layer 143 that is an electrical connection structure between the first upper conductive layer 141 and the first lower conductive layer 145 may be formed together by the same redistribution process as that of the first upper conductive layer 141. Accordingly, a process of manufacturing the semiconductor package 30 may be simplified, and manufacturing costs may be reduced. Furthermore, the first side conductive layer 143 for an electrical connection between the first upper conductive layer 141 and the first lower conductive layer 145 is formed with a small thickness of about several micrometers, and the first cover insulating layer 121 and the second cover insulating layer 123 covering the first side conductive layer 143 are also formed with a small thickness of about several micrometers, and thus, a footprint of the semiconductor package 30 may be reduced, and the semiconductor package 30 having a small form factor may be implemented.

Figure 13:
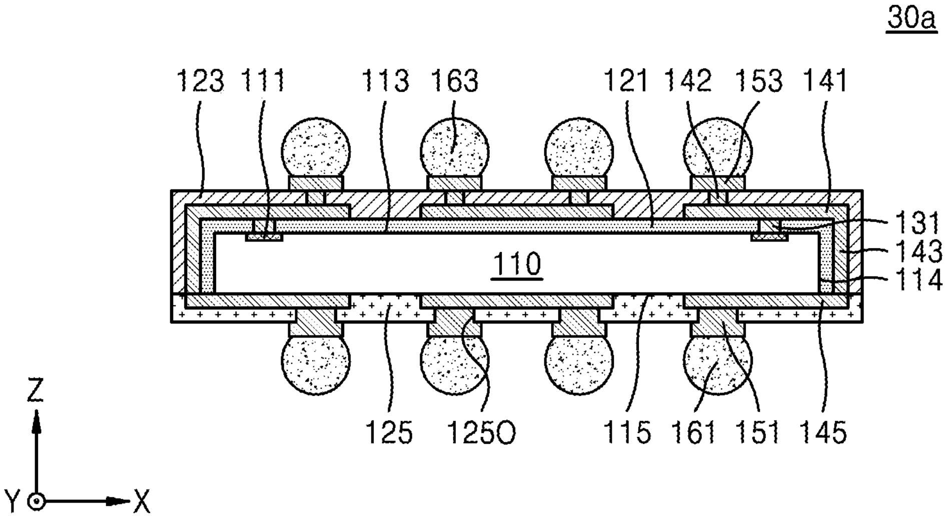
FIG. 13 is a cross-sectional view of a semiconductor package according to example embodiments of the inventive concept.

FIG. 13 is a cross-sectional view of a semiconductor package 30*a* according to example embodiments of the inventive concept. Hereinafter, a difference from the semiconductor package 30 described with reference to FIGS. 12A to 12C will be mainly described to describe the semiconductor package 30*a* shown in FIG. 13.

Referring to FIG. 13, the semiconductor package 30*a* may include a second conductive pillar 142 connected to the first upper conductive layer 141, an upper bump pad 153 connected to the second conductive pillar 142, and an upper connection bump 163 attached to the upper bump pad 153.

The second conductive pillar 142 may be provided on the first upper conductive layer 141. The second conductive pillar 142 may extend through the second cover insulating layer 123 and electrically connect the first upper conductive layer 141 to the upper bump pad 153. The second conductive pillar 142 may have a pillar shape. A lower surface of the second conductive pillar 142 may be in contact with the first upper conductive layer 141, and an upper surface of the second conductive pillar 142 may be in contact with the upper bump pad 153.

In example embodiments, the second conductive pillar 142 may include the same material and/or material combination as the first upper conductive layer 141. In other example embodiments, the second conductive pillar 142 may include a different material and/or material combination from that of the first upper conductive layer 141.

In example embodiments, the upper surface of the second conductive pillar 142 and the upper surface of the second cover insulating layer 123 may be on the same plane. For example, the upper surface of the second conductive pillar 142 and the upper surface of the second cover insulating layer 123 may be on the same plane by being polished together by a planarization process such as a chemical mechanical polishing process.

In example embodiments, surface roughness of the upper surface of the second cover insulating layer 123 may be different from surface roughness of the side surface of the second cover insulating layer 123 and surface roughness of the surface of the second cover insulating layer 123 in contact with the upper surface and the side surface of the first cover insulating layer 121. In example embodiments, the surface roughness of the upper surface of the second cover insulating layer 123 may be greater than the surface roughness of the side surface of the second cover insulating layer 123. In addition, the surface roughness of the upper surface of the second cover insulating layer 123 may be greater than surface roughness of the surface of the second cover insulating layer 123 in contact with the upper surface and the side surface of the first cover insulating layer 121.

The upper bump pad 153 may be provided on the upper surface of the second cover insulating layer 123 and electrically connected to the first upper conductive layer 141 through the second conductive pillar 142. For example, the upper bump pad 153 may be an under bump metal layer.

The upper connection bump 163 may be provided on the upper bump pad 153. The upper connection bump 163 may include, for example, solder, Sn, Ag, In, Bi, Sb, Cu, Zn, Pb, and/or an alloy thereof. In example embodiments, the upper connection bump 163 may generally have a ball shape attached to the upper bump pad 153. For example, the upper connection bump 163 may be formed by placing a solder ball on the upper bump pad 153 and then performing a reflow process on the solder ball. In other example embodiments, the upper connection bump 163 has a plate shape and may be formed to have a generally uniform thickness on the surface of the upper bump pad 153.

The semiconductor package 30*a* may be connected through the lower connection bump 161 to another semiconductor package or an electronic device arranged under the semiconductor package 30*a* and also connected through the upper connection bump 163 to another semiconductor package or an electronic device arranged above the semiconductor package 30*a*.

Figure 14A:
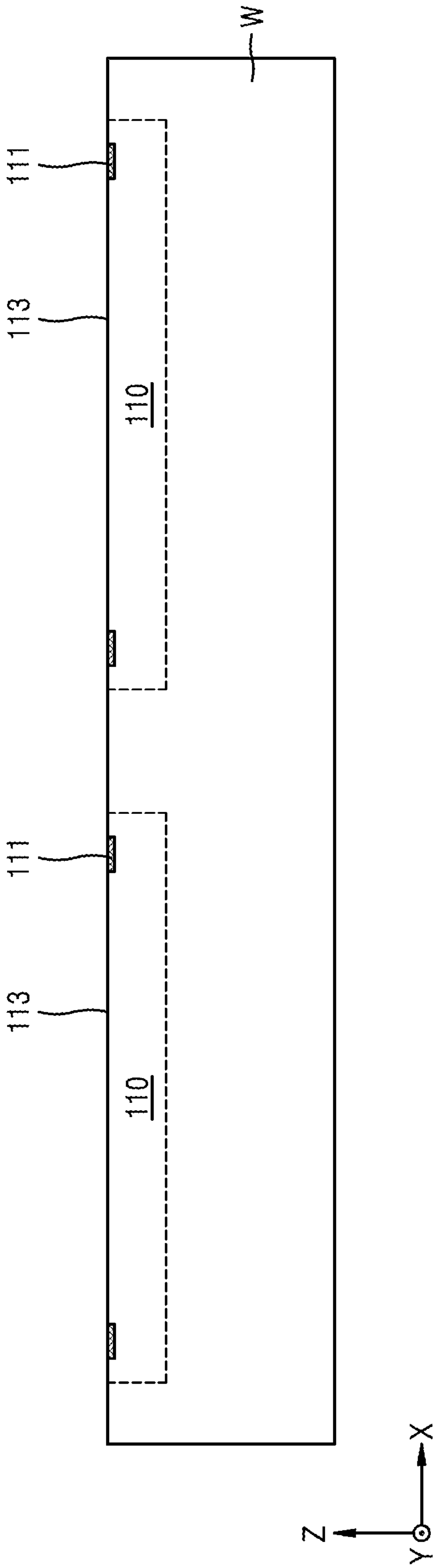
FIGS. 14A to 14P are cross-sectional views of the semiconductor package shown in FIG. 13.
Figure 14B:
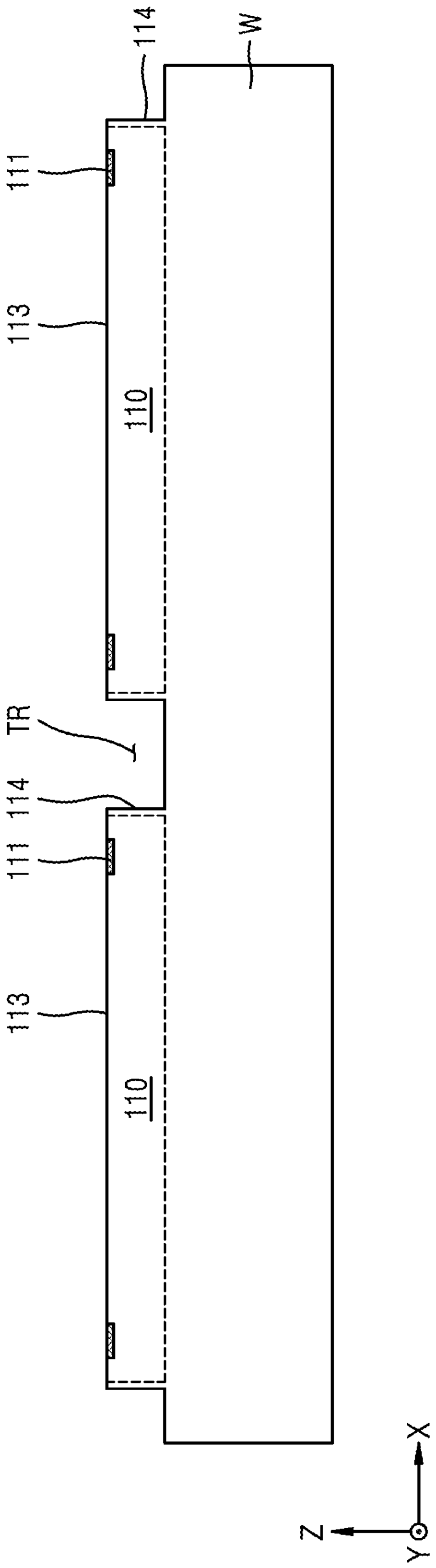
Figure 14C:
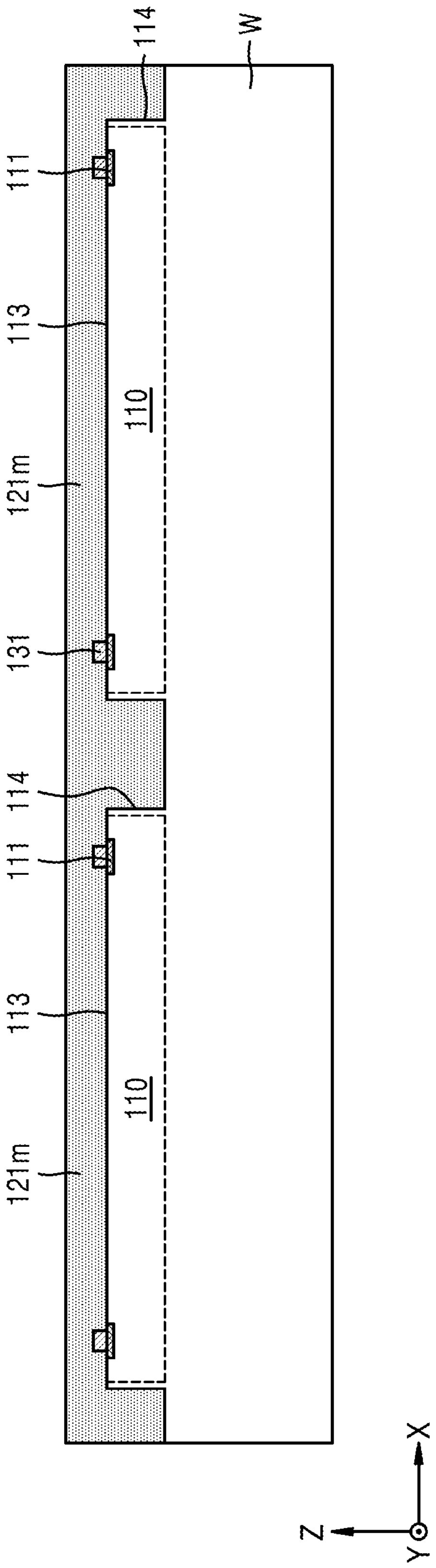
Figure 14D:
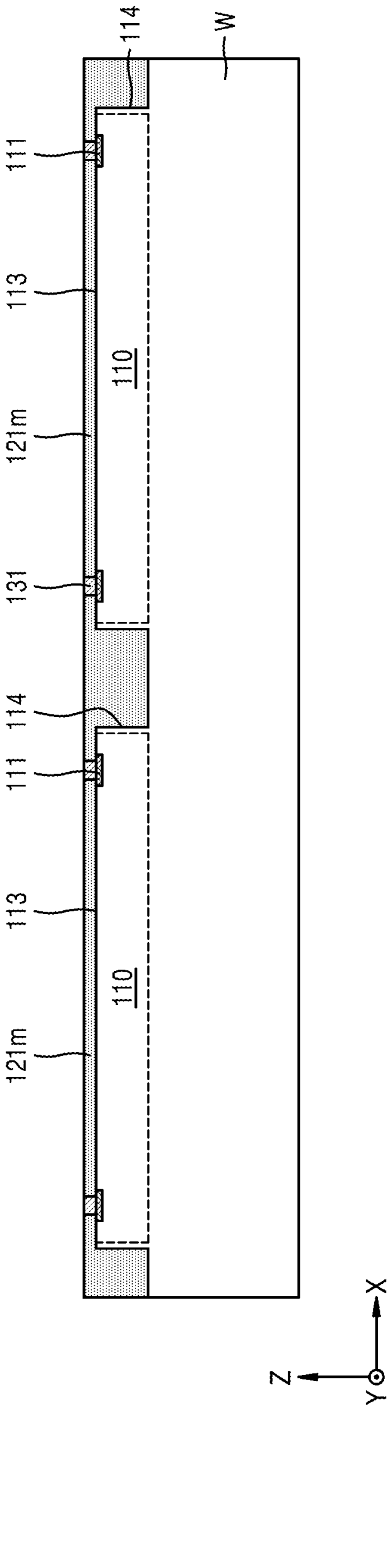
Figure 14E:
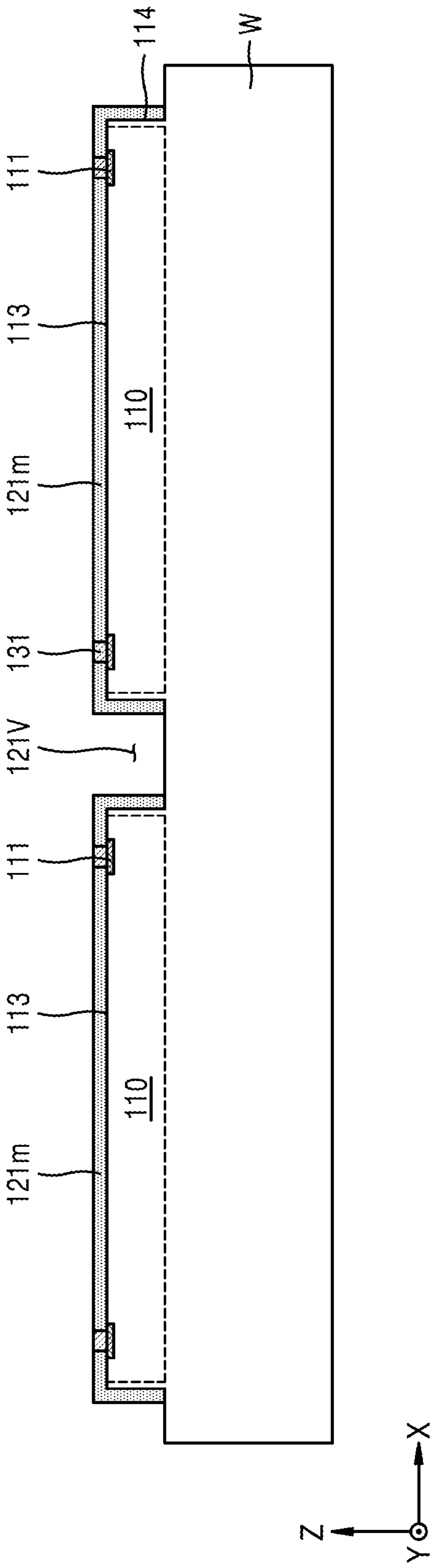
Figure 14F:
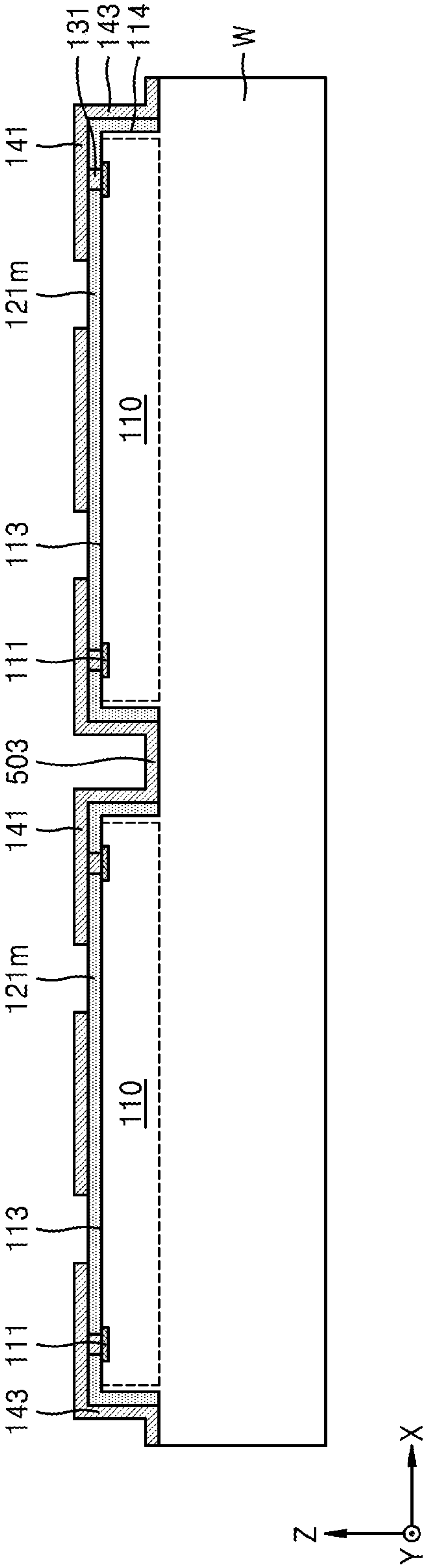
Figure 14G:
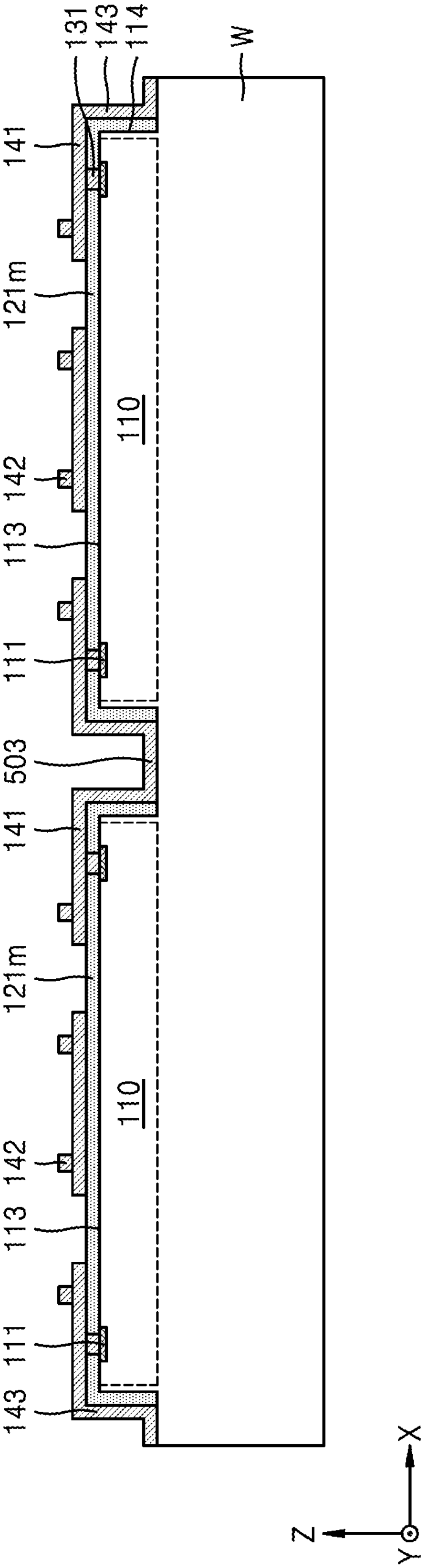
Figure 14H:
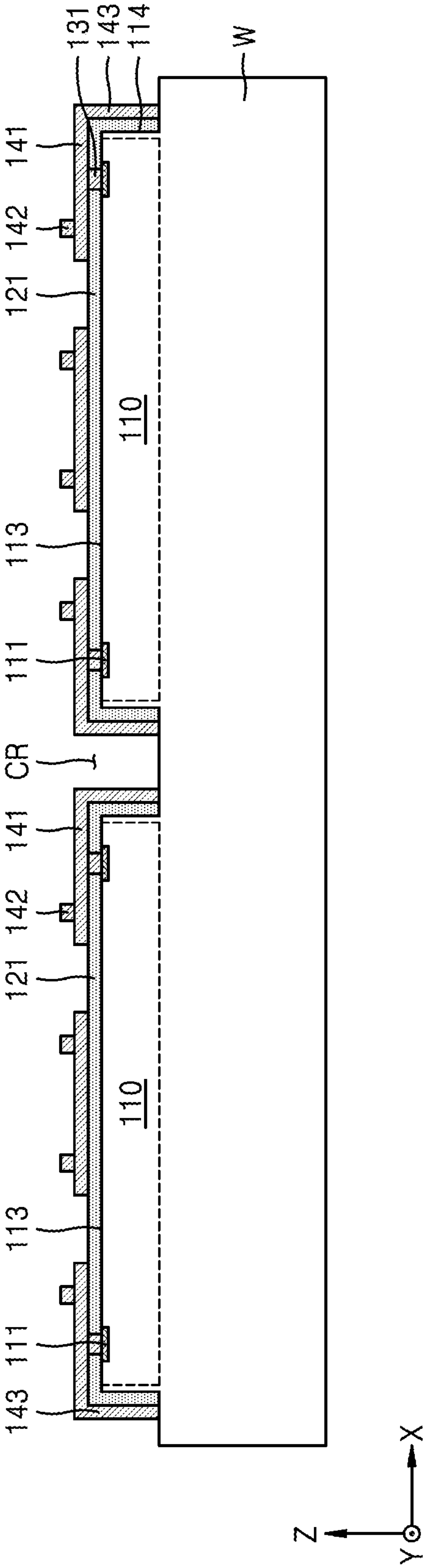
Figure 14I:
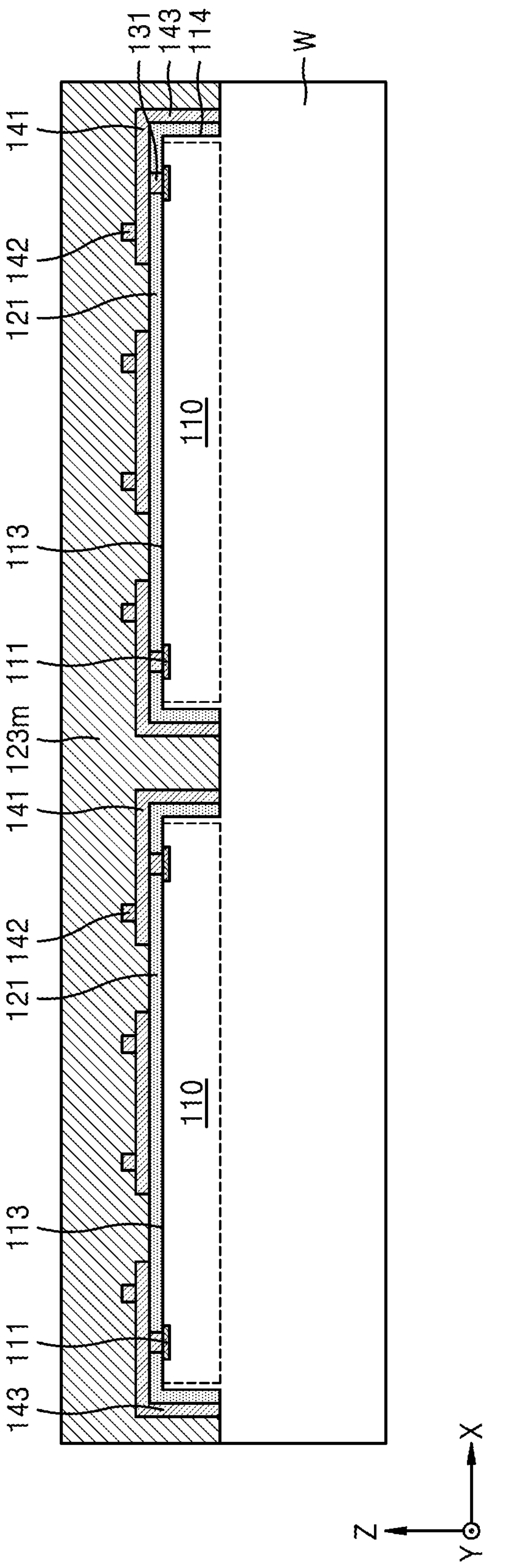
Figure 14J:
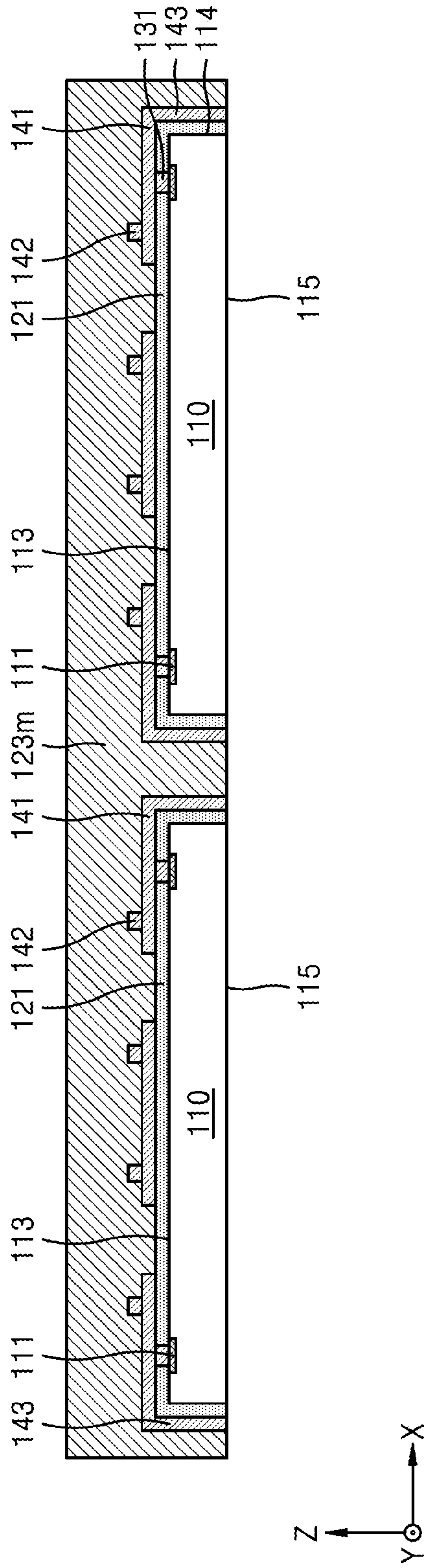
Figure 14K:
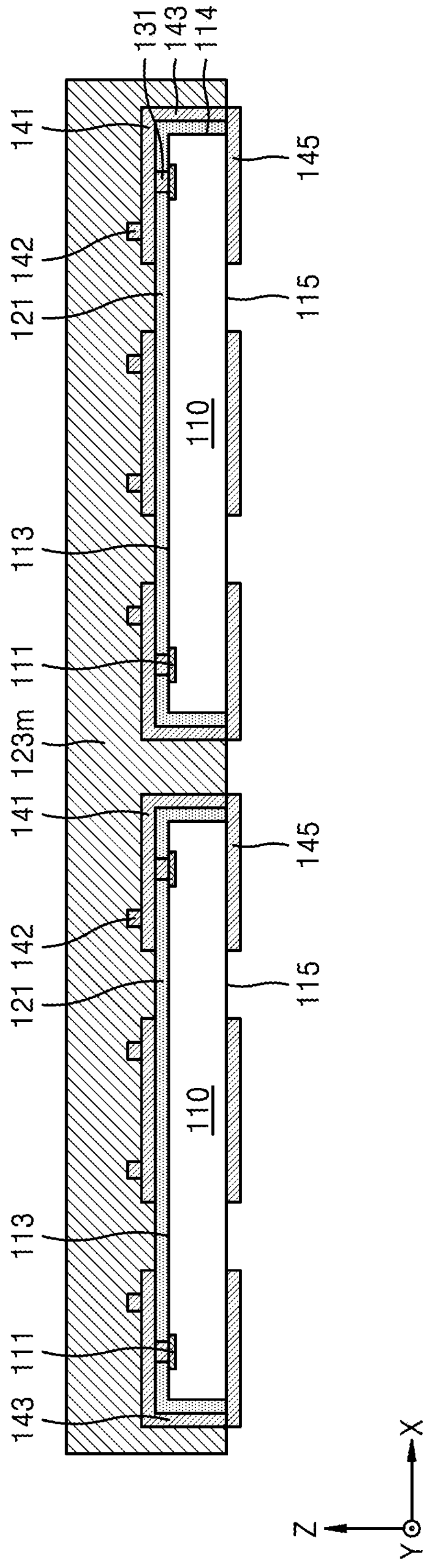
Figure 14L:
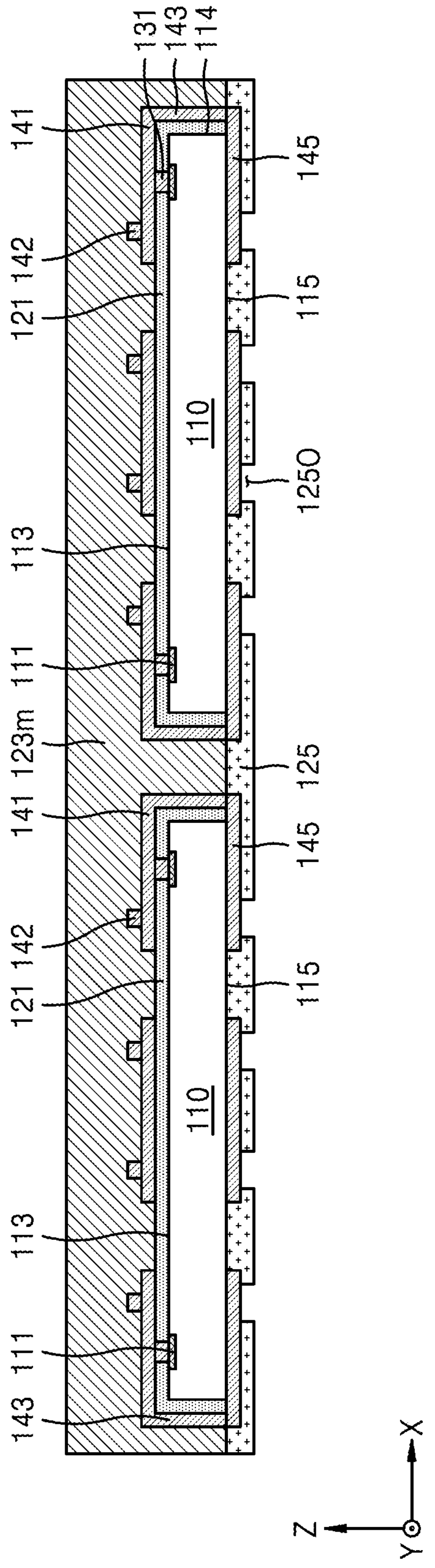
Figure 14M:
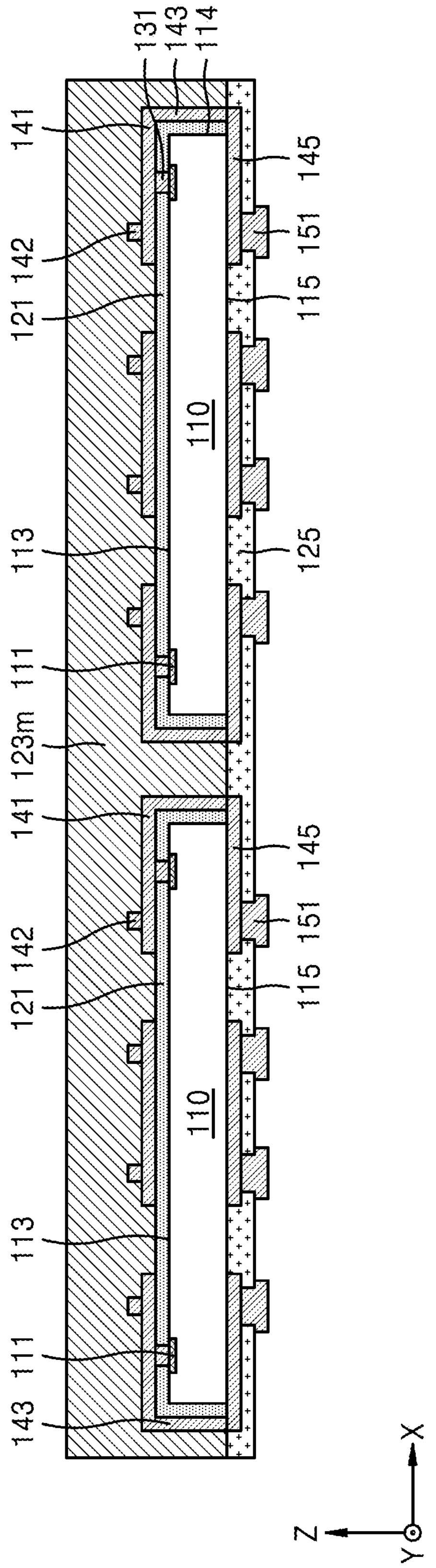
Figure 14N:
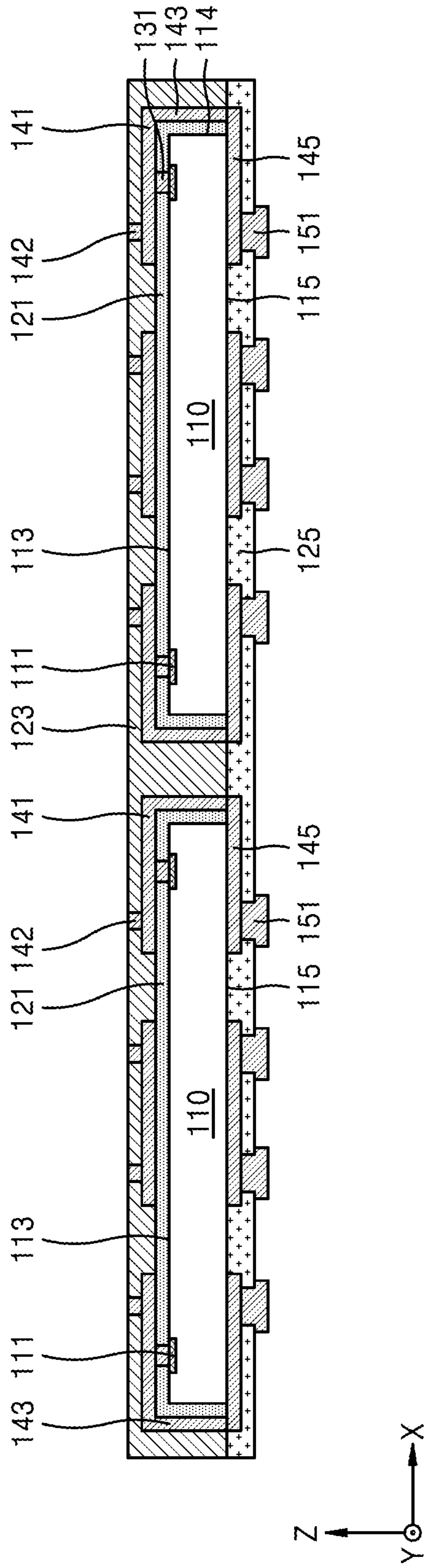
Figure 140:
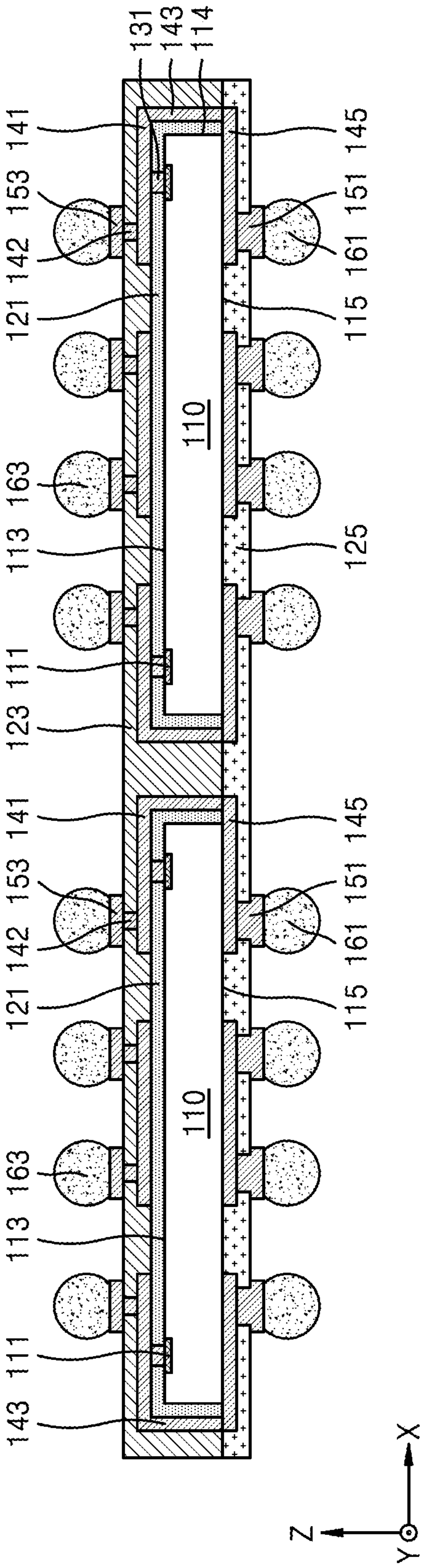
Figure 14P:
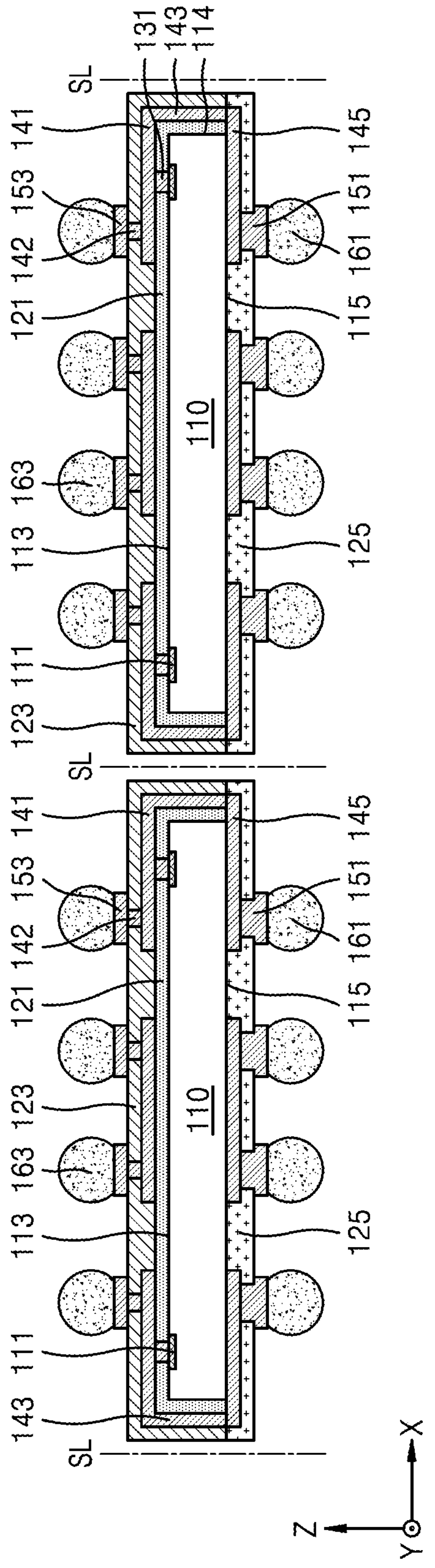
Figure 15A:
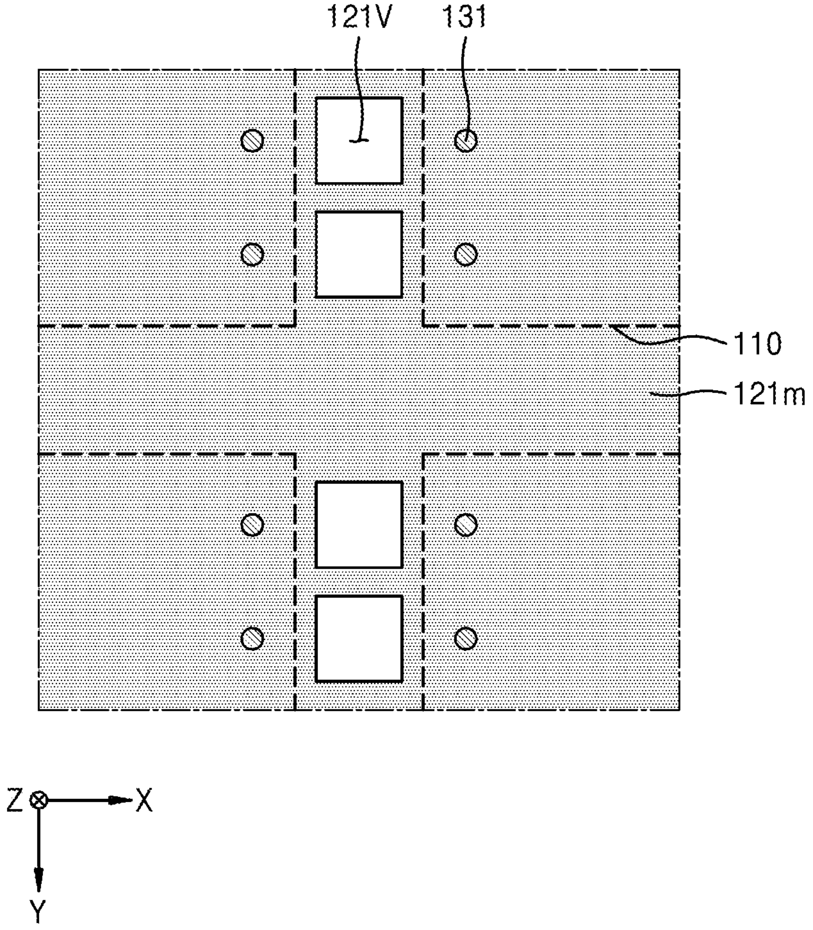
FIG. 15A is a top view of a portion of a structure shown in FIG. 14E.
Figure 15B:
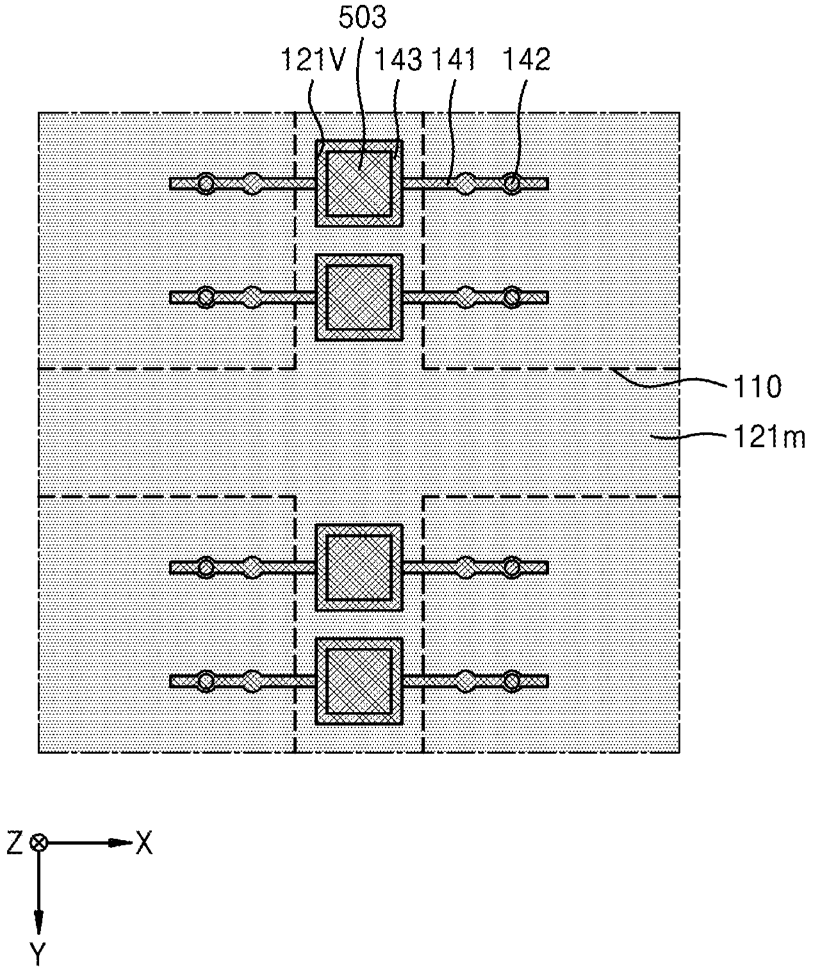
FIG. 15B is a top view of a portion of a structure shown in FIG. 14F.
Figure 15C:
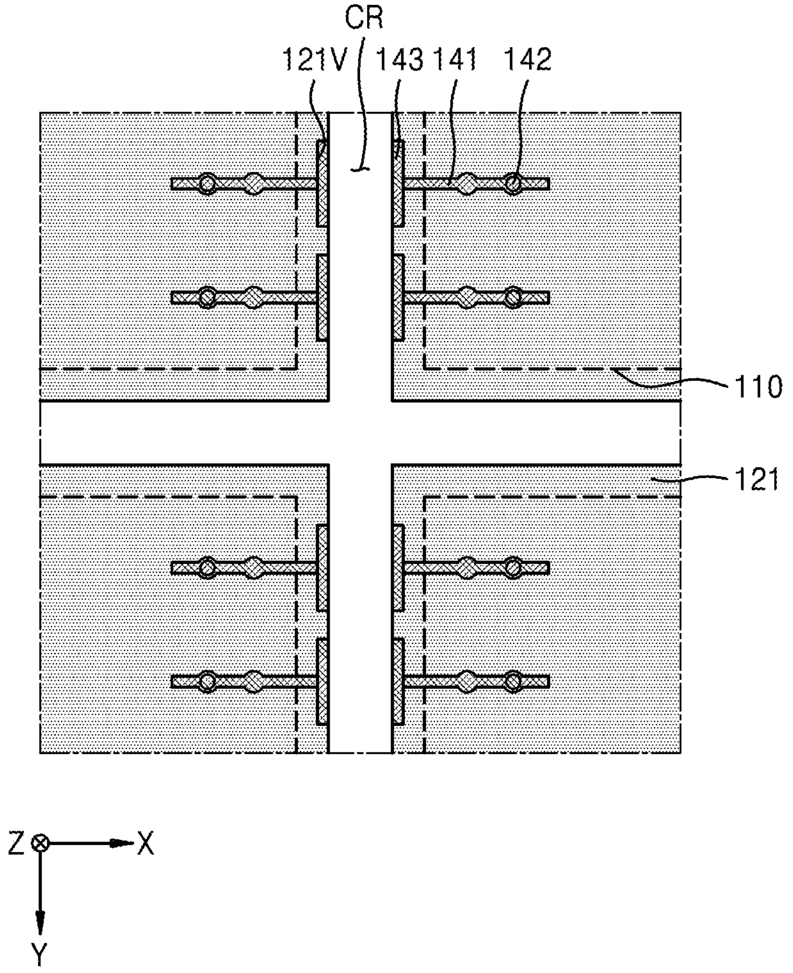
FIG. 15C is a top view of a portion of a structure shown in FIG. 14H.

FIGS. 14A to 14P are cross-sectional views of the semiconductor package 30*a* shown in FIG. 13. FIG. 15A is a top view of a portion of a structure shown in FIG. 14E, FIG. 15B is a top view of a portion of a structure shown in FIG. 14F, and FIG. 15C is a top view of a portion of a structure shown in FIG. 14H. Hereinafter, a method of manufacturing the semiconductor package 30*a* shown in FIG. 13 will be described with reference to FIGS. 14A to 14P and 15A to 15C.

Referring to FIG. 14A, a wafer Won which a plurality of integrated circuits forming a plurality of first semiconductor chips 110 are formed is prepared.

Referring to FIG. 14B, a trench TR is formed between the plurality of first semiconductor chips 110 by removing a portion of the wafer W. The trench TR is a space recessed from an upper side of the wafer W and may be formed by removing a portion of the wafer W. By forming the trench TR between the plurality of first semiconductor chips 110, a side surface of each of the plurality of first semiconductor chips 110 may be exposed. In a plan view, the plurality of first semiconductor chips 110 may be separated from each other by the trench TR.

Referring to FIGS. 14B and 14C, the first conductive pillar 131 is formed on the chip pad 111 of the first semiconductor chip 110, and a first insulating material layer 121*m* covering the wafer W is formed. The first insulating material layer 121*m* may cover upper surfaces of the plurality of first semiconductor chips 110 and the first conductive pillar 131 and fill in the trench TR formed between the plurality of first semiconductor chips 110.

Referring to FIGS. 14C and 14D, the first cover insulating layer 121 through which the first conductive pillar 131 is exposed is formed by removing a portion of the first insulating material layer 121*m*. By removing a portion of the first insulating material layer 121*m*, the upper surface of the first conductive pillar 131 may be exposed. In example embodiments, to remove a portion of the first insulating material layer 121*m*, an etch back process or a polishing process such as chemical and mechanical polishing may be performed.

In example embodiments, the upper surface of the first cover insulating layer 121 treated by the etch back or polishing process on the first insulating material layer 121*m* may have relatively large surface roughness. For example, the surface roughness of the upper surface of the first cover insulating layer 121 may be greater than surface roughness of the surface of the first cover insulating layer 121 in contact with the wafer W. According to an increase in the surface roughness of the upper surface of the first cover insulating layer 121, an adhesive strength between the first upper conductive layer (141 of FIG. 12A) and the first cover insulating layer 121 may increase.

Referring to FIGS. 14E and 15A, a first hole 121V may be formed in the first insulating material layer 121*m* by removing a portion of the first insulating material layer 121*m* filled in the trench TR. The first hole 121V may pass through the first insulating material layer 121*m* filled in the trench TR so that a portion of the wafer W is exposed through the first hole 121V.

Referring to FIGS. 14F and 15B, the first upper conductive layer 141, the first side conductive layer 143, and a conductive layer 503 that covers the surface of the wafer W exposed through the first hole (121V of FIG. 14E) may be formed. The first upper conductive layer 141, the first side conductive layer 143, and the conductive layer 503 may be formed together by the same metal interconnect process.

Referring to FIG. 14G, the second conductive pillar 142 is formed on the first upper conductive layer 141.

Referring to FIGS. 14H, 14G, and 15C, a cutting process of forming a cutting region CR between the plurality of first semiconductor chips 110 is performed. The cutting region CR may be formed by removing a portion of each of material layers filled in the trench (TR of FIG. 14B) of the wafer W. The cutting process may include cutting using a cutting blade, cutting using a laser, or the like. The cutting region CR may be formed by removing a portion of the first insulating material layer 121*m* between the plurality of first semiconductor chips 110 and removing the conductive layer 503 covering the surface of the wafer W. The surface of the wafer W may be exposed through the cutting region CR. The cutting process may be performed to remove the conductive layer 503 covering the surface of the wafer W but not to remove the first side conductive layer 143 on a side wall of the first hole 121V. After the cutting process, a portion of the remaining first insulating material layer 121*m* may form the first cover insulating layer 121.

Referring to FIG. 14I, a second preliminary cover insulating layer 123*m* covering the result of FIG. 14H is formed. The second preliminary cover insulating layer 123*m* may cover the first cover insulating layer 121, the first upper conductive layer 141, the second conductive pillar 142, and the first side conductive layer 143 and fill in the cutting region CR to cover the surface of the wafer W exposed through the cutting region CR.

Referring to FIGS. 14I and 14J, a portion of the wafer W may be removed by performing a polishing process from a lower surface of the wafer W. The polishing process may be performed until the first side conductive layer 143 and the second preliminary cover insulating layer 123*m* are exposed. The polishing process may include chemical mechanical polishing, a grinding process, and the like. Through the polishing process, the lower surface 115 of the first semiconductor chip 110 may be planarized. The surface of the second preliminary cover insulating layer 123*m* and the surface of the first cover insulating layer 121, which are exposed through the polishing process, may be on the same plane as the lower surface 115 of the first semiconductor chip 110.

Referring to FIG. 14K, the first lower conductive layer 145 is formed on a lower surface of the result of FIG. 14J. The first lower conductive layer 145 may be connected to the first side conductive layer 143 and extend along the lower surface 115 of the first semiconductor chip 110.

Referring to FIG. 14L, the first lower insulating layer 125 covering a lower surface of the result of FIG. 14K is formed. An insulating material layer covering the lower surface of the result of FIG. 14K may be formed to form the first lower insulating layer 125, and the opening 125O through which a portion of the first lower conductive layer 145 is exposed may be formed by removing a portion of the insulating material layer.

Referring to FIGS. 14L and 14M, the first lower bump pad 151 connected to the portion of the first lower conductive layer 145 exposed through the opening 125O of the first lower insulating layer 125 is formed, and the lower connection bump 161 is formed on the first lower bump pad 151.

Referring to FIGS. 14M and 14N, the second cover insulating layer 123 through which the second conductive pillar 142 is exposed is formed by removing a portion of the second preliminary cover insulating layer 123*m*. By removing a portion of the second preliminary cover insulating layer 123*m*, the upper surface of the second conductive pillar 142 may be exposed. In example embodiments, to remove a portion of the second preliminary cover insulating layer 123*m*, an etch back process or a polishing process such as chemical and mechanical polishing may be performed.

In example embodiments, the upper surface of the second cover insulating layer 123 treated by the etch back or polishing process on the second preliminary cover insulating layer 123*m* may have relatively large surface roughness. For example, the surface roughness of the upper surface of the second cover insulating layer 123 may be greater than the surface roughness of the surface of the second cover insulating layer 123 in contact with the first cover insulating layer 121 and the surface roughness of the side surface of the second cover insulating layer 123. According to an increase in the surface roughness of the upper surface of the second cover insulating layer 123, an adhesive strength between the upper bump pad 153 to be formed by a subsequent process and the second cover insulating layer 123 may increase.

Referring to FIG. 14O, the upper bump pad 153 connected to the second conductive pillar 142, the upper connection bump 163 on the upper bump pad 153, and the lower connection bump 161 on the first lower bump pad 151 are formed.

Referring to FIG. 14P, a sawing process on the result of FIG. 14O is performed. That is, a structure manufactured in a wafer level may be cut along a scribe lane SL to divide the structure manufactured in the wafer level into individual units of semiconductor packages 10.

Figure 16:
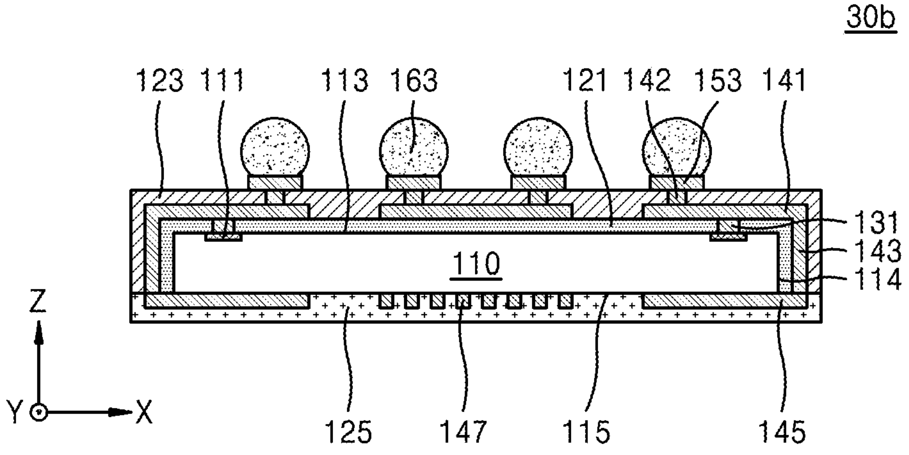
FIG. 16 is a cross-sectional view of a semiconductor package according to example embodiments of the inventive concept.

FIG. 16 is a cross-sectional view of a semiconductor package 30*b* according to example embodiments of the inventive concept. Hereinafter, a difference from the semiconductor package 30*a* described with reference to FIG. 13 will be mainly described to describe the semiconductor package 30*b* shown in FIG. 16.

Referring to FIG. 16, the semiconductor package 30*b* may include an inductor pattern 147 on the lower surface 115 of the first semiconductor chip 110. The inductor pattern 147 may be in contact with the lower surface 115 of the first semiconductor chip 110 and be covered by the first lower insulating layer 125. The inductor pattern 147 may be formed together with the first lower conductive layer 145 during a metal interconnect process for forming the first lower conductive layer 145. The inductor pattern 147 may include the same material and/or material combination as the first lower conductive layer 145.

Figure 17:
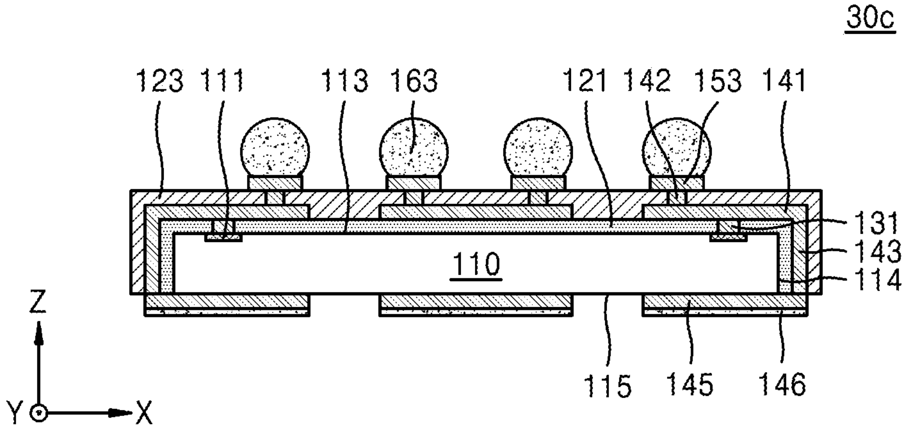
FIG. 17 is a cross-sectional view of a semiconductor package according to example embodiments of the inventive concept.

FIG. 17 is a cross-sectional view of a semiconductor package 30*c* according to example embodiments of the inventive concept. Hereinafter, a difference from the semiconductor package 30 described with reference to FIGS. 12A to 12C will be mainly described to describe the semiconductor package 30*c* shown in FIG. 17.

Referring to FIG. 17, the first lower conductive layer 145 of the semiconductor package 30*c* may include a lead pattern functioning as an external pad. The lead pattern may have, for example, a polygonal shape such as a circular or quadrangular shape in a plan view. In example embodiments, the first lower insulating layer (125 of FIG. 12A) may be omitted, and the first lower conductive layer 145 may be exposed to the outside. In example embodiments, a conductive adhesive layer 146 may be further arranged on the surface of the first lower conductive layer 145. The conductive adhesive layer 146 may be formed to cover a lower surface of the first lower conductive layer 145. The conductive adhesive layer 146 may be formed by, for example, a plating method. The conductive adhesive layer 146 may include, for example, solder, Sn, Ag, In, Bi, Sb, Cu, Zn, Pb, and/or an alloy thereof.

Figure 18:
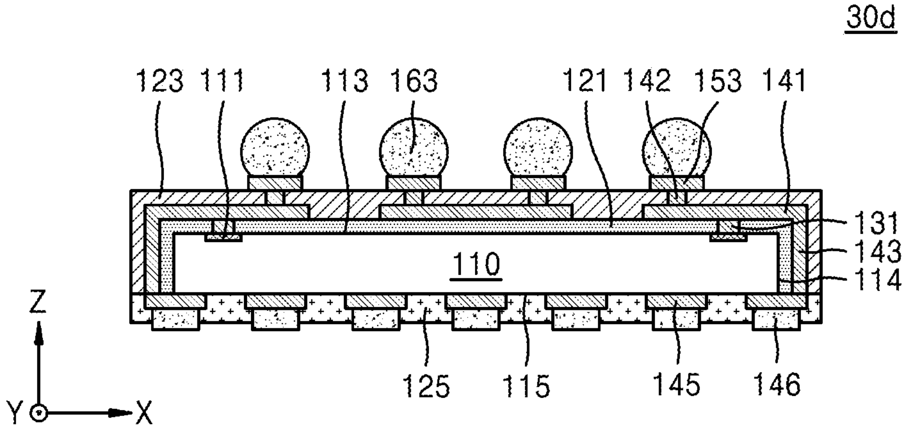
FIG. 18 is a cross-sectional view of a semiconductor package according to example embodiments of the inventive concept.

FIG. 18 is a cross-sectional view of a semiconductor package 30*d* according to example embodiments of the inventive concept. Hereinafter, a difference from the semiconductor package 30*c* described with reference to FIG. 17 will be mainly described to describe the semiconductor package 30*d* shown in FIG. 18.

Referring to FIG. 18, the semiconductor package 30*d* may include the first lower insulating layer 125 provided on the lower surface 115 of the first semiconductor chip 110. The first lower insulating layer 125 may cover the first lower conductive layer 145 including the lead pattern and cover at least a portion of a side surface of the conductive adhesive layer 146. The first lower insulating layer 125 may not cover a lower surface of the conductive adhesive layer 146 so that the lower surface of the conductive adhesive layer 146 is exposed to the outside.

Figure 19:
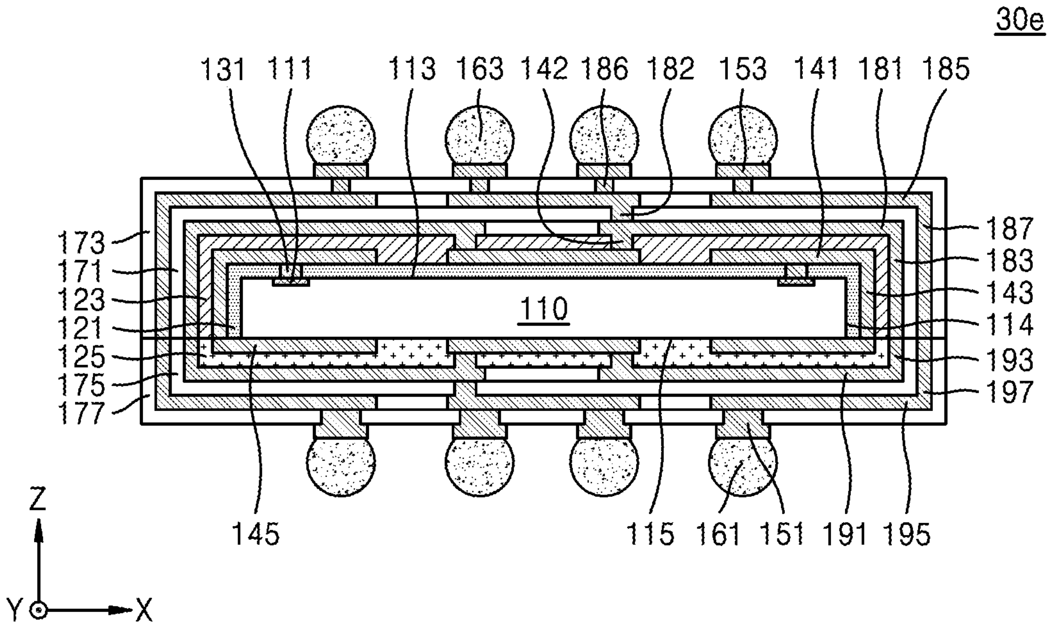
FIG. 19 is a cross-sectional view of a semiconductor package according to example embodiments of the inventive concept.

FIG. 19 is a cross-sectional view of a semiconductor package 30*e* according to example embodiments of the inventive concept. Hereinafter, a difference from the semiconductor package 30 described with reference to FIGS. 12A to 12C will be mainly described to describe the semiconductor package 30*e* shown in FIG. 19.

Referring to FIG. 19, the semiconductor package 30*e* may include the first semiconductor chip 110, the first cover insulating layer 121, the first upper conductive layer 141, the second conductive pillar 142, the first side conductive layer

143, the second cover insulating layer 123, a second upper conductive layer 181, a third conductive pillar 182, a second upper side conductive layer 183, a third cover insulating layer 171, a third upper conductive layer 185, a fourth conductive pillar 186, a third upper side conductive layer 187, a fourth cover insulating layer 173, the first lower conductive layer 145, the first lower insulating layer 125, a second lower conductive layer 191, a second lower side conductive layer 193, a second lower insulating layer 175, a third lower conductive layer 195, a third lower side conductive layer 197, a third lower insulating layer 177, the first lower bump pad 151, and the lower connection bump 161.

The second upper conductive layer 181 may be provided on the upper surface of the second cover insulating layer 123. The second upper conductive layer 181 may be in contact with and extend along the upper surface of the second cover insulating layer 123. The second upper conductive layer 181 may be connected to the first upper conductive layer 141 through the opening of the second cover insulating layer 123. In example embodiments, the second upper conductive layer 181 may include a line pattern extending in a line shape on the upper surface of the second cover insulating layer 123.

The third conductive pillar 182 may be provided on the second upper conductive layer 181. The third conductive pillar 182 may extend through the third cover insulating layer 171 and electrically connect the second upper conductive layer 181 to the third upper conductive layer 185. The third conductive pillar 182 may have a pillar shape. A lower surface of the third conductive pillar 182 may be in contact with the second upper conductive layer 181, and an upper surface of the third conductive pillar 182 may be in contact with the third upper conductive layer 185.

The second upper side conductive layer 183 may be provided on the side surface of the second cover insulating layer 123. The second upper side conductive layer 183 may be connected to the second upper conductive layer 181 and extend along the side surface of the second cover insulating layer 123. The second upper side conductive layer 183 may extend downward from an upper end thereof connected to the second upper conductive layer 181. The second upper side conductive layer 183 may extend from an upper end to a lower end of the side surface of the second cover insulating layer 123. In example embodiments, a lower end of the second upper side conductive layer 183 and the lower end of the second cover insulating layer 123 may be on the same plane as the lower surface 115 of the first semiconductor chip 110. In example embodiments, the second upper side conductive layer 183 may have a plate shape extending in parallel to the side surface 114 of the first semiconductor chip 110, which faces the second upper side conductive layer 183.

The third cover insulating layer 171 may cover the second upper conductive layer 181, the second upper side conductive layer 183, and the second cover insulating layer 123. A portion of the third cover insulating layer 171 may extend along the upper surface of the second cover insulating layer 123 to cover the second upper conductive layer 181. The other portion of the third cover insulating layer 171 may extend along the side surface of the second cover insulating layer 123 to cover the second upper side conductive layer 183.

The third upper conductive layer 185 may be provided on an upper surface of the third cover insulating layer 171. The third upper conductive layer 185 may be in contact with and extend along the upper surface of the third cover insulating layer 171. The third upper conductive layer 185 may be connected to the second upper conductive layer 181 through an opening of the third cover insulating layer 171. In example embodiments, the third upper conductive layer 185 may include a line pattern extending in a line shape on the upper surface of the third cover insulating layer 171.

The fourth conductive pillar 186 may be provided on the third upper conductive layer 185. The fourth conductive pillar 186 may extend through the fourth cover insulating layer 173 and electrically connect the third upper conductive layer 185 to the upper bump pad 153. The fourth conductive pillar 186 may have a pillar shape. A lower surface of the fourth conductive pillar 186 may be in contact with the third upper conductive layer 185, and an upper surface of the fourth conductive pillar 186 may be in contact with the upper bump pad 153.

The third upper side conductive layer 187 may be provided on a side surface of the third cover insulating layer 171. The third upper side conductive layer 187 may be connected to the third upper conductive layer 185 and extend along the side surface of the third cover insulating layer 171. The third upper side conductive layer 187 may extend downward from an upper end thereof connected to the third upper conductive layer 185. The third upper side conductive layer 187 may extend from an upper end to a lower end of the side surface of the third cover insulating layer 171. In example embodiments, a lower end of the third upper side conductive layer 187 and the lower end of the third cover insulating layer 171 may be on the same plane as the lower surface 115 of the first semiconductor chip 110. In example embodiments, the third upper side conductive layer 187 may have a plate shape extending in parallel to the side surface 114 of the first semiconductor chip 110, which faces the third upper side conductive layer 187.

The fourth cover insulating layer 173 may cover the third upper conductive layer 185, the third upper side conductive layer 187, and the third cover insulating layer 171. A portion of the fourth cover insulating layer 173 may extend along the upper surface of the third cover insulating layer 171 to cover the third upper conductive layer 185. The other portion of the fourth cover insulating layer 173 may extend along the side surface of the third cover insulating layer 171 to cover the third upper side conductive layer 187. In example embodiments, the fourth cover insulating layer 173 located at the outermost position among the first to fourth cover insulating layers 121, 123, 171, and 173 may include a molding material such as an EMC, and the remaining first to third cover insulating layers 121, 123, and 171 may include polyimide.

The second lower conductive layer 191 may be provided on a lower surface of the first lower insulating layer 125. The second lower conductive layer 191 may be in contact with and extend along the lower surface of the first lower insulating layer 125. The second lower conductive layer 191 may be connected to the first lower conductive layer 145 through an opening of the first lower insulating layer 125. In example embodiments, the second lower conductive layer 191 may include a line pattern extending in a line shape on the lower surface of the first lower insulating layer 125.

The second lower side conductive layer 193 may be provided on a side surface of the first lower insulating layer 125. The second lower side conductive layer 193 may electrically connect the second lower conductive layer 191 to the second upper side conductive layer 183. The second lower side conductive layer 193 may extend along the side surface of the first lower insulating layer 125. The second lower side conductive layer 193 may extend in the vertical direction (e.g., the Z-axis direction) from an upper end thereof connected to the second upper side conductive layer 183 to a lower end thereof connected to the second lower conductive layer 191. The second lower side conductive layer 193 may extend from an upper end to a lower end of the side surface of the first lower insulating layer 125. In example embodiments, the second lower side conductive layer 193 may have a plate shape extending in the vertical direction (e.g., the Z-axis direction) and have a horizontal width similar to that of the second upper side conductive layer 183.

The second lower insulating layer 175 may cover the second lower conductive layer 191, the second lower side conductive layer 193, and the first lower insulating layer 125. A portion of the second lower insulating layer 175 may extend along the lower surface of the first lower insulating layer 125 to cover the second lower conductive layer 191. The other portion of the second lower insulating layer 175 may extend along the side surface of the first lower insulating layer 125 to cover the second lower side conductive layer 193.

The third lower conductive layer 195 may be provided on a lower surface of the second lower insulating layer 175. The third lower conductive layer 195 may be in contact with and extend along the lower surface of the second lower insulating layer 175. The third lower conductive layer 195 may be connected to the second lower conductive layer 191 through an opening of the second lower insulating layer 175. In example embodiments, the third lower conductive layer 195 may include a line pattern extending in a line shape on the lower surface of the second lower insulating layer 175.

The third lower side conductive layer 197 may be provided on a side surface of the second lower insulating layer 175. The third lower side conductive layer 197 may electrically connect the third lower conductive layer 195 to the third upper side conductive layer 187. The third lower side conductive layer 197 may extend along the side surface of the second lower insulating layer 175. The third lower side conductive layer 197 may extend in the vertical direction (e.g., the Z-axis direction) from an upper end thereof connected to the third upper side conductive layer 187 to a lower end thereof connected to the third lower conductive layer 195. The third lower side conductive layer 197 may extend from an upper end to a lower end of the side surface of the second lower insulating layer 175. In example embodiments, the third lower side conductive layer 197 may have a plate shape extending in the vertical direction (e.g., the Z-axis direction) and have a horizontal width similar to that of the third upper side conductive layer 187.

The third lower insulating layer 177 may cover the third lower conductive layer 195, the third lower side conductive layer 197, and the second lower insulating layer 175. A portion of the third lower insulating layer 177 may extend along the lower surface of the second lower insulating layer 175 to cover the third lower conductive layer 195. The other portion of the third lower insulating layer 177 may extend along the side surface of the second lower insulating layer 175 to cover the third lower side conductive layer 197. In example embodiments, the third lower insulating layer 177 located at the outermost position among the first to third lower insulating layers 125, 175, and 177 may include a molding material such as an EMC, and the remaining first and second lower insulating layers 125 and 175 may include polyimide.

Although FIG. 19 shows that the semiconductor package 30*e* includes the first to third upper conductive layers 141, 181, and 185 forming three layers on the upper surface 113 of the first semiconductor chip 110, two or more conductive layers may be provided on the upper surface 113 of the first semiconductor chip 110. In other words, the semiconductor package 30*e* may further include an upper conductive structure having a single-layer or multi-layer structure in addition to the first upper conductive layer 141. When the upper conductive structure has the multi-layer structure, a plurality of conductive layers separated from each other in a direction orthogonal to the upper surface 113 of the first semiconductor chip 110 and extending in generally parallel to the upper surface 113 of the first semiconductor chip 110, and a conductive pillar electrically connecting between the plurality of conductive layers may be included. In the embodiment of FIG. 19, the second and third upper conductive layers 181 and 185 and the third and fourth conductive pillars 182 and 186 may form the upper conductive structure.

In addition, the semiconductor package 30*e* may include conductive layers provided on the side surface 114 of the first semiconductor chip 110 and forming two or more layers. In other words, the semiconductor package 30*e* may further include a side conductive structure having a single-layer or multi-layer structure in addition to the first side conductive layer 143. When the side conductive structure has the multi-layer structure, a plurality of conductive layers separated from each other in a direction orthogonal to the side surface 114 of the first semiconductor chip 110 and extending in generally parallel to the side surface 114 of the first semiconductor chip 110 may be included. In the embodiment of FIG. 19, the second and third upper side conductive layers 183 and 187 may form the side conductive structure.

In addition, the semiconductor package 30*e* may further include a cover insulating structure provided on the second cover insulating layer 123 and covering the upper conductive structure and the side conductive structure. The cover insulating structure may include a single insulating layer or multiple insulating layers provided on the second cover insulating layer 123. When the cover insulating structure has a multi-layer structure, each of insulating layers included in the cover insulating structure may extend along the upper surface 113 and the side surface 114 of the first semiconductor chip 110. In the embodiment of FIG. 19, the third and fourth cover insulating layers 171 and 173 may form the cover insulating structure.

In addition, the semiconductor package 30*e* may include conductive layers provided on the lower surface 115 of the first semiconductor chip 110 and forming two or more layers. In other words, the semiconductor package 30*e* may further include a lower conductive structure having a single-layer or multi-layer structure in addition to the first lower conductive layer 145. When the lower conductive structure has the multi-layer structure, a plurality of conductive layers separated from each other in a direction orthogonal to the lower surface 115 of the first semiconductor chip 110 and extending in generally parallel to the lower surface 115 of the first semiconductor chip 110 may be included. In the embodiment of FIG. 19, the second and third lower conductive layers 191 and 195 may form the lower conductive structure. The lower conductive structure may be electrically connected to the side conductive structure through a lower side conductive structure, such as the second and third lower side conductive layers 193 and 197, extending in the vertical direction.

In addition, the semiconductor package 30*e* may further include a lower insulating structure provided on the first lower insulating layer 125 and covering the lower conductive structure. The lower insulating structure may include a single insulating layer or multiple insulating layers provided on the first lower insulating layer 125. When the lower insulating structure has a multi-layer structure, each of insulating layers included in the lower insulating structure may extend along the lower surface and the side surface of the first lower insulating layer 125. In the embodiment of FIG. 19, the second and third lower insulating layers 175 and 177 may form the lower insulating structure.

Figure 20:
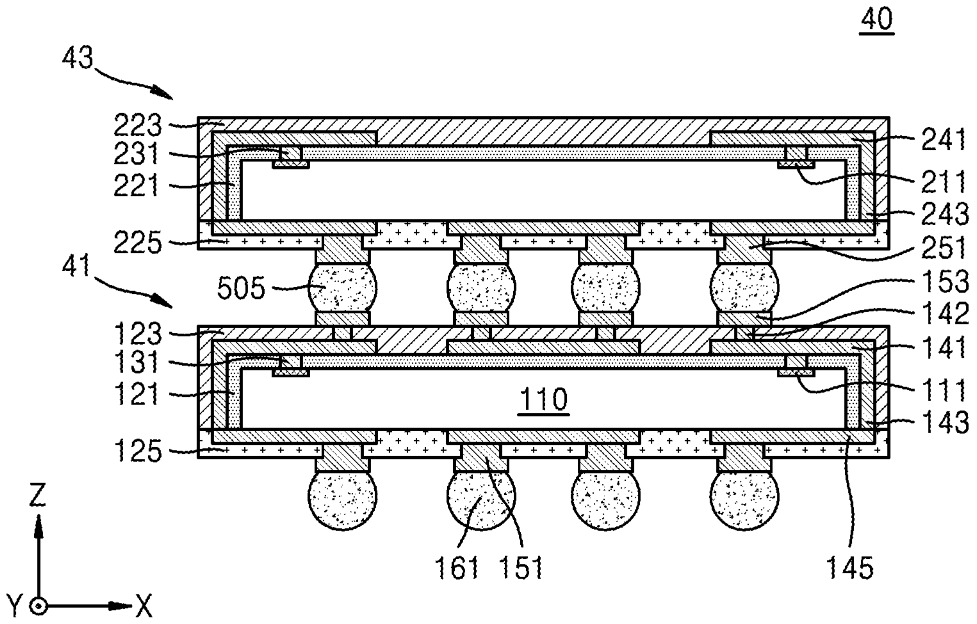
FIG. 20 is a cross-sectional view of a semiconductor package according to example embodiments of the inventive concept.

FIG. 20 is a cross-sectional view of a semiconductor package 40 according to example embodiments of the inventive concept. Hereinafter, a description made above will be omitted or simply repeated.

Referring to FIG. 20, the semiconductor package 40 may have a package-on-package structure in which a first upper package 43 is attached onto a lower package 21. The lower package 41 may be a semiconductor package of a fan-out structure. The lower package 41 may be substantially the same as or similar to the semiconductor package 30*a* described with reference to FIG. 13.

The first upper package 43 may be stacked on the lower package 41 through an inter-package connection terminal 505. In the present disclosure, the first upper package 43 may be referred to as a package structure. The first upper package 43 may be a semiconductor package of the fan-out structure. The first upper package 43 may be substantially the same as or similar to the semiconductor package 30 described with reference to FIGS. 12A to 12C. The first upper package 43 may include a second semiconductor chip 210 including a chip pad 211, a conductive pillar 231 connected to the chip pad 211 of the second semiconductor chip 210, a fifth cover insulating layer 221 covering an upper surface and a side surface of the second semiconductor chip 210, a fourth upper conductive layer 241 extending along an upper surface of the fifth cover insulating layer 221, a fourth side conductive layer 243 extending along a side surface of the fifth cover insulating layer 221, a sixth cover insulating layer 223 covering the fourth upper conductive layer 241 and the fourth side conductive layer 243, a fourth lower conductive layer 245 extending along a lower surface of the second semiconductor chip 210, a fourth lower insulating layer 225 covering the fourth lower conductive layer 245, and a second lower bump pad 251 connected to the fourth lower conductive layer 245 through an opening of the fourth lower insulating layer 225. The second semiconductor chip 210, the conductive pillar 231, the fifth cover insulating layer 221, the fourth upper conductive layer 241, the fourth side conductive layer 243, the sixth cover insulating layer 223, the fourth lower conductive layer 245, the fourth lower insulating layer 225, and the second lower bump pad 251 in the first upper package 43 may correspond to the first semiconductor chip 110, the first conductive pillar 131, the first cover insulating layer 121, the first upper conductive layer 141, the first side conductive layer 143, the second cover insulating layer 123, the first lower conductive layer 145, the first lower insulating layer 125, and the first lower bump pad 151 in the semiconductor package 30 described with reference to FIGS. 12A to 12C, respectively. The inter-package connection terminal 505 may be between the upper bump pad 153 of the lower package 41 and the second lower bump pad 251 of the first upper package 43.

Figure 21:
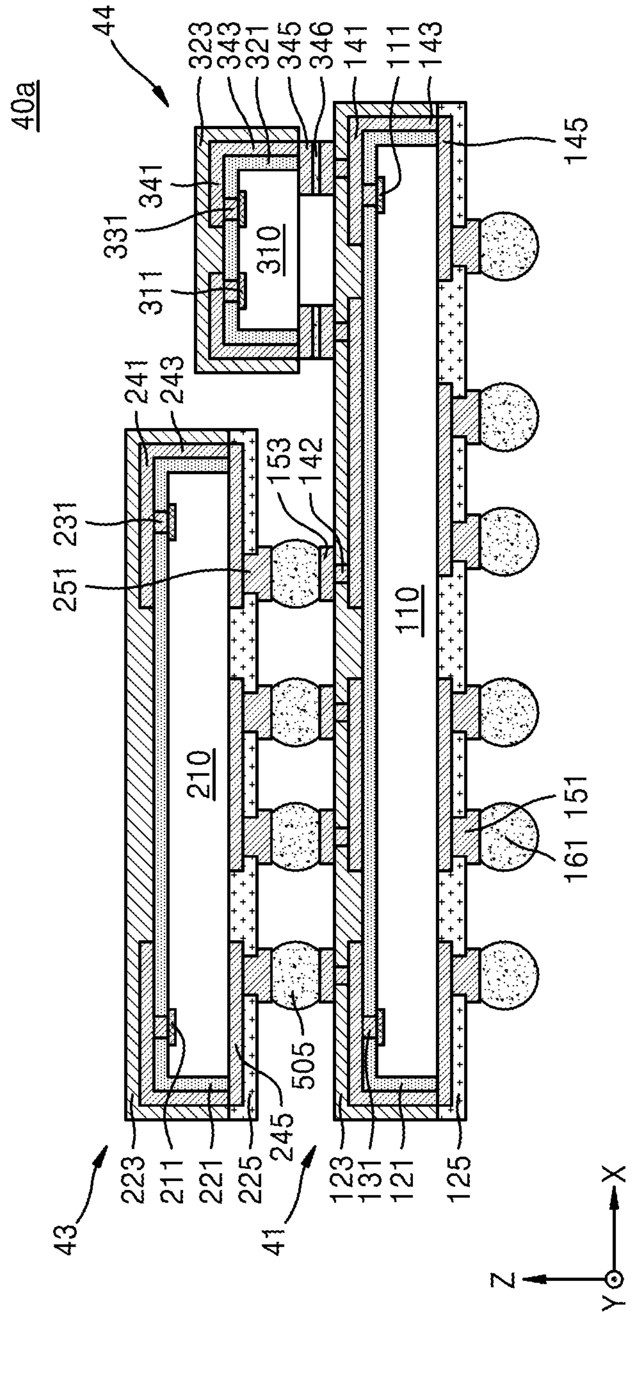
FIG. 21 is a cross-sectional view of a semiconductor package according to example embodiments of the inventive concept.

FIG. 21 is a cross-sectional view of a semiconductor package 40*a* according to example embodiments of the inventive concept. Hereinafter, a difference from the semiconductor package 40 described with reference to FIG. 20 will be mainly described to describe the semiconductor package 40*a* shown in FIG. 21.

Referring to FIG. 21, the semiconductor package 40*a* may have a package-on-package structure in which the first upper package 43 and a second upper package 44 are attached onto the lower package 41. The first upper package 43 and the second upper package 44 may be arranged side by side above the lower package 41.

The second upper package 44 may be a semiconductor package of the fan-out structure. In the present disclosure, the second upper package 44 may be referred to as a package structure. The second upper package 44 may be similar to the semiconductor package 30*c* described with reference to FIG. 17. The second upper package 44 may include a third semiconductor chip 310 including a chip pad 311, a conductive pillar connected to the chip pad 311 of the third semiconductor chip 310, a seventh cover insulating layer 321 covering an upper surface and a side surface of the third semiconductor chip 310, a fifth upper conductive layer 341 extending along an upper surface of the seventh cover insulating layer 321, a fifth side conductive layer 343 extending along a side surface of the seventh cover insulating layer 321, an eighth cover insulating layer 323 covering the fifth upper conductive layer 341 and the fifth side conductive layer 343, a fifth lower conductive layer 345 extending along a lower surface of the third semiconductor chip 310, and a conductive adhesive layer 346. The third semiconductor chip 310, the conductive pillar 331, the seventh cover insulating layer 321, the fifth upper conductive layer 341, the fifth side conductive layer 343, the eighth cover insulating layer 323, the fifth lower conductive layer 345, and the conductive adhesive layer 346 in the second upper package 44 may correspond to the first semiconductor chip 110, the first conductive pillar 131, the first cover insulating layer 121, the first upper conductive layer 141, the first side conductive layer 143, the second cover insulating layer 123, the first lower conductive layer 145, and the conductive adhesive layer 146 in the semiconductor package 30*c* described with reference to FIG. 17, respectively. The upper bump pad 153 of the lower package 41 and the fifth lower conductive layer 345 of the second upper package 44 may be coupled to each other through the conductive adhesive layer 346.

Figure 22:
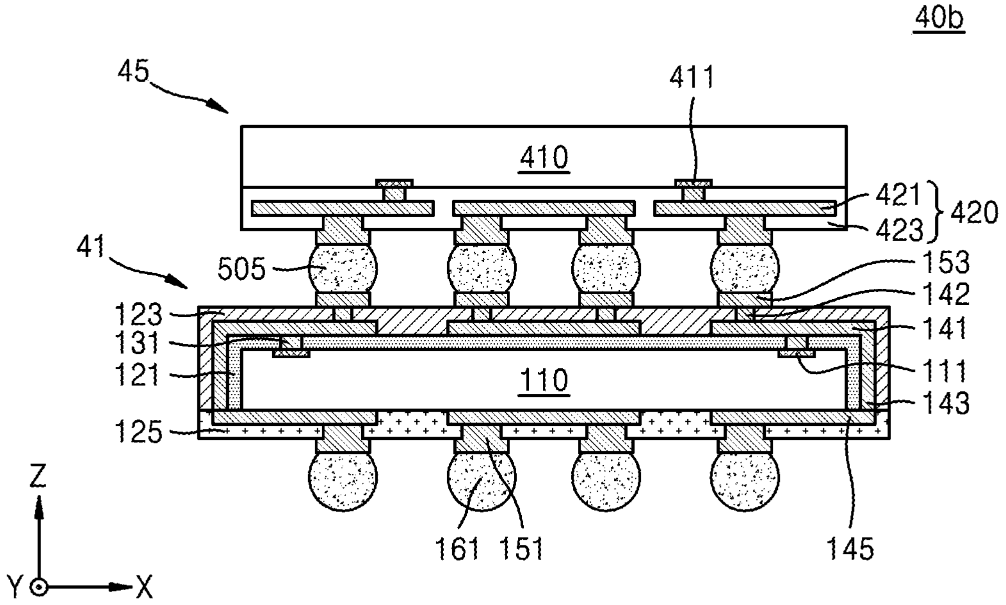
FIG. 22 is a cross-sectional view of a semiconductor package according to example embodiments of the inventive concept.

FIG. 22 is a cross-sectional view of a semiconductor package 40*b* according to example embodiments of the inventive concept. Hereinafter, a difference from the semiconductor package 40 described with reference to FIG. 20 will be mainly described to describe the semiconductor package 40*b* shown in FIG. 22.

Referring to FIG. 22, the semiconductor package 40*b* may have a package-on-package structure in which a third upper package 45 is attached onto the lower package 41.

The third upper package 45 may be stacked on the lower package 41 through the inter-package connection terminal 505. The third upper package 45 may be a semiconductor package of a fan-in structure. The third upper package 45 may include a fourth semiconductor chip 410 in which a surface having a chip pad 411 faces the lower package 41, and a redistribution structure 420 on the fourth semiconductor chip 410. The redistribution structure 420 may include a conductive redistribution pattern 421 and a redistribution insulating layer 423 covering the conductive redistribution pattern 421. The inter-package connection terminal 505 may be between a portion of the conductive redistribution pattern 421 protruding from the redistribution insulating layer 423 and the upper bump pad 153 of the lower package 41. The conductive redistribution pattern 421 may electrically connect the chip pad 411 of the fourth semiconductor chip 410 to the inter-package connection terminal 505.

According to example embodiments of the inventive concept, a first side conductive layer that is an electrical connection structure between a first upper conductive layer and a first lower conductive layer may also be formed by the same redistribution process for the first upper conductive layer Accordingly, a process of manufacturing a semiconductor package may be simplified, and manufacturing costs may be reduced.

According to example embodiments of the inventive concept, a first side conductive layer for an electrical connection between a first upper conductive layer and a first lower conductive layer is formed with a small thickness of about several micrometers, and a first cover insulating layer and a second cover insulating layer covering the first side conductive layer are also formed with a small thickness of about several micrometers, and thus, a footprint of a semiconductor package may be reduced, and the semiconductor package having a small form factor may be implemented.

Figure 23A:
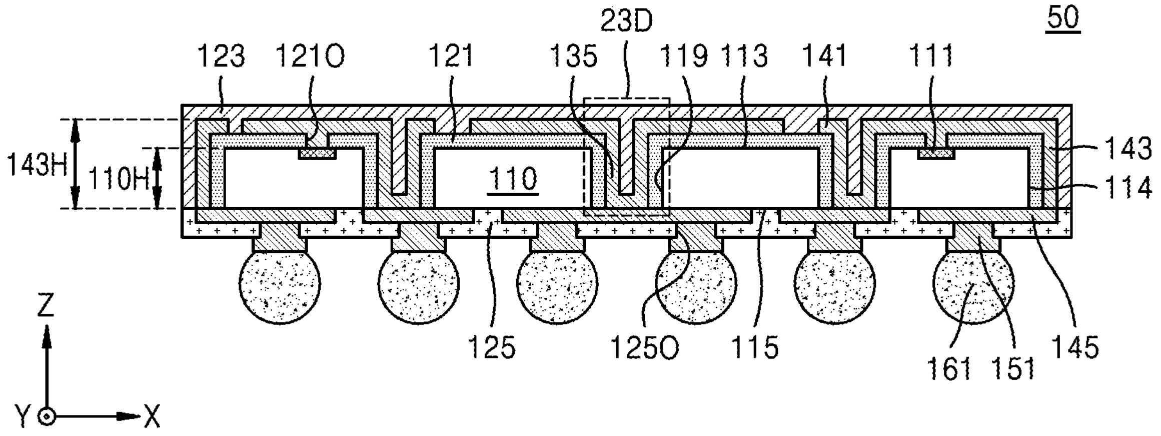
FIG. 23A is a cross-sectional view of a semiconductor package according to example embodiments of the inventive concept.
Figure 23B:
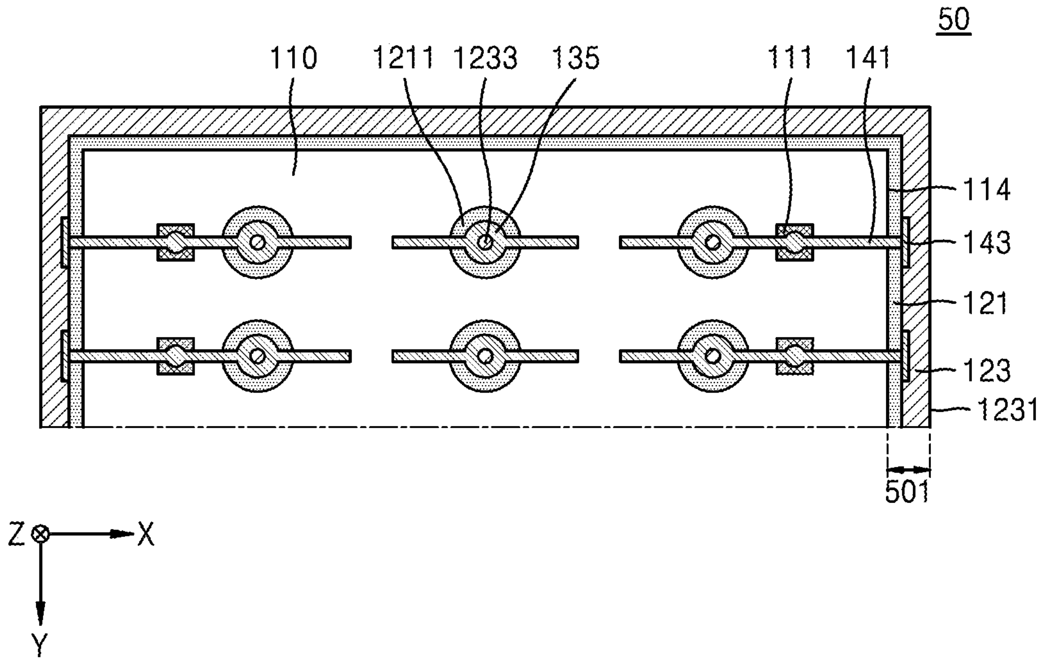
FIG. 23B is a layout diagram of some components of the semiconductor package shown in FIG. 23A.
Figure 23C:
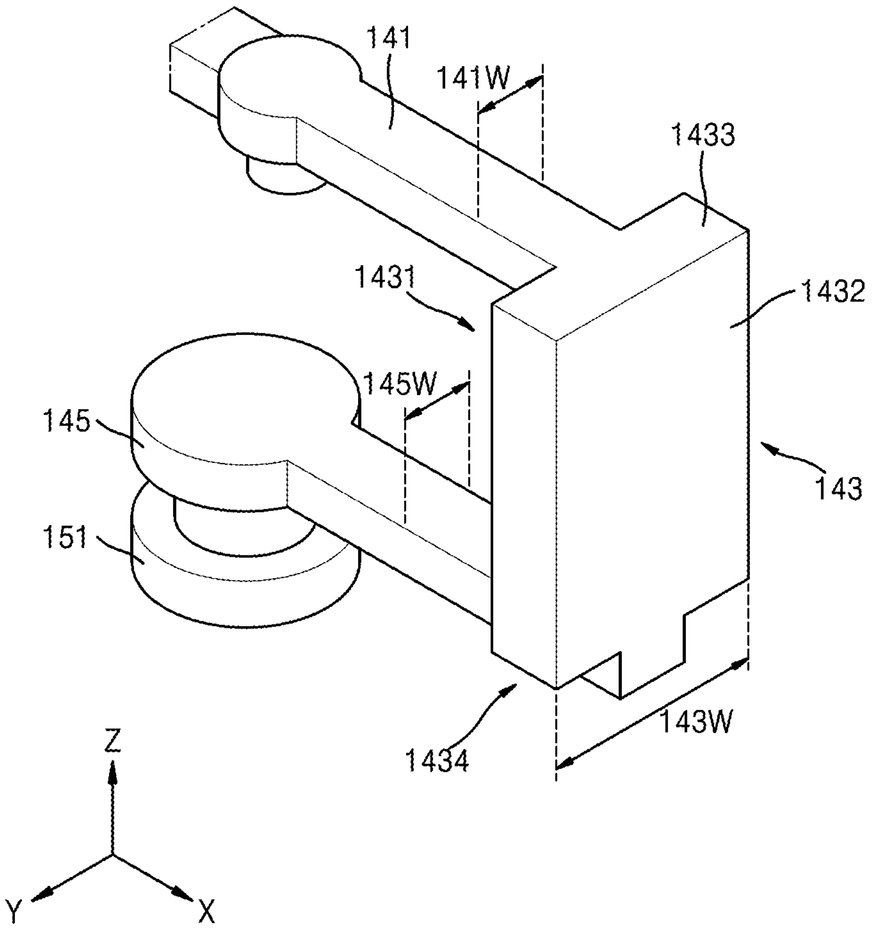
FIG. 23C is a perspective view of a first upper conductive layer, a first side conductive layer, a first lower conductive layer, and a first lower bump pad in the semiconductor package shown in FIG. 23A.
Figure 23D:
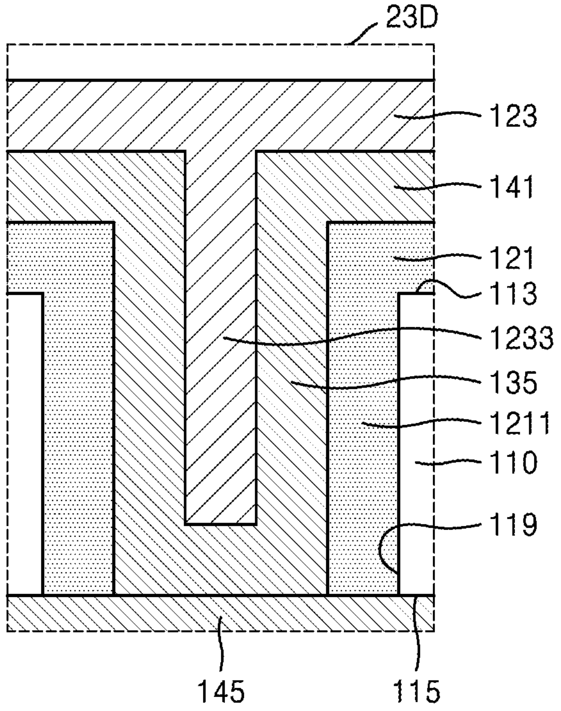
FIG. 23D is a magnified view of a region marked by “23D” of FIG. 23A.

FIG. 23A is a cross-sectional view of a semiconductor package 50 according to example embodiments of the inventive concept. FIG. 23B is a layout diagram of some components of the semiconductor package 50 shown in FIG. 23A. FIG. 23C is a perspective view of a first upper conductive layer 141, a first side conductive layer 143, a first lower conductive layer 145, and a first lower bump pad 151 in the semiconductor package 50 shown in FIG. 23A. FIG. 23D is a magnified view of a region marked by "23D" of FIG. 23A Referring to FIGS. 23A to 23D, the semiconductor package 50 may include a first semiconductor chip 110, a first cover insulating layer 121, the first upper conductive layer 141, the first side conductive layer 143, a second cover insulating layer 123, a first through-chip conductive layer 135, the first lower conductive layer 145, a first lower insulating layer 125, the first lower bump pad 151, and a lower connection bump 161.

The first cover insulating layer 121 may cover the upper surface 113 and the side surface 114 of the first semiconductor chip 110. A portion of the first cover insulating layer 121 may extend along the upper surface 113 of the first semiconductor chip 110. In addition, the other portion of the first cover insulating layer 121 may extend along the side surface 114 of the first semiconductor chip 110 to fully cover the side surface 114 of the first semiconductor chip 110. In a plan view, the first cover insulating layer 121 may fully surround the side surface 114 of the first semiconductor chip 110. For example, when the first semiconductor chip 110 has a quadrangular plane shape, the first cover insulating layer 121 may have a quadrangular ring shape surrounding four side surfaces of the first semiconductor chip 110. In example embodiments, a footprint of the first cover insulating layer 121 may be the same as or similar to a footprint of the first semiconductor chip 110. That is, a plane area of the first cover insulating layer 121 may be the same as or similar to a plane area of the first semiconductor chip 110.

The first upper conductive layer 141 may be provided on an upper surface of the first cover insulating layer 121. The first upper conductive layer 141 may be in contact with and extend along the upper surface of the first cover insulating layer 121. The first upper conductive layer 141 may extend in parallel to the upper surface 113 of the first semiconductor chip 110. The first upper conductive layer 141 may be connected to the chip pad 111 of the first semiconductor chip 110 through an opening 121O of the first cover insulating layer 121. In example embodiments, the first upper conductive layer 141 may include a line pattern extending in a line shape on the upper surface of the first cover insulating layer 121.

The first side conductive layer 143 may be provided on a side surface of the first cover insulating layer 121. The first side conductive layer 143 may be connected to the first upper conductive layer 141 and extend along the side surface of the first cover insulating layer 121. The first side conductive layer 143 may extend in parallel to the side surface 114 of the first semiconductor chip 110. The first side conductive layer 143 may extend downward from an upper end thereof connected to the first upper conductive layer 141. The first side conductive layer 143 may extend from an upper end to a lower end of the side surface of the first cover insulating layer 121. In example embodiments, a lower end of the first side conductive layer 143 and the lower end of the first cover insulating layer 121 may be on the same plane as the lower surface 115 of the first semiconductor chip 110. In example embodiments, a vertical height 143H of the first side conductive layer 143 may be greater than a vertical height 110H of the first semiconductor chip 110.

The second cover insulating layer 123 may cover the first upper conductive layer 141, the first side conductive layer 143, and the first cover insulating layer 121. A portion of the second cover insulating layer 123 may extend along the upper surface of the first cover insulating layer 121 to cover the first upper conductive layer 141. The other portion of the second cover insulating layer 123 may extend along the side surface of the first cover insulating layer 121 to cover the first side conductive layer 143. The second cover insulating layer 123 may include an upper surface extending in generally parallel to the upper surface 113 of the first semiconductor chip 110, and a side surface extending in generally parallel to the side surface 114 of the first semiconductor chip 110. In example embodiments, the upper surface and the side surface of the second cover insulating layer 123 may be exposed to the outside.

In example embodiments, a lower end of the second cover insulating layer 123 may be on the same plane as the lower end of the first side conductive layer 143, the lower end of the first cover insulating layer 121, and the lower surface 115 of the first semiconductor chip 110.

The first through-chip conductive layer 135 may extend through the first semiconductor chip 110 and electrically connect the first upper conductive layer 141 to the first lower conductive layer 145. The first semiconductor chip 110 may include a through hole 119 extending from the upper surface 113 of the first semiconductor chip 110 and passing through the first semiconductor chip 110, and the first through-chip conductive layer 135 may be provided inside the through hole 119 of the first semiconductor chip 110.

The first cover insulating layer 121 may include a side wall cover part 1211 arranged inside the through hole 119 of the first semiconductor chip 110 and covering an inner wall of the first semiconductor chip 110, the inner wall defining the through hole 119 of the first semiconductor chip 110. The side wall cover part 1211 may extend from the upper surface 113 of the first semiconductor chip 110 to the lower surface 115 along the inner wall of the first semiconductor chip 110. The side wall cover part 1211 may be between the first through-chip conductive layer 135 and the inner wall of the first semiconductor chip 110. The side wall cover part 1211 may surround the first through-chip conductive layer 135 provided inside the through hole 119 of the first semiconductor chip 110. The side wall cover part 1211 may have a cylindrical shape surrounding the first through-chip conductive layer 135.

In example embodiments, the first through-chip conductive layer 135 may extend along the side wall cover part 1211 provided inside the through hole 119 of the first semiconductor chip 110 and be in contact with a surface of the first lower conductive layer 145 that is not covered by the side wall cover part 1211.

In example embodiments, the second cover insulating layer 123 may include a buried insulating pattern 1233 arranged inside the through hole 119 of the first semiconductor chip 110. The buried insulating pattern 1233 may have a pillar shape extending in the vertical direction (e.g., the Z-axis direction) in the inside of the through hole 119 of the first semiconductor chip 110. The first through-chip conductive layer 135 may surround a side wall of the buried insulating pattern 1233.

The first lower conductive layer 145 may be provided on the lower surface 115 of the first semiconductor chip 110. The first lower conductive layer 145 may be in contact with and extend along the lower surface 115 of the first semiconductor chip 110. The first lower conductive layer 145 may extend in parallel to the lower surface 115 of the first semiconductor chip 110. The first lower conductive layer 145 may further extend outward from an edge of the lower surface 115 of the first semiconductor chip 110 to be connected to the lower end of the first side conductive layer 143. In example embodiments, the first lower conductive layer 145 may include a line pattern extending in a line shape on the lower surface 115 of the first semiconductor chip 110.

The first lower insulating layer 125 may cover the lower surface 115 of the first semiconductor chip 110 and the first lower conductive layer 145. The first lower insulating layer 125 may cover the lower surface 115 of the first semiconductor chip 110 and cover the lower end of the first cover insulating layer 121 and the lower end of the second cover insulating layer 123, which are on the same plane as the lower surface 115 of the first semiconductor chip 110. In example embodiments, a footprint of the first lower insulating layer 125 may be the same as or similar to a footprint of the second cover insulating layer 123. That is, a plane area of the first lower insulating layer 125 may be the same as or similar to a plane area of the second cover insulating layer 123.

The first lower bump pad 151 may be connected to the first lower conductive layer 145 through an opening 125O of the first lower insulating layer 125. A portion of the first lower bump pad 151 may protrude from the first lower insulating layer 125. For example, the first lower bump pad 151 may be an under bump metal (UBM) layer.

The lower connection bump 161 may be provided on the first lower bump pad 151. In example embodiments, the lower connection bump 161 may generally have a ball shape attached to the first lower bump pad 151. For example, the lower connection bump 161 may be formed by placing a solder ball on the first lower bump pad 151 and then performing a reflow process on the solder ball. In other example embodiments, the lower connection bump 161 has a plate shape and may be formed to have a generally uniform thickness on the surface of the first lower bump pad 151.

In example embodiments, the first side conductive layer 143 may have a plate shape extending in generally parallel to the side surface 114 of the first semiconductor chip 110. For example, the first side conductive layer 143 may include a first side surface 1431 facing the side surface 114 of the first semiconductor chip 110, a second side surface 1432 that is opposite to the first side surface 1431, and an upper surface 1433 and a lower surface 1434 that are opposite to each other. Each of the first side surface 1431 and the second side surface 1432 of the first side conductive layer 143 may extend in parallel to the side surface 114 of the first semiconductor chip 110, which faces the first side conductive layer 143.

The first side conductive layer 143 may have a first horizontal width 143W in a second horizontal direction (e.g., the Y-axis direction) that is parallel to the side surface 114 of the first semiconductor chip 110, which faces the first side conductive layer 143. In example embodiments, the first side conductive layer 143 may extend in the vertical direction (e.g., the Z-axis direction) with a generally uniform width, i.e., the first horizontal width 143W. That is, a horizontal width at a lower part of the first side conductive layer 143 may be the same as a horizontal width at an upper part of the first side conductive layer 143.

In example embodiments, the first upper conductive layer 141 may be connected to the first side surface 1431 of the first side conductive layer 143 and have a line shape extending from the first side surface 1431 of the first side conductive layer 143. The first upper conductive layer 141 may be a line-shaped pattern extending with a second horizontal width 141W from the first side surface 1431 of the first side conductive layer 143. In this case, the first horizontal width 143W of the first side conductive layer 143 may be greater than the second horizontal width 141W of the first upper conductive layer 141. In example embodiments, when a contact region between the first upper conductive layer 141 and the first side conductive layer 143 is defined as a first contact region, a horizontal width of the first contact region in the second horizontal direction (e.g., the Y-axis direction) may be less than the first horizontal width 143W of the first side conductive layer 143. In example embodiments, the first horizontal width 143W of the first side conductive layer 143 may be about 150% to about 500%, about 200% to about 400%, or about 250% to about 300% of the horizontal width of the first contact region between the first upper conductive layer 141 and the first side conductive layer 143.

In example embodiments, the first lower conductive layer 145 may be connected to the lower surface 1434 of the first side conductive layer 143 and have a line shape extending from a part connected to the lower surface 1434 of the first side conductive layer 143. The first lower conductive layer 145 may be a line-shaped pattern extending with a third horizontal width 145W from the lower surface 1434 of the first side conductive layer 143. In this case, the first horizontal width 143W of the first side conductive layer 143 may be greater than the third horizontal width 145W of the first lower conductive layer 145. In example embodiments, when a contact region between the first lower conductive layer 145 and the first side conductive layer 143 is defined as a second contact region, a horizontal width of the second contact region in the second horizontal direction (e.g., the Y-axis direction) may be less than the first horizontal width 143W of the first side conductive layer 143. In example embodiments, the first horizontal width 143W of the first side conductive layer 143 may be about 150% to about 500%, about 200% to about 400%, or about 250% to about 300% of the horizontal width of the second contact region between the first lower conductive layer 145 and the first side conductive layer 143.

A footprint (or a plane area) of the semiconductor package 50 may be determined based on a distance 501 between the side surface 114 of the first semiconductor chip 110 and a side surface of the semiconductor package 50. The distance 501 between the side surface 114 of the first semiconductor chip 110 and the side surface of the semiconductor package 50 may indicate a distance between the side surface 114 of the first semiconductor chip 110 and an outer side surface 1231 of the second cover insulating layer 123 in a direction orthogonal to the side surface 114 of the first semiconductor chip 110, the outer side surface 1231 forming the side surface of the semiconductor package 50. In some example embodiments, the distance 501 between the side surface 114 of the first semiconductor chip 110 and the side surface of the semiconductor package 50 may be about 10 μm to about 80 μm.

In general, a connection between an upper wiring at an upper side of a semiconductor chip and a lower wiring at a lower side of the semiconductor chip is implemented by a conductive post extending in the vertical direction. The conductive post is formed by a separate process from a process of forming the upper wiring and a process of forming the lower wiring. In addition, the process of forming the conductive post generally includes a process of forming a via hole in an insulating material layer and a plating process of filling the via hole with a conductive material. With respect to the conductive post, to prevent insufficient filling of the via hole with the conductive material in the plating process, the via hole and the conductive post are generally formed with a large width of about tens to about hundreds micrometers, and a size of a semiconductor package also increases by an arrangement space of the conductive post.

According to example embodiments of the inventive concept, the first side conductive layer 143 that is an electrical connection structure between the first upper conductive layer 141 and the first lower conductive layer 145 may be formed together by the same redistribution process as that of the first upper conductive layer 141. Accordingly, a process of manufacturing the semiconductor package 50 may be simplified, and manufacturing costs may be reduced. Furthermore, the first side conductive layer 143 for an electrical connection between the first upper conductive layer 141 and the first lower conductive layer 145 is formed with a small thickness of about several micrometers, and the first cover insulating layer 121 and the second cover insulating layer 123 covering the first side conductive layer 143 are also formed with a small thickness of about several micrometers, and thus, a footprint of the semiconductor package 50 may be reduced, and the semiconductor package 50 having a small form factor may be implemented.

Figure 24A:
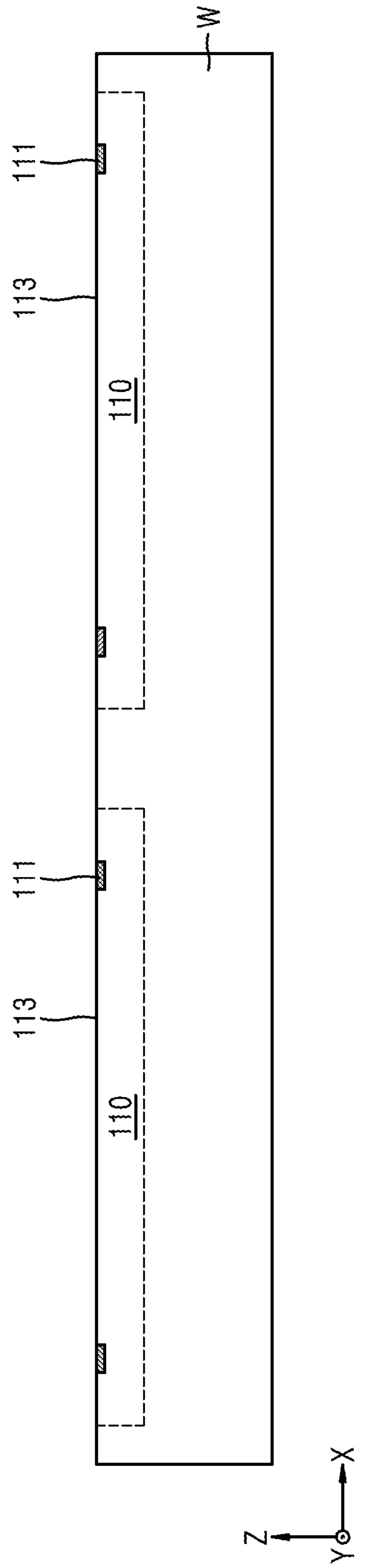
FIGS. 24A to 24L are cross-sectional views of the semiconductor package shown in FIGS. 23A to 23D.
Figure 24B:
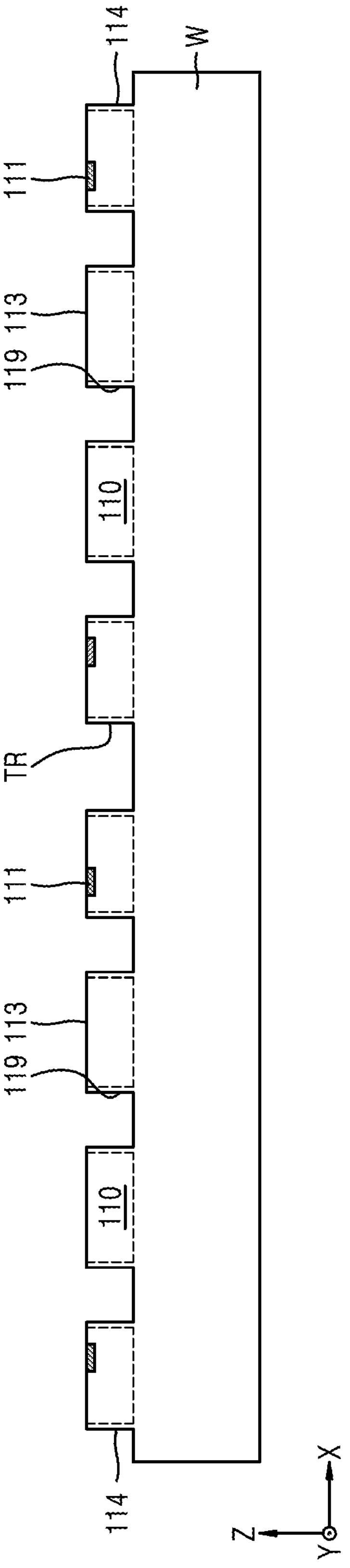
Figure 24C:
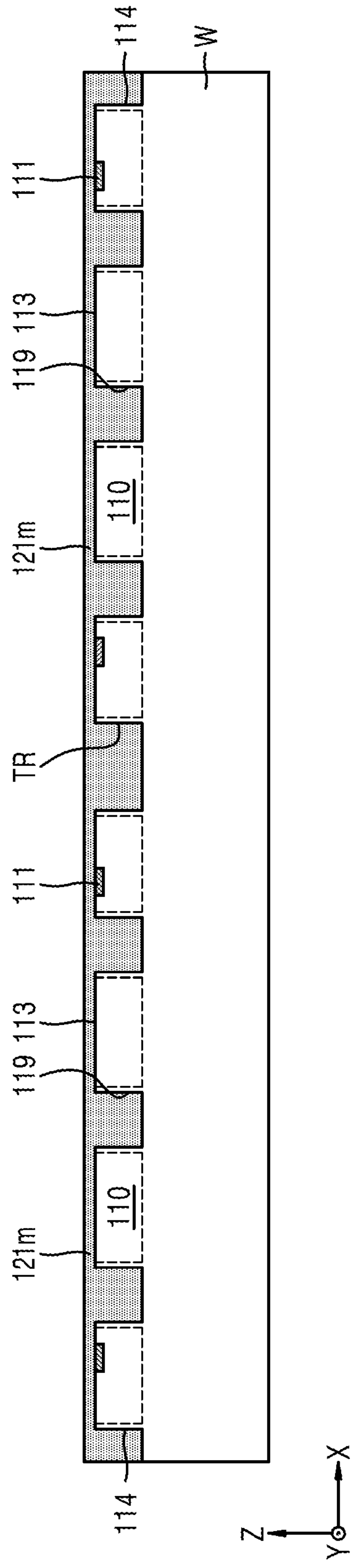
Figure 24D:
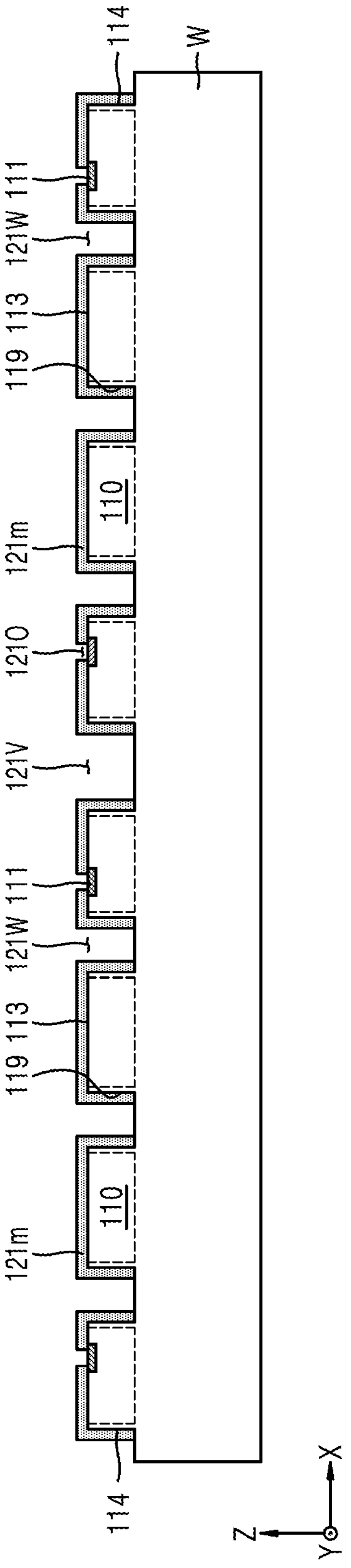
Figure 24E:
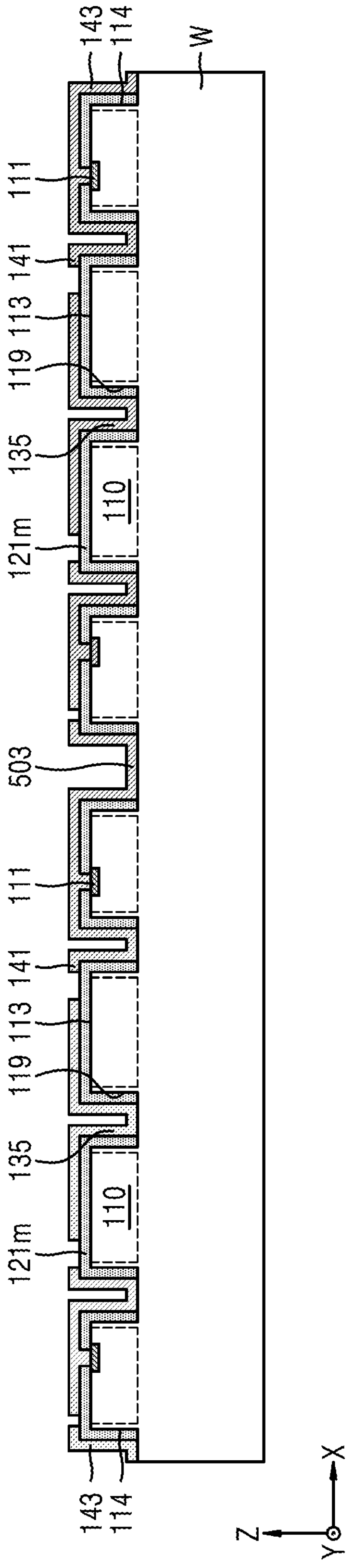

FIGS. 24A to 24L are cross-sectional views of the semiconductor package 50 shown in FIGS. 23A to 23D. FIG. 25A is a top view of a portion of a structure shown in FIG. 24D, FIG. 25B is a top view of a portion of a structure shown in FIG. 24E, and FIG. 25C is a top view of a portion of a structure shown in FIG. 24F. Hereinafter, a method of manufacturing the semiconductor package 50 shown in FIGS. 23A to 23C will be described with reference to FIGS. 24A to 24L and 25A to 25C.

Referring to FIG. 24A, a wafer Won which a plurality of integrated circuit forming a plurality of first semiconductor chips 110 are formed is prepared.

Referring to FIG. 24B, a trench TR is formed between the plurality of first semiconductor chips 110 by removing a portion of the wafer W, and the though hole 119 is formed in the first semiconductor chip 110. The trench TR and the though hole 119 may be formed by removing a portion of the wafer W. The trench TR may be a space recessed from an upper side of the wafer W. By forming the trench TR between the plurality of first semiconductor chips 110, a side surface of each of the plurality of first semiconductor chips 110 may be exposed. In a plan view, the plurality of first semiconductor chips 110 may be separated from each other by the trench TR. In addition, by forming the though hole 119 in the first semiconductor chip 110, an inner wall of the first semiconductor chip 110 may be exposed.

Referring to FIGS. 24B and 24C, a first insulating material layer 121*m* covering the wafer W is formed. The first insulating material layer 121*m* may cover upper surfaces of the plurality of first semiconductor chips 110 and fill in the trench TR formed between the plurality of first semiconductor chips 110 and in the though hole 119 of the first semiconductor chip 110.

Referring to FIGS. 24D and 25A, a first hole 121V may be formed in the first insulating material layer 121*m* by removing a portion of the first insulating material layer 121*m* filled in the trench TR. The first hole 121V may pass through the first insulating material layer 121*m* filled in the trench TR so that a portion of the wafer W is exposed through the first hole 121V. In addition, at the same time when the first hole 121V is formed in the first insulating material layer 121*m*, a second hole 121W passing through the first insulating material layer 121*m* may be formed by removing a portion of the first insulating material layer 121*m* filled in the though hole 119 of the first semiconductor chip 110. A portion of the wafer W may be exposed through the second hole 121W of the first insulating material layer 121*m*. In addition, at the same time when the first hole 121V is formed in the first insulating material layer 121*m*, the opening 121O through which the chip pad 111 of the first semiconductor chip 110 is exposed is formed by removing a portion of the first insulating material layer 121*m*. The first hole 121V, the second hole 121W, and the opening 121O may be formed by an etching process or a laser drilling process on the first insulating material layer 121*m*.

Referring to FIGS. 24E and 25B, the first upper conductive layer 141, the first side conductive layer 143, the first through-chip conductive layer 135 in the second hole 121W of the first insulating material layer 121*m*, and a conductive layer 503 that covers the surface of the wafer W exposed through the first hole 121V may be formed. the first upper conductive layer 141, the first side conductive layer 143, the first through-chip conductive layer 135, and the conductive layer 503 may be formed together by the same metal interconnect process.

Figure 24F:
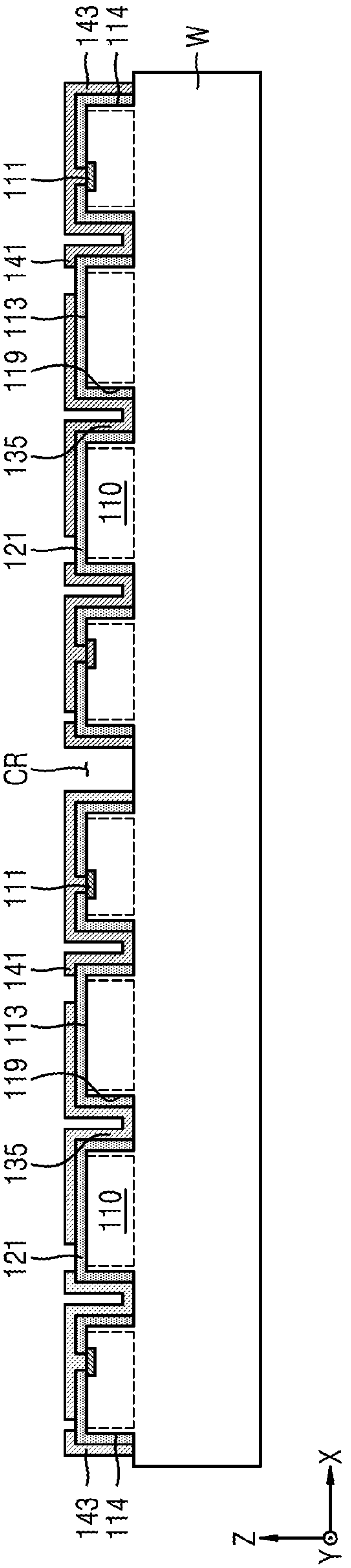
Figure 25A:
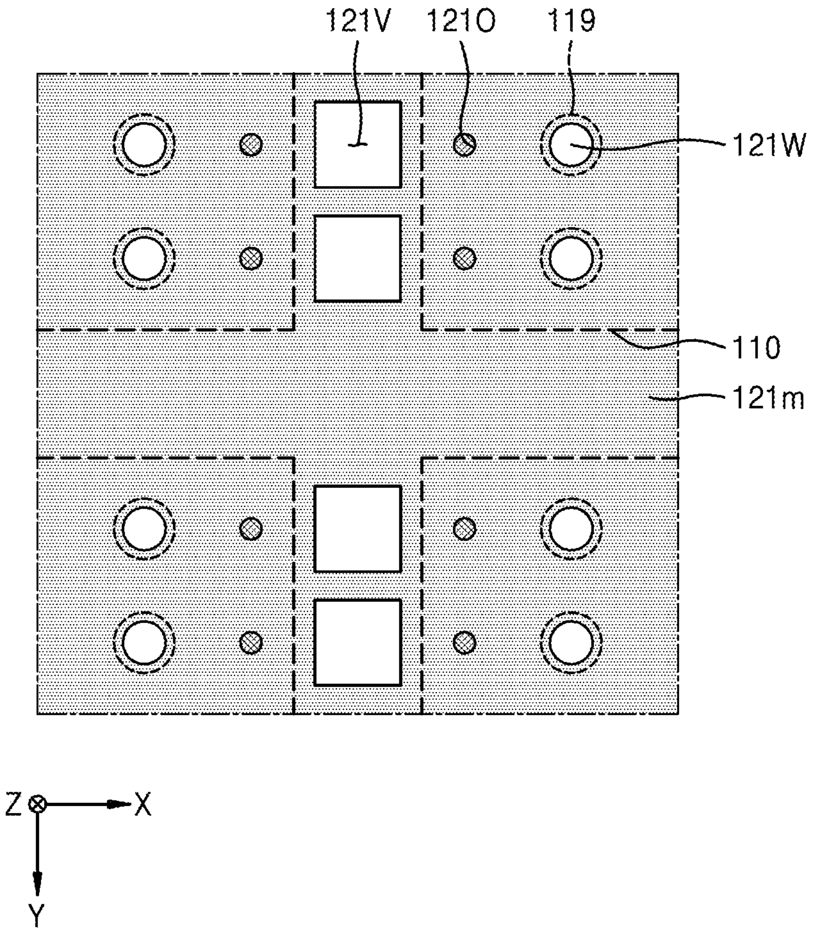
FIG. 25A is a top view of a portion of a structure shown in FIG. 24D.
Figure 25B:
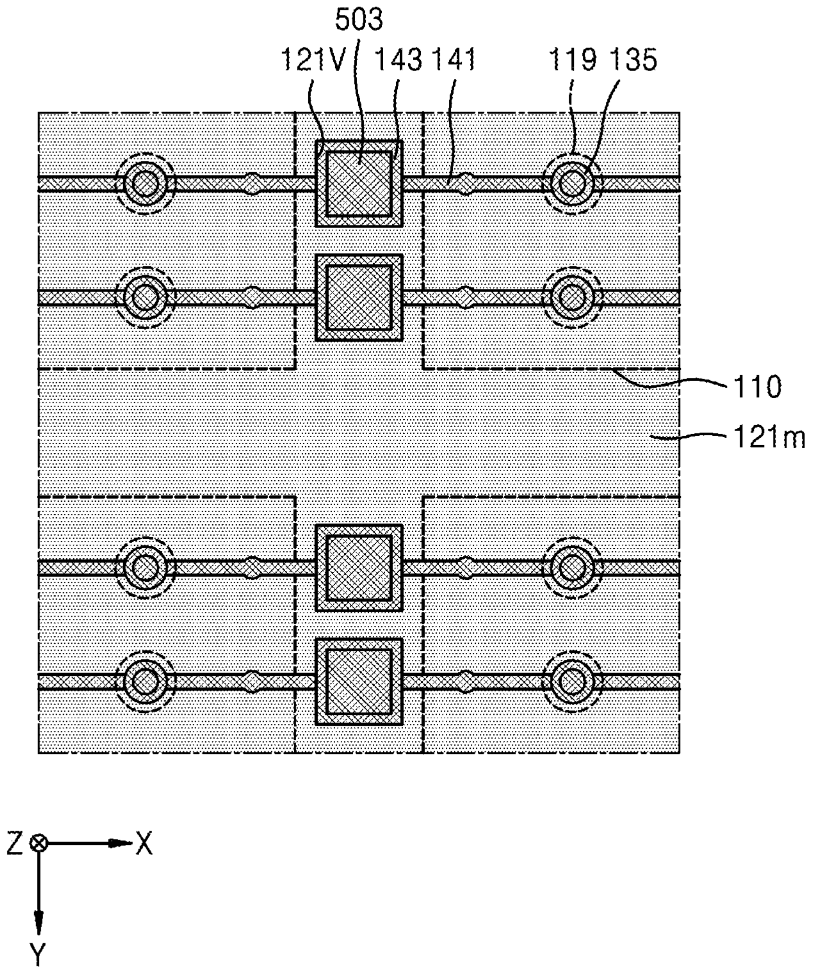
FIG. 25B is a top view of a portion of a structure shown in FIG. 24E.
Figure 25C:
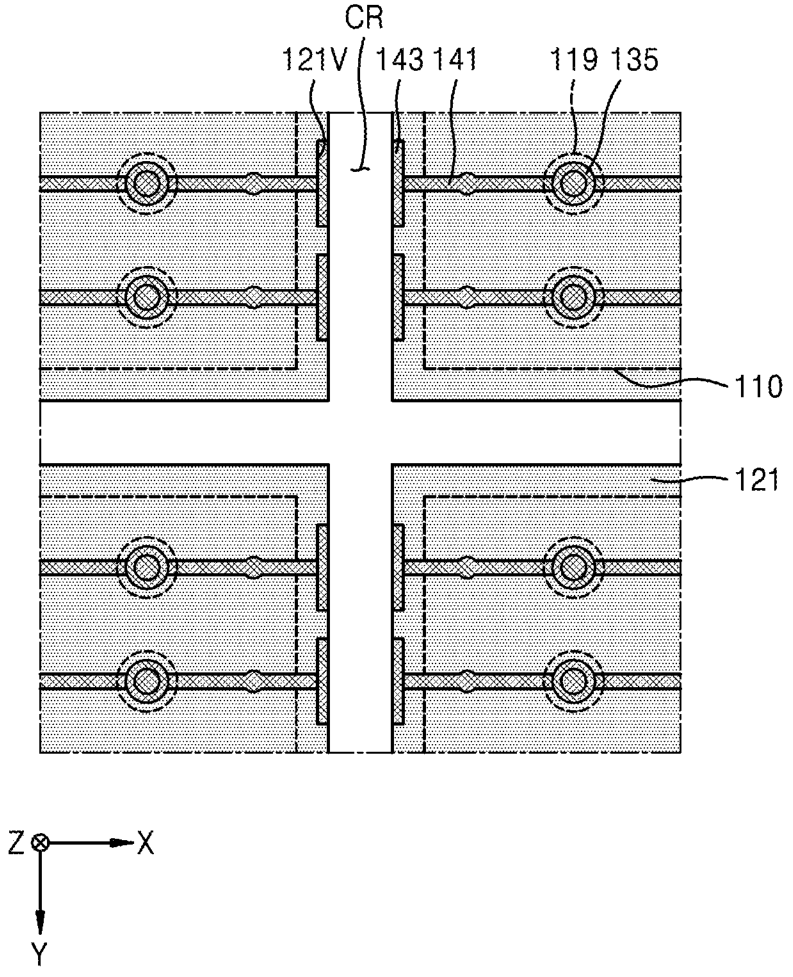
FIG. 25C is a top view of a portion of a structure shown in FIG. 24F.

Referring to FIGS. 24E, 24F, and 25C, a cutting process of forming a cutting region CR between the plurality of first semiconductor chips 110 is performed. The cutting region CR may be formed by removing a portion of each of material layers filled in the trench (TR of FIG. 24B) of the wafer W. The cutting process may include cutting using a cutting blade, cutting using a laser, or the like. The cutting region CR may be formed by removing a portion of the first insulating material layer 121*m* between the plurality of first semiconductor chips 110 and removing the conductive layer 503 covering the surface of the wafer W. The surface of the wafer W may be exposed through the cutting region CR. The cutting process may be performed to remove the conductive layer 503 covering the surface of the wafer W but not to remove the first side conductive layer 143 on a side wall of the first hole 121V. After the cutting process, a portion of the remaining first insulating material layer 121*m* may form the first cover insulating layer 121.

Figure 24G:
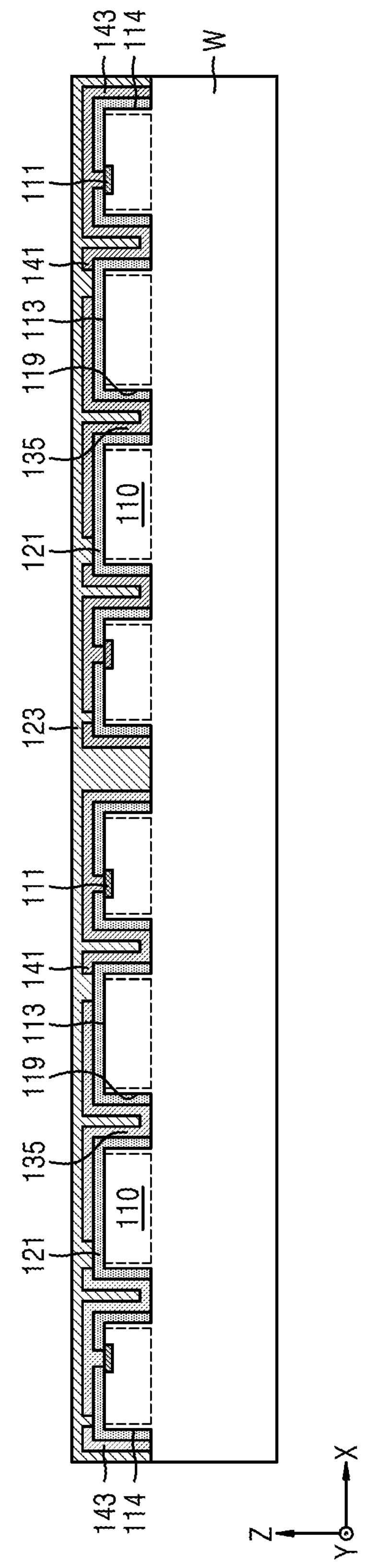

Referring to FIG. 24G, the second cover insulating layer 123 covering the result of FIG. 24F is formed. The second cover insulating layer 123 may cover the first cover insulating layer 121, the first upper conductive layer 141, the first through-chip conductive layer 135, and the first side conductive layer 143 and fill in the cutting region CR to cover the surface of the wafer W exposed through the cutting region CR.

Figure 24H:
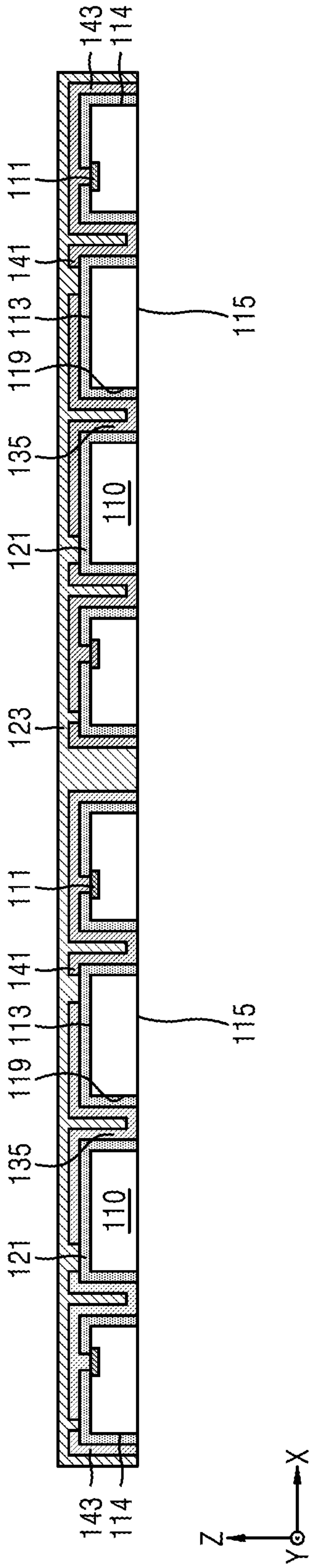

Referring to FIGS. 24G and 24H, a portion of the wafer W may be removed by performing a polishing process from a lower surface of the wafer W. The polishing process may be performed until the first side conductive layer 143 and the first through-chip conductive layer 135 are exposed. The polishing process may include chemical mechanical polishing, a grinding process, and the like. Through the polishing process, the lower surface 115 of the first semiconductor chip 110 may be planarized. The surface of the second cover insulating layer 123 and the surface of the first cover insulating layer 121, which are exposed through the polishing process, may be on the same plane as the lower surface 115 of the first semiconductor chip 110.

Figure 24I:
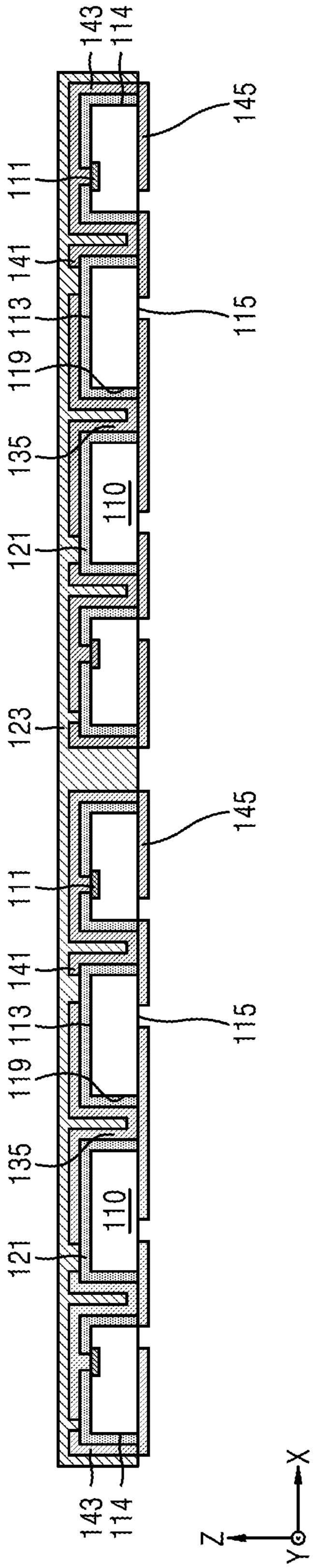

Referring to FIG. 24I, the first lower conductive layer 145 is formed on a lower surface of the result of FIG. 24H. The first lower conductive layer 145 may be connected to the first side conductive layer 143 and/or the first through-chip conductive layer 135 and extend along the lower surface 115 of the first semiconductor chip 110.

Figure 24J:
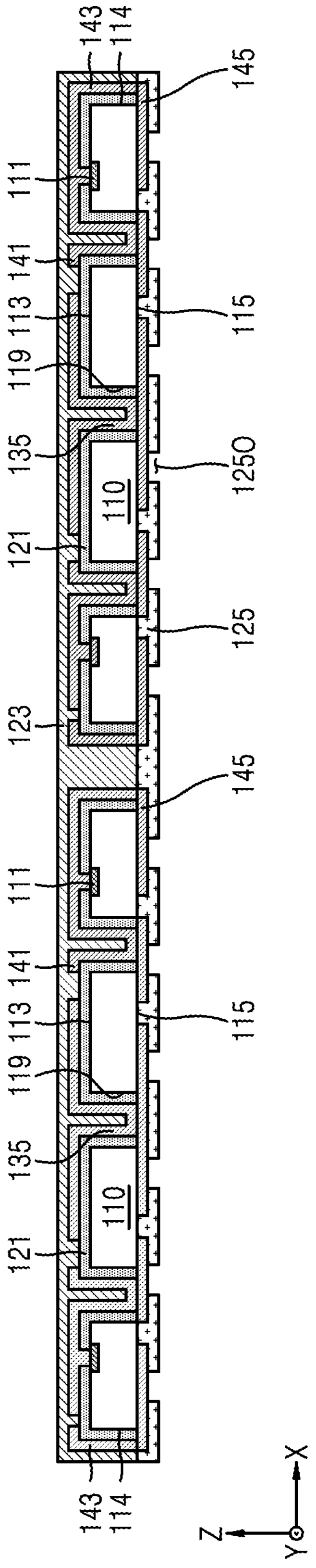

Referring to FIG. 24J, the first lower insulating layer 125 covering a lower surface of the result of FIG. 24I is formed. An insulating material layer covering the lower surface of the result of FIG. 24I may be formed to form the first lower insulating layer 125, and the opening 125O through which a portion of the first lower conductive layer 145 is exposed may be formed by removing a portion of the insulating material layer.

Figure 24K:
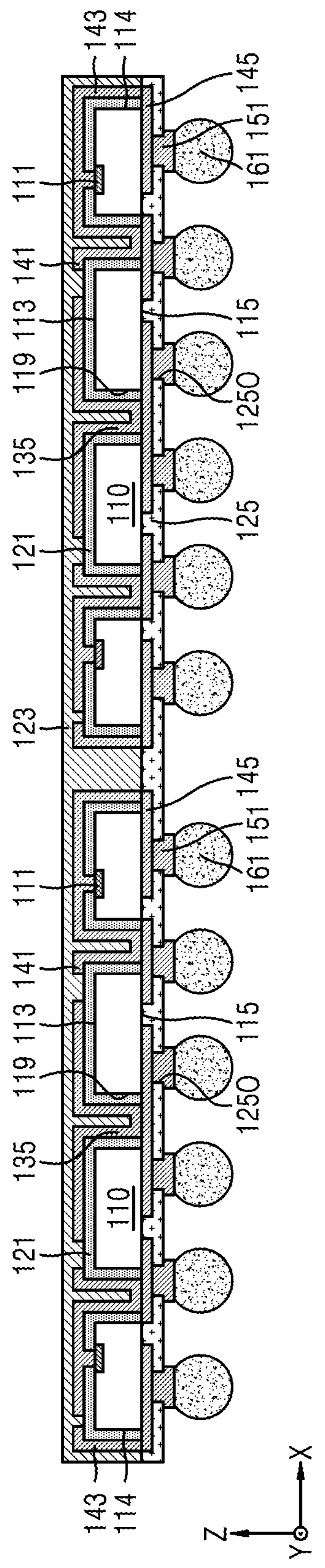

Referring to FIGS. 24J and 24K, the first lower bump pad 151 connected to the portion of the first lower conductive layer 145 exposed through the opening 125O of the first lower insulating layer 125 is formed, and the lower connection bump 161 is formed on the first lower bump pad 151.

Figure 24L:
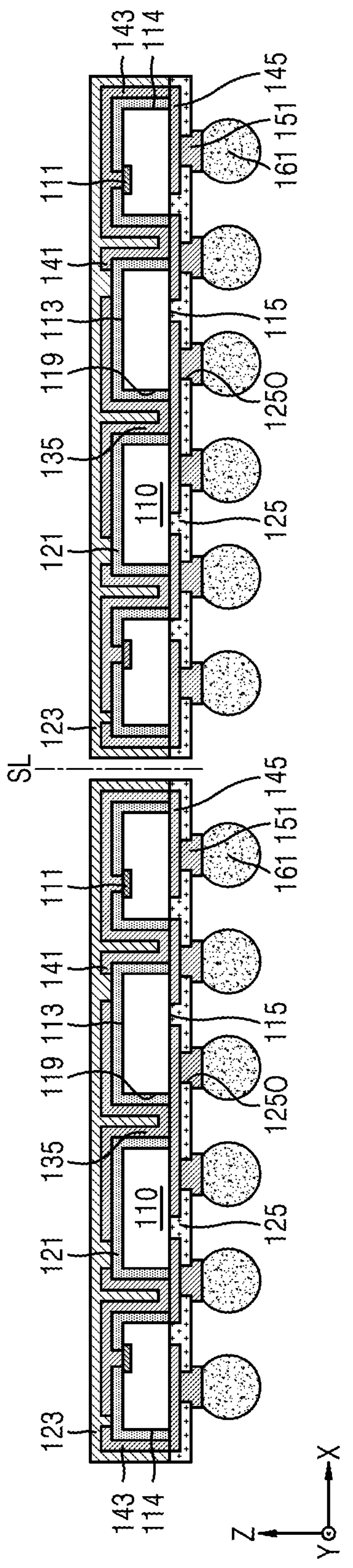

Referring to FIG. 24L, a sawing process on the result of FIG. 24K is performed. That is, a structure manufactured in a wafer level may be cut along a scribe lane SL to divide the structure manufactured in the wafer level into individual units of semiconductor packages 10.

Figure 26:
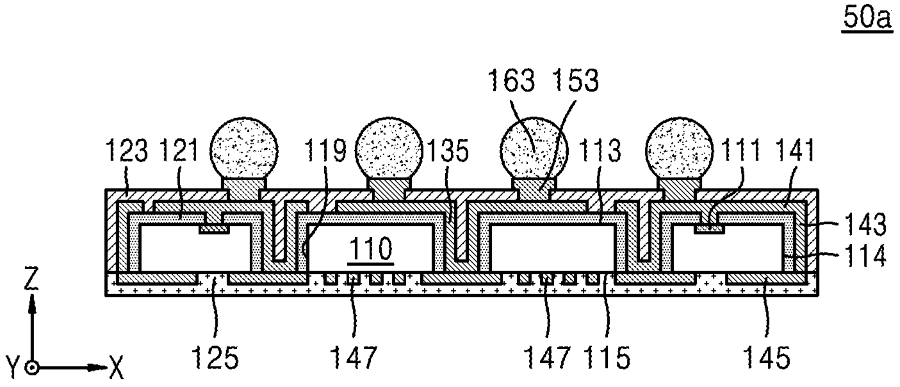
FIG. 26 is a cross-sectional view of a semiconductor package according to example embodiments of the inventive concept.

FIG. 26 is a cross-sectional view of a semiconductor package 50*a* according to example embodiments of the inventive concept. Hereinafter, a difference from the semiconductor package 50 described with reference to FIGS. 23A to 23C will be mainly described to describe the semiconductor package 50*a* shown in FIG. 26.

Referring to FIG. 26, the semiconductor package 50*a* may further include an inductor pattern 147 arranged on the lower surface 115 of the first semiconductor chip 110. The inductor pattern 147 may be in contact with the lower surface 115 of the first semiconductor chip 110 and be covered by the first lower insulating layer 125. The inductor pattern 147 may be formed together with the first lower conductive layer 145 during a metal interconnect process for forming the first lower conductive layer 145. The inductor pattern 147 may include the same material and/or material combination as the first lower conductive layer 145.

The semiconductor package 50*a* may include an upper bump pad 153 and an upper connection bump 163.

The upper bump pad 153 may be connected to the first upper conductive layer 141 through an opening of the second cover insulating layer 123. A portion of the upper bump pad 153 may protrude from the second cover insulating layer 123. For example, the first lower bump pad 151 may be an under bump metal layer.

The upper connection bump 163 may be provided on the upper bump pad 153. The upper connection bump 163 may include, for example, solder, Sn, Ag, In, Bi, Sb, Cu, Zn, Pb, and/or an alloy thereof. In example embodiments, the upper connection bump 163 may generally have a ball shape attached to the upper bump pad 153. For example, the upper connection bump 163 may be formed by placing a solder ball on the upper bump pad 153 and then performing a reflow process on the solder ball. In other example embodiments, the upper connection bump 163 has a plate shape and may be formed to have a generally uniform thickness on the surface of the upper bump pad 153.

Figure 27:
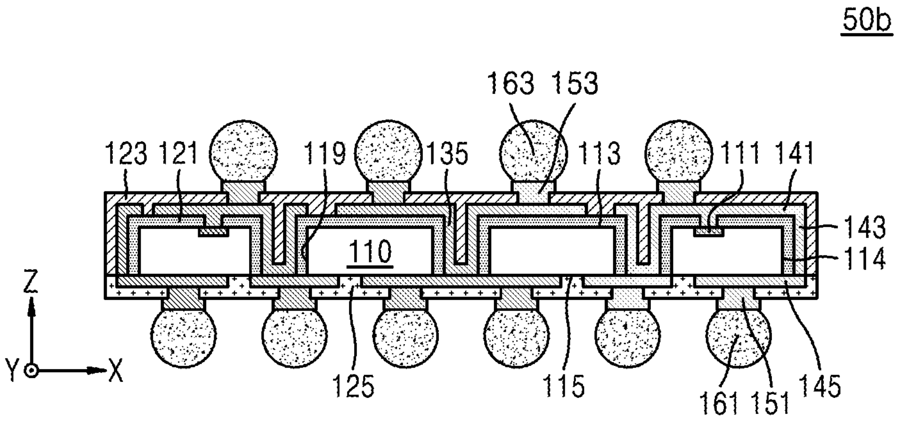
FIG. 27 is a cross-sectional view of a semiconductor package according to example embodiments of the inventive concept.

FIG. 27 is a cross-sectional view of a semiconductor package 50*b* according to example embodiments of the inventive concept. Hereinafter, a description made above will be omitted or simply repeated.

Referring to FIG. 27, the semiconductor package 50*b* may include the first lower bump pad 151 connected to the first lower conductive layer 145, the lower connection bump 161 attached to the first lower bump pad 151, the upper bump pad 153 connected to the first upper conductive layer 141, and the upper connection bump 163 attached to the upper bump pad 153. The semiconductor package 50*b* may be connected through the lower connection bump 161 to another semiconductor package or an electronic device arranged under the semiconductor package 50*b* and also connected through the upper connection bump 163 to another semiconductor package or an electronic device arranged above the semiconductor package 50*b*.

Figure 28:
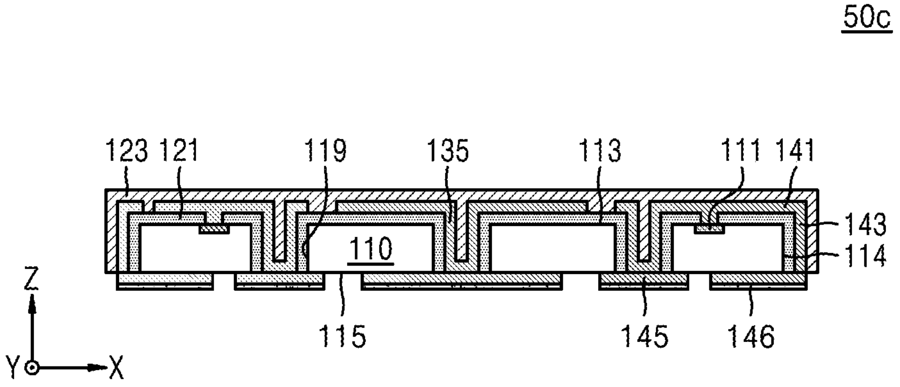
FIG. 28 is a cross-sectional view of a semiconductor package according to example embodiments of the inventive concept.

FIG. 28 is a cross-sectional view of a semiconductor package 50*c* according to example embodiments of the inventive concept. Hereinafter, a difference from the semiconductor package 50 described with reference to FIGS. 23A to 23C will be mainly described to describe the semiconductor package 50*c* shown in FIG. 28.

Referring to FIG. 28, the first lower conductive layer 145 of the semiconductor package 50*c* may include a lead pattern functioning as an external pad. The lead pattern may have, for example, a polygonal shape such as a circular or quadrangular shape in a plan view. In example embodiments, the first lower insulating layer (125 of FIG. 23A) may be omitted, and the first lower conductive layer 145 may be exposed to the outside. In example embodiments, a conductive adhesive layer 146 may be further arranged on the surface of the first lower conductive layer 145. The conductive adhesive layer 146 may be formed to cover a lower surface of the first lower conductive layer 145. The conductive adhesive layer 146 may be formed by, for example, a plating method. The conductive adhesive layer 146 may include, for example, solder, Sn, Ag, In, Bi, Sb, Cu, Zn, Pb, and/or an alloy thereof.

Figure 29:
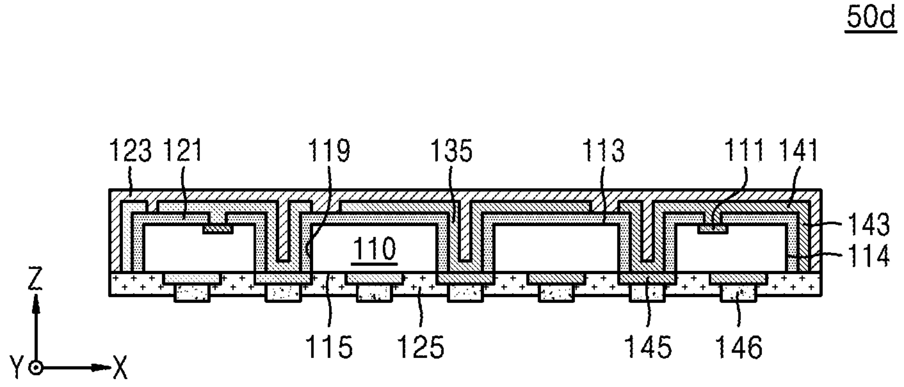
FIG. 29 is a cross-sectional view of a semiconductor package according to example embodiments of the inventive concept.

FIG. 29 is a cross-sectional view of a semiconductor package 50*d* according to example embodiments of the inventive concept. Hereinafter, a difference from the semiconductor package 50*c* described with reference to FIG. 28 will be mainly described to describe the semiconductor package 50*d* shown in FIG. 29.

Referring to FIG. 29, the semiconductor package 50*d* may include the first lower insulating layer 125 provided on the lower surface 115 of the first semiconductor chip 110. The first lower insulating layer 125 may cover the first lower conductive layer 145 including the lead pattern and cover at least a portion of a side surface of the conductive adhesive layer 146. The first lower insulating layer 125 may not cover a lower surface of the conductive adhesive layer 146 so that the lower surface of the conductive adhesive layer 146 is exposed to the outside.

Figure 30:
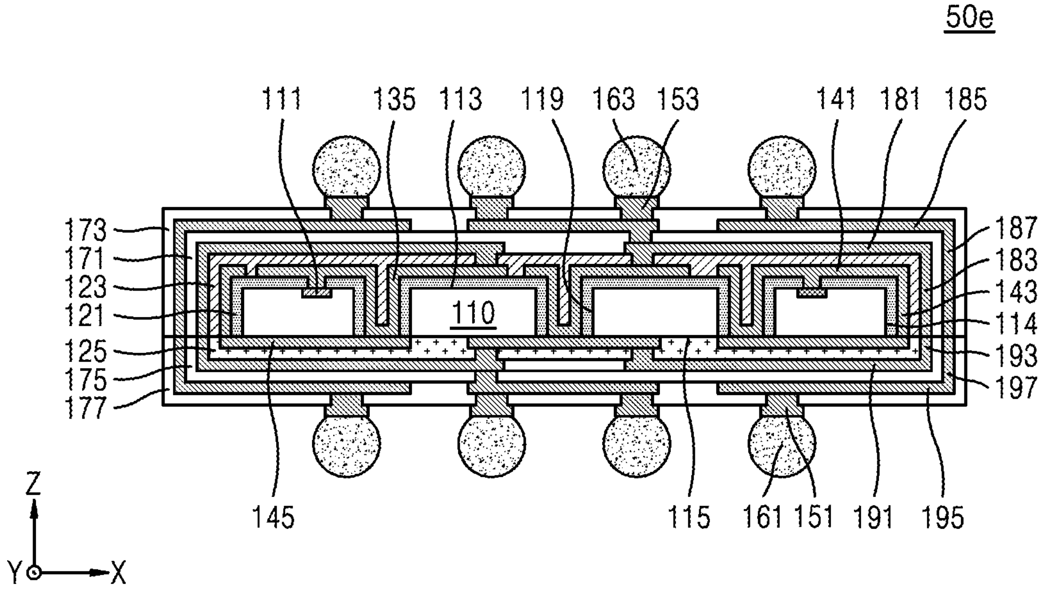
FIG. 30 is a cross-sectional view of a semiconductor package according to example embodiments of the inventive concept.

FIG. 30 is a cross-sectional view of a semiconductor package 50*e* according to example embodiments of the inventive concept. Hereinafter, a difference from the semiconductor package 50 described with reference to FIGS. 23A to 23C will be mainly described to describe the semiconductor package 50*e* shown in FIG. 30.

Referring to FIG. 30, the semiconductor package 50*e* may include the first semiconductor chip 110, the first cover insulating layer 121, the first upper conductive layer 141, the first side conductive layer 143, the first through-chip conductive layer 135, the second cover insulating layer 123, a second upper conductive layer 181, a second upper side conductive layer 183, a third cover insulating layer 171, a third upper conductive layer 185, a third upper side conductive layer 187, a fourth cover insulating layer 173, the first lower conductive layer 145, the first lower insulating layer 125, a second lower conductive layer 191, a second lower side conductive layer 193, a second lower insulating layer 175, a third lower conductive layer 195, a third lower side conductive layer 197, a third lower insulating layer 177, the first lower bump pad 151, and the lower connection bump 161.

The second upper conductive layer 181 may be provided on an upper surface of the second cover insulating layer 123. The second upper conductive layer 181 may be in contact with and extend along the upper surface of the second cover insulating layer 123. The second upper conductive layer 181 may be connected to the first upper conductive layer 141 through the opening of the second cover insulating layer 123. In example embodiments, the second upper conductive layer 181 may include a line pattern extending in a line shape on the upper surface of the second cover insulating layer 123.

The second upper side conductive layer 183 may be provided on a side surface of the second cover insulating layer 123. The second upper side conductive layer 183 may be connected to the second upper conductive layer 181 and extend along the side surface of the second cover insulating layer 123. The second upper side conductive layer 183 may extend downward from an upper end thereof connected to the second upper conductive layer 181. The second upper side conductive layer 183 may extend from an upper end to a lower end of the side surface of the second cover insulating layer 123. In example embodiments, a lower end of the second upper side conductive layer 183 and the lower end of the second cover insulating layer 123 may be on the same plane as the lower surface 115 of the first semiconductor chip 110. In example embodiments, the second upper side conductive layer 183 may have a plate shape extending in parallel to the side surface 114 of the first semiconductor chip 110, which faces the second upper side conductive layer 183.

The third cover insulating layer 171 may cover the second upper conductive layer 181, the second upper side conductive layer 183, and the second cover insulating layer 123. A portion of the third cover insulating layer 171 may extend along the upper surface of the second cover insulating layer 123 to cover the second upper conductive layer 181. The other portion of the third cover insulating layer 171 may extend along the side surface of the second cover insulating layer 123 to cover the second upper side conductive layer 183.

The third upper conductive layer 185 may be provided on an upper surface of the third cover insulating layer 171. The third upper conductive layer 185 may be in contact with and extend along the upper surface of the third cover insulating layer 171. The third upper conductive layer 185 may be connected to the second upper conductive layer 181 through an opening of the third cover insulating layer 171. In example embodiments, the third upper conductive layer 185 may include a line pattern extending in a line shape on the upper surface of the third cover insulating layer 171.

The third upper side conductive layer 187 may be provided on a side surface of the third cover insulating layer 171. The third upper side conductive layer 187 may be connected to the third upper conductive layer 185 and extend along the side surface of the third cover insulating layer 171. The third upper side conductive layer 187 may extend downward from an upper end thereof connected to the third upper conductive layer 185. The third upper side conductive layer 187 may extend from an upper end to a lower end of the side surface of the third cover insulating layer 171. In example embodiments, a lower end of the third upper side conductive layer 187 and the lower end of the third cover insulating layer 171 may be on the same plane as the lower surface 115 of the first semiconductor chip 110. In example embodiments, the third upper side conductive layer 187 may have a plate shape extending in parallel to the side surface 114 of the first semiconductor chip 110, which faces the third upper side conductive layer 187.

The fourth cover insulating layer 173 may cover the third upper conductive layer 185, the third upper side conductive layer 187, and the third cover insulating layer 171. A portion of the fourth cover insulating layer 173 may extend along the upper surface of the third cover insulating layer 171 to cover the third upper conductive layer 185. The other portion of the fourth cover insulating layer 173 may extend along the side surface of the third cover insulating layer 171 to cover the third upper side conductive layer 187. In example embodiments, the fourth cover insulating layer 173 located at the outermost position among the first to fourth cover insulating layers 121, 123, 171, and 173 may include a molding material such as an EMC, and the remaining first to third cover insulating layers 121, 123, and 171 may include polyimide.

The second lower conductive layer 191 may be provided on a lower surface of the first lower insulating layer 125. The second lower conductive layer 191 may be in contact with and extend along the lower surface of the first lower insulating layer 125. The second lower conductive layer 191 may be connected to the first lower conductive layer 145 through an opening of the first lower insulating layer 125. In example embodiments, the second lower conductive layer 191 may include a line pattern extending in a line shape on the lower surface of the first lower insulating layer 125.

The second lower side conductive layer 193 may be provided on a side surface of the first lower insulating layer 125. The second lower side conductive layer 193 may electrically connect the second lower conductive layer 191 to the second upper side conductive layer 183. The second lower side conductive layer 193 may extend along the side surface of the first lower insulating layer 125. The second lower side conductive layer 193 may extend in the vertical direction (e.g., the Z-axis direction) from an upper end thereof connected to the second upper side conductive layer 183 to a lower end thereof connected to the second lower conductive layer 191. The second lower side conductive layer 193 may extend from an upper end to a lower end of the side surface of the first lower insulating layer 125. In example embodiments, the second lower side conductive layer 193 may have a plate shape extending in the vertical direction (e.g., the Z-axis direction) and have a horizontal width similar to that of the second upper side conductive layer 183.

The second lower insulating layer 175 may cover the second lower conductive layer 191, the second lower side conductive layer 193, and the first lower insulating layer 125. A portion of the second lower insulating layer 175 may extend along the lower surface of the first lower insulating layer 125 to cover the second lower conductive layer 191. The other portion of the second lower insulating layer 175 may extend along the side surface of the first lower insulating layer 125 to cover the second lower side conductive layer 193.

The third lower conductive layer 195 may be provided on a lower surface of the second lower insulating layer 175. The third lower conductive layer 195 may be in contact with and extend along the lower surface of the second lower insulating layer 175. The third lower conductive layer 195 may be connected to the second lower conductive layer 191 through an opening of the second lower insulating layer 175. In example embodiments, the third lower conductive layer 195 may include a line pattern extending in a line shape on the lower surface of the second lower insulating layer 175.

The third lower side conductive layer 197 may be provided on a side surface of the second lower insulating layer 175. The third lower side conductive layer 197 may electrically connect the third lower conductive layer 195 to the third upper side conductive layer 187. The third lower side conductive layer 197 may extend along the side surface of the second lower insulating layer 175. The third lower side conductive layer 197 may extend in the vertical direction (e.g., the Z-axis direction) from an upper end thereof connected to the third upper side conductive layer 187 to a lower end thereof connected to the third lower conductive layer 195. The third lower side conductive layer 197 may extend from an upper end to a lower end of the side surface of the second lower insulating layer 175. In example embodiments, the third lower side conductive layer 197 may have a plate shape extending in the vertical direction (e.g., the Z-axis direction) and have a horizontal width similar to that of the third upper side conductive layer 187.

The third lower insulating layer 177 may cover the third lower conductive layer 195, the third lower side conductive layer 197, and the second lower insulating layer 175. A portion of the third lower insulating layer 177 may extend along the lower surface of the second lower insulating layer 175 to cover the third lower conductive layer 195. The other portion of the third lower insulating layer 177 may extend along the side surface of the second lower insulating layer 175 to cover the third lower side conductive layer 197. In example embodiments, the third lower insulating layer 177 located at the outermost position among the first to third lower insulating layers 125, 175, and 177 may include a molding material such as an EMC, and the remaining first and second lower insulating layers 125 and 175 may include polyimide.

Although FIG. 30 shows that the semiconductor package **50*e* includes the first to third upper conductive layers 141, 181, and 185 forming three layers on the upper surface 113 of the first semiconductor chip 110, two or more conductive layers may be provided on the upper surface 113 of the first semiconductor chip 110. In other words, the semiconductor package 50*e* may further include an upper conductive structure having a single-layer or multi-layer structure in addition to the first upper conductive layer 141. When the upper conductive structure has the multi-layer structure, a plurality of conductive layers separated from each other in a direction orthogonal to the upper surface 113 of the first semiconductor chip 110 and extending in generally parallel to the upper surface 113 of the first semiconductor chip 110 may be included. In the embodiment of FIG. 30, the second and third upper conductive layers 181 and 185** may form the upper conductive structure.

In addition, the semiconductor package **50*e* may include conductive layers provided on the side surface 114 of the first semiconductor chip 110 and forming two or more layers. In other words, the semiconductor package 50*e* may further include a side conductive structure having a single-layer or multi-layer structure in addition to the first side conductive layer 143. When the side conductive structure has the multi-layer structure, a plurality of conductive layers separated from each other in a direction orthogonal to the side surface 114 of the first semiconductor chip 110 and extending in generally parallel to the side surface 114 of the first semiconductor chip 110 may be included. In the embodiment of FIG. 30, the second and third upper side conductive layers 183 and 187** may form the side conductive structure.

In addition, the semiconductor package **50*e* may further include a cover insulating structure provided on the second cover insulating layer 123 and covering the upper conductive structure and the side conductive structure. The cover insulating structure may include a single insulating layer or multiple insulating layers provided on the second cover insulating layer 123. When the cover insulating structure has a multi-layer structure, each of insulating layers included in the cover insulating structure may extend along the upper surface 113 and the side surface 114 of the first semiconductor chip 110. In the embodiment of FIG. 30, the third and fourth cover insulating layers 171 and 173** may form the cover insulating structure.

In addition, the semiconductor package **50*e* may include conductive layers provided on the lower surface 115 of the first semiconductor chip 110 and forming two or more layers. In other words, the semiconductor package 50*e* may further include a lower conductive structure having a single-layer or multi-layer structure in addition to the first lower conductive layer 145. When the lower conductive structure has the multi-layer structure, a plurality of conductive layers separated from each other in a direction orthogonal to the lower surface 115 of the first semiconductor chip 110 and extending in generally parallel to the lower surface 115 of the first semiconductor chip 110 may be included. In the embodiment of FIG. 30, the second and third lower conductive layers 191 and 195 may form the lower conductive structure. The lower conductive structure may be electrically connected to the side conductive structure through a lower side conductive structure, such as the second and third lower side conductive layers 193 and 197**, extending in the vertical direction.

In addition, the semiconductor package **50*e* may further include a lower insulating structure provided on the first lower insulating layer 125 and covering the lower conductive structure. The lower insulating structure may include a single insulating layer or multiple insulating layers provided on the first lower insulating layer 125. When the lower insulating structure has a multi-layer structure, each of insulating layers included in the lower insulating structure may extend along the lower surface and the side surface of the first lower insulating layer 125. In the embodiment of FIG. 30, the second and third lower insulating layers 175 and 177** may form the lower insulating structure.

Figure 31:
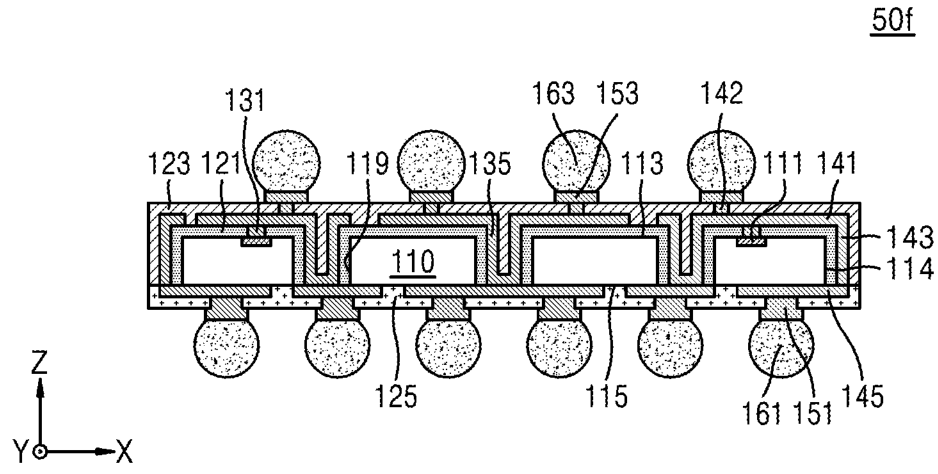
FIG. 31 is a cross-sectional view of a semiconductor package according to example embodiments of the inventive concept.

FIG. 31 is a cross-sectional view of a semiconductor package **50*f* according to example embodiments of the inventive concept. A difference from the semiconductor package 50***b* described with reference to FIG. 27 will be mainly described to describe the semiconductor package 50*f* shown in FIG. 31.

Referring to FIG. 31, the semiconductor package 50*f* may include a first conductive pillar 131 arranged on the chip pad 111 of the first semiconductor chip 110, and the first upper conductive layer 141 may be electrically connected to the chip pad 111 of the first semiconductor chip 110 through the first conductive pillar 131.

The first conductive pillar 131 may extend through the first cover insulating layer 121, and a side wall of the first conductive pillar 131 may be surrounded by the first cover insulating layer 121. The side wall of the first conductive pillar 131 may electrically connect the chip pad 111 of the first semiconductor chip 110 to the first upper conductive layer 141 provided on the upper surface of the first cover insulating layer 121. The first conductive pillar 131 may have a pillar shape. A lower surface of the first conductive pillar 131 may be in contact with the chip pad 111 of the first semiconductor chip 110, and an upper surface of the first conductive pillar 131 may be in contact with the first upper conductive layer 141.

In example embodiments, the first conductive pillar 131 may include the same material and/or material combination as the first upper conductive layer 141. In other example embodiments, the first conductive pillar 131 may include a different material and/or material combination from that of the first upper conductive layer 141.

In example embodiments, the upper surface of the first conductive pillar 131 and the upper surface of the first cover insulating layer 121 may be on the same plane. For example, the upper surface of the first conductive pillar 131 and the upper surface of the first cover insulating layer 121 may be on the same plane by being polished together by a planarization process such as a chemical mechanical polishing process.

In example embodiments, surface roughness of the upper surface of the first cover insulating layer 121 may be different from surface roughness of the side surface of the first cover insulating layer 121 and surface roughness of the surface of the second cover insulating layer 123 in contact with the upper surface of the first cover insulating layer 121.

When the upper surface of the first cover insulating layer 121 is polished and planarized, the upper surface of the first cover insulating layer 121 may be formed to have relatively large surface roughness. In example embodiments, the surface roughness of the upper surface of the first cover insulating layer 121 may be greater than the surface roughness of the side surface of the first cover insulating layer 121. In example embodiments, the surface roughness of the upper surface of the first cover insulating layer 121 may be greater than surface roughness of the surface of the first cover insulating layer 121 in contact with the upper surface 113 of the first semiconductor chip 110. In example embodiments, the surface roughness of the upper surface of the first cover insulating layer 121 may be greater than surface roughness of the surface of the second cover insulating layer 123 in contact with the upper surface of the first cover insulating layer 121. By forming the upper surface of the first cover insulating layer 121 to have relatively large surface roughness, adhesive strength between the first upper conductive layer 141 and the first cover insulating layer 121 may increase.

The semiconductor package 50*f* may include a second conductive pillar 142 arranged on the first upper conductive layer 141, and the upper bump pad 153 may be electrically connected to the first upper conductive layer 141 through the second conductive pillar 142.

The second conductive pillar 142 may be provided on the first upper conductive layer 141. The second conductive pillar 142 may extend through the second cover insulating layer 123 and electrically connect the first upper conductive layer 141 to the upper bump pad 153. The second conductive pillar 142 may have a pillar shape. A lower surface of the second conductive pillar 142 may be in contact with the first upper conductive layer 141, and an upper surface of the second conductive pillar 142 may be in contact with the upper bump pad 153.

In example embodiments, the second conductive pillar 142 may include the same material and/or material combination as the first upper conductive layer 141. In other example embodiments, the second conductive pillar 142 may include a different material and/or material combination from that of the first upper conductive layer 141.

In example embodiments, the upper surface of the second conductive pillar 142 and the upper surface of the second cover insulating layer 123 may be on the same plane. For example, the upper surface of the second conductive pillar 142 and the upper surface of the second cover insulating layer 123 may be on the same plane by being polished together by a planarization process such as a chemical mechanical polishing process.

In example embodiments, surface roughness of the upper surface of the second cover insulating layer 123 may be different from surface roughness of the side surface of the second cover insulating layer 123 and surface roughness of the surface of the second cover insulating layer 123 in contact with the upper surface and the side surface of the first cover insulating layer 121.

When the upper surface of the second cover insulating layer 123 is polished and planarized, the upper surface of the second cover insulating layer 123 may be formed to have relatively large surface roughness. In example embodiments, the surface roughness of the upper surface of the second cover insulating layer 123 may be greater than the surface roughness of the side surface of the second cover insulating layer 123. In addition, the surface roughness of the upper surface of the second cover insulating layer 123 may be greater than surface roughness of the surface of the second cover insulating layer 123 in contact with the upper surface and the side surface of the first cover insulating layer 121. By forming the upper surface of the second cover insulating layer 123 to have relatively large surface roughness, an adhesive strength between the upper bump pad 153 and the second cover insulating layer 123 may increase.

Figure 32:
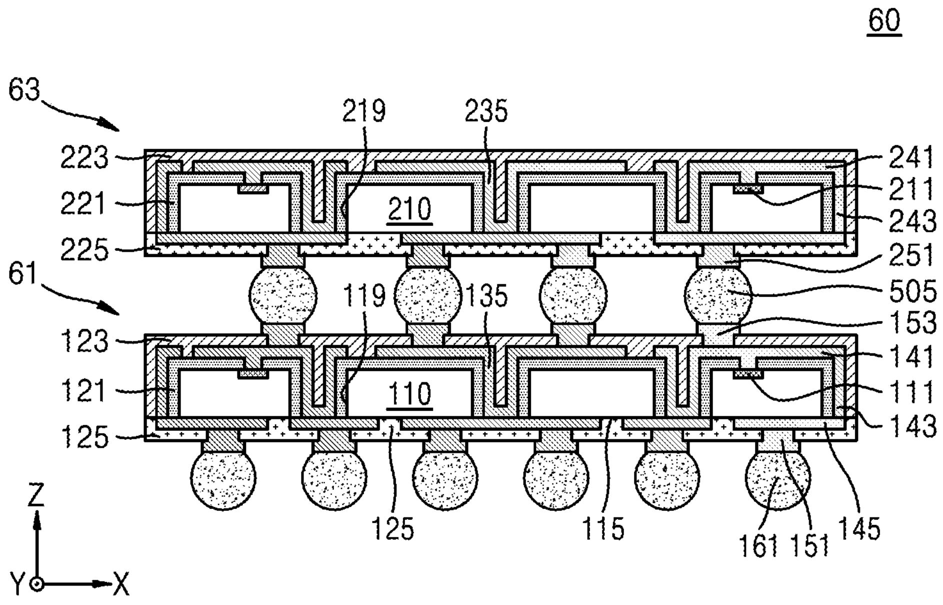
FIG. 32 is a cross-sectional view of a semiconductor package according to example embodiments of the inventive concept.

FIG. 32 is a cross-sectional view of a semiconductor package 60 according to example embodiments of the inventive concept. Hereinafter, a description made above will be omitted or simply repeated.

Referring to FIG. 32, the semiconductor package 60 may have a package-on-package structure in which a first upper package 63 is attached onto a lower package 61.

The lower package 61 may be a semiconductor package of a fan-out structure. The lower package 61 may be substantially the same as or similar to the semiconductor package 50*b* described with reference to FIG. 27.

The first upper package 63 may be stacked on the lower package 61 through an inter-package connection terminal 505. In the present disclosure, the first upper package 63 may be referred to as a package structure. The first upper package 63 may be a semiconductor package of the fan-out structure. The first upper package 63 may be substantially the same as or similar to the semiconductor package 50 described with reference to FIGS. 23A to 23C. The first upper package 63 may include a second semiconductor chip 210 including a chip pad 211, a fifth cover insulating layer 221 covering an upper surface and a side surface of the second semiconductor chip 210, a fourth upper conductive layer 241 extending along an upper surface of the fifth cover insulating layer 221, a fourth side conductive layer 243 extending along a side surface of the fifth cover insulating layer 221, a second through-chip conductive layer 235 provided inside a through hole of the second semiconductor chip 210, a sixth cover insulating layer 223 covering the fourth upper conductive layer 241 and the fourth side conductive layer 243, a fourth lower conductive layer 245 extending along a lower surface of the second semiconductor chip 210, a fourth lower insulating layer 225 covering the fourth lower conductive layer 245, and a second lower bump pad 251 connected to the fourth lower conductive layer 245 through an opening of the fourth lower insulating layer 225. The second semiconductor chip 210, the fifth cover insulating layer 221, the fourth upper conductive layer 241, the fourth side conductive layer 243, the second through-chip conductive layer 235, the sixth cover insulating layer 223, the fourth lower conductive layer 245, the fourth lower insulating layer 225, and the second lower bump pad 251 in the first upper package 63 may correspond to the first semiconductor chip 110, the first cover insulating layer 121, the first upper conductive layer 141, the first side conductive layer 143, the first through-chip conductive layer 135, the second cover insulating layer 123, the first lower conductive layer 145, the first lower insulating layer 125, and the first lower bump pad 151 in the semiconductor package 50 described with reference to FIGS. 23A to 23C, respectively. The inter-package connection terminal 505 may be between the upper bump pad 153 of the lower package 61 and the second lower bump pad 251 of the first upper package 63.

Figure 33:
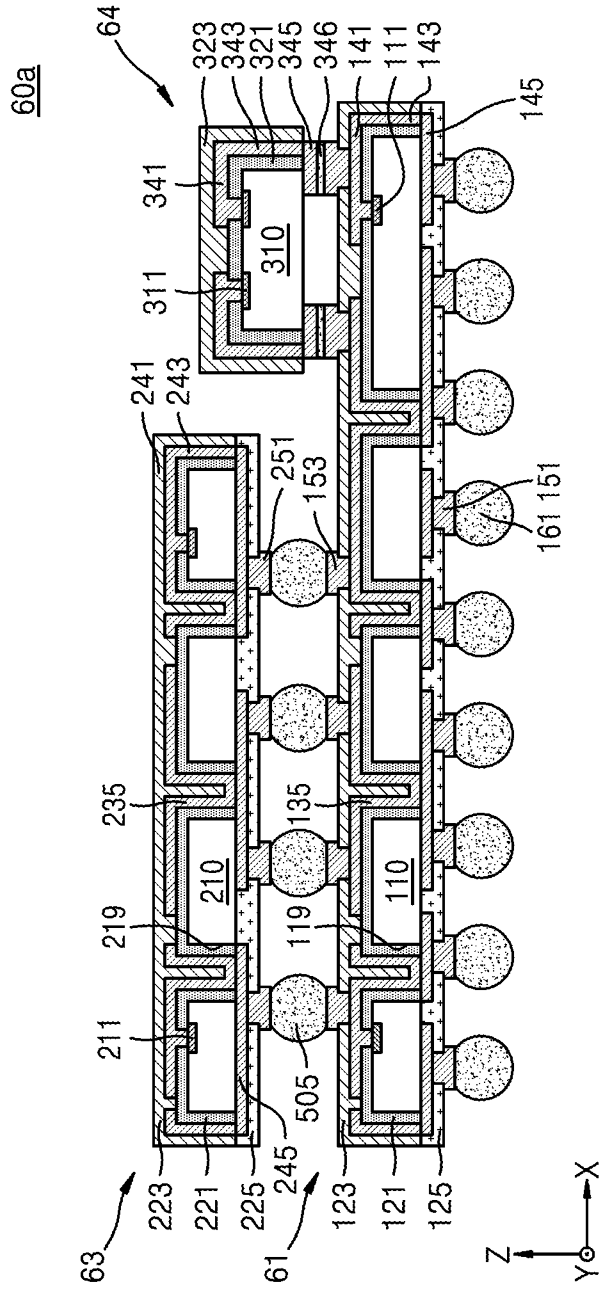
FIG. 33 is a cross-sectional view of a semiconductor package according to example embodiments of the inventive concept.

FIG. 33 is a cross-sectional view of a semiconductor package 60*a* according to example embodiments of the inventive concept. Hereinafter, a difference from the semiconductor package 60 described with reference to FIG. 32 will be mainly described to describe the semiconductor package 60*a* shown in FIG. 33.

Referring to FIG. 33, the semiconductor package 60*a* may have a package-on-package structure in which the first upper package 63 and a second upper package 64 are attached onto the lower package 61. The first upper package 63 and the second upper package 64 may be arranged side by side above the lower package 61.

The second upper package 64 may be a semiconductor package of the fan-out structure. In the present disclosure, the second upper package 64 may be referred to as a package structure. The second upper package 64 may be substantially the same as or similar to the semiconductor package 50*c* described with reference to FIG. 28. The second upper package 64 may include a third semiconductor chip 310 including a chip pad 311, a seventh cover insulating layer 321 covering an upper surface and a side surface of the third semiconductor chip 310, a fifth upper conductive layer 341 extending along an upper surface of the seventh cover insulating layer 321, a fifth side conductive layer 343 extending along a side surface of the seventh cover insulating layer 321, an eighth cover insulating layer 323 covering the fifth upper conductive layer 341 and the fifth side conductive layer 343, a fifth lower conductive layer 345 extending along a lower surface of the third semiconductor chip 310, and a conductive adhesive layer 346. The third semiconductor chip 310, the seventh cover insulating layer 321, the fifth upper conductive layer 341, the fifth side conductive layer 343, the eighth cover insulating layer 323, the fifth lower conductive layer 345, and the conductive adhesive layer 346 in the second upper package 64 may correspond to the first semiconductor chip 110, the first cover insulating layer 121, the first upper conductive layer 141, the first side conductive layer 143, the second cover insulating layer 123, the first lower conductive layer 145, and the conductive adhesive layer 146 in the semiconductor package 50*c* described with reference to FIG. 28, respectively. The upper bump pad 153 of the lower package 61 and the fifth lower conductive layer 345 of the second upper package 64 may be coupled to each other through the conductive adhesive layer 346.

Figure 34:
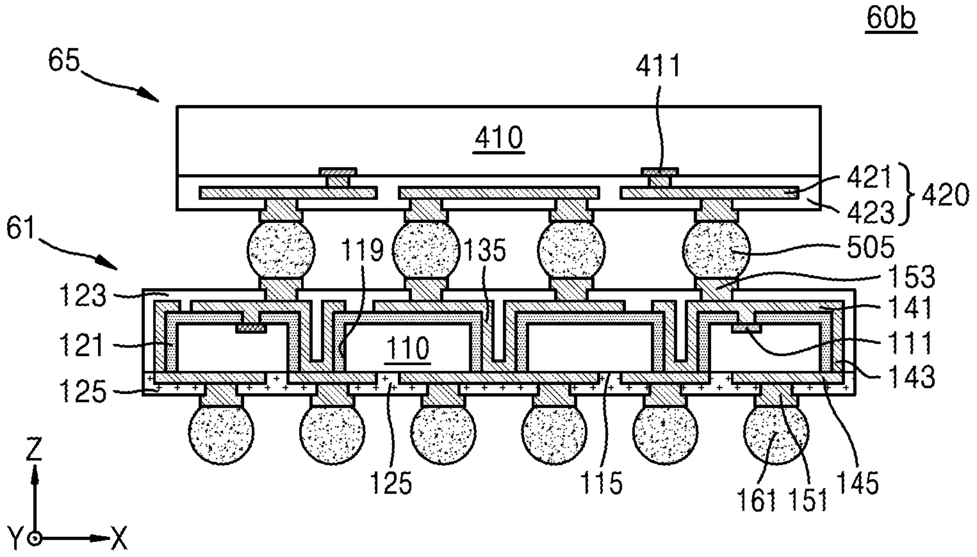
FIG. 34 is a cross-sectional view of a semiconductor package according to example embodiments of the inventive concept.

FIG. 34 is a cross-sectional view of a semiconductor package 60*b* according to example embodiments of the inventive concept. Hereinafter, a difference from the semiconductor package 60 described with reference to FIG. 32 will be mainly described to describe the semiconductor package 60*b* shown in FIG. 34.

Referring to FIG. 34, the semiconductor package 60*b* may have a package-on-package structure in which a third upper package 65 is attached onto the lower package 61.

The third upper package 65 may be stacked on the lower package 61 through the inter-package connection terminal 505. The third upper package 65 may be a semiconductor package of a fan-in structure. The third upper package 65 may include a fourth semiconductor chip 410 in which a surface having a chip pad 411 faces the lower package 61, and a redistribution structure 420 on the fourth semiconductor chip 410. The redistribution structure 420 may include a conductive redistribution pattern 421 and a redistribution insulating layer 423 covering the conductive redistribution pattern 421. The inter-package connection terminal 505 may be between a portion of the conductive redistribution pattern 421 protruding from the redistribution insulating layer 423 and the upper bump pad 153 of the lower package 61. The conductive redistribution pattern 421 may electrically connect the chip pad 411 of the fourth semiconductor chip 410 to the inter-package connection terminal 505.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the disclosure as defined by the following claims.

What is claimed is:

1. A semiconductor package comprising:

a first semiconductor chip comprising an upper surface, a lower surface, a side surface, and a chip pad provided on the upper surface;

a first cover insulating layer includes a first portion covering the upper surface of the first semiconductor chip and a second portion extending from the first portion, covering the side surface of the first semiconductor chip and formed integrally with the first portion, wherein the first portion of the first cover insulating layer and the second portion of the first cover insulating layer are made of a same material;

a first upper conductive layer extending along an upper surface of the first cover insulating layer and electrically connected to the chip pad of the first semiconductor chip;

a first side conductive layer extending along a side surface of the first cover insulating layer and connected to the first upper conductive layer;

a second cover insulating layer including a third portion covering the first upper conductive layer and the first cover insulating layer and a fourth portion extending from the third portion, covering the first side conductive layer; and a first lower conductive layer extending along the lower surface of the first semiconductor chip and connected to the first side conductive layer, and wherein a lower surface of the second portion of the first cover insulating layer and a lower surface of the first side conductive layer are positioned on a same plane as the lower surface of the first semiconductor chip, wherein a vertical height of the first side conductive layer is greater than a vertical height of the first semiconductor chip, a horizontal width of the first side conductive layer is greater than a horizontal width of the first upper conductive layer and a horizontal width of the first lower conductive layer, and the first lower conductive layer is in contact with the lower surface of the first semiconductor chip.

2. The semiconductor package of claim 1, wherein the first lower conductive layer is in contact with the lower surface of the first side conductive layer.

3. The semiconductor package of claim 1, further comprising:

a first lower insulating layer covering the first lower conductive layer and the lower surface of the first semiconductor chip;

a first lower bump pad connected to the first lower conductive layer through an opening of the first lower insulating layer;

a lower connection bump on the first lower bump pad;

an upper bump pad connected to the first upper conductive layer through an opening of the second cover insulating layer; and an upper connection bump on the upper bump pad.

4. The semiconductor package of claim 1, wherein the first lower conductive layer is in direct contact with the lower surface of the first semiconductor chip.

5. The semiconductor package of claim 3, wherein the lower surface of the first semiconductor chip includes a first lower surface in direct contact with the first lower conductive layer and a second lower surface connected to the first lower surface and in direct contact with the first lower insulating layer.

* * * * *